(12) United States Patent
Ohno et al.

(10) Patent No.: US 9,770,894 B2
(45) Date of Patent: Sep. 26, 2017

(54) PEELING APPARATUS AND STACK MANUFACTURING APPARATUS

(71) Applicant: SEMICONDUCTOR ENERGY LABORATORY CO., LTD., Atsugi-shi, Kanagawa-ken (JP)

(72) Inventors: Masakatsu Ohno, Tochigi (JP); Hiroki Adachi, Tochigi (JP); Satoru Idojiri, Tochigi (JP); Koichi Takeshima, Tochigi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 15/248,579

(22) Filed: Aug. 26, 2016

(65) Prior Publication Data

US 2016/0361913 A1    Dec. 15, 2016

Related U.S. Application Data

(63) Continuation of application No. 14/553,227, filed on Nov. 25, 2014, now Pat. No. 9,427,949.

(30) Foreign Application Priority Data

Dec. 3, 2013  (JP) ................................. 2013-249751
Aug. 5, 2014  (JP) ................................. 2014-159799

(51) Int. Cl.
*B32B 43/00*  (2006.01)
*B32B 38/10*  (2006.01)
(Continued)

(52) U.S. Cl.
CPC ........ *B32B 43/006* (2013.01); *B32B 37/0053* (2013.01); *B32B 37/12* (2013.01);
(Continued)

(58) Field of Classification Search
CPC ............... B32B 43/006; Y10T 156/195; Y10T 156/1174; Y10T 156/1111
See application file for complete search history.

(56) References Cited

U.S. PATENT DOCUMENTS 5,891,297 A   4/1999  Stadtmueller
6,127,199 A  10/2000  Inoue et al.
(Continued)

FOREIGN PATENT DOCUMENTS

JP   10-125931 A   5/1998
JP   2003-174153 A  6/2003
JP   2008-109124 A  5/2008

*Primary Examiner* — Mark A Osele
(74) *Attorney, Agent, or Firm* — Nixon Peabody LLP; Jeffrey L. Costellia

(57) ABSTRACT

The yield of a peeling process is improved. A peeling apparatus includes a structure body with a convex surface and a stage with a supporting surface which faces the convex surface. The structure body can hold a first member of a process member between the convex surface and the supporting surface. The stage can hold a second member of the process member. The radius of curvature of the convex surface is less than the radius of curvature of the supporting surface. The linear velocity of the convex surface is greater than or equal to the speed of a rotation center of the structure body passing the stage. The first member is wound along the convex surface to be separated from the second member.

16 Claims, 30 Drawing Sheets

(51) Int. Cl.
    *B32B 37/12*     (2006.01)
    *H01L 51/56*     (2006.01)
    *H01L 27/32*     (2006.01)
    *H01L 51/52*     (2006.01)
    *B32B 37/00*     (2006.01)
    *B32B 37/26*     (2006.01)
    *H01L 51/00*     (2006.01)

(52) U.S. Cl.
    CPC ............ *B32B 38/10* (2013.01); *H01L 27/322* (2013.01); *H01L 27/323* (2013.01); *H01L 27/3262* (2013.01); *H01L 51/003* (2013.01); *H01L 51/524* (2013.01); *H01L 51/5253* (2013.01); *H01L 51/5284* (2013.01); *H01L 51/56* (2013.01); *B32B 37/025* (2013.01); *B32B 37/1207* (2013.01); *B32B 2037/1253* (2013.01); *B32B 2037/268* (2013.01); *B32B 2457/20* (2013.01); *B32B 2457/208* (2013.01); *H01L 51/0013* (2013.01); *H01L 2227/323* (2013.01); *H01L 2227/326* (2013.01); *H01L 2251/5315* (2013.01); *H01L 2251/5338* (2013.01); *Y10T 156/1111* (2015.01); *Y10T 156/1174* (2015.01); *Y10T 156/195* (2015.01); *Y10T 156/1928* (2015.01)

(56) References Cited

U.S. PATENT DOCUMENTS

| | | |
|---|---|---|
| 6,258,666 B1 | 7/2001 | Mizutani et al. |
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,530 B2 | 11/2004 | Shimoda et al. |
| 7,094,665 B2 | 8/2006 | Shimoda et al. |
| 7,271,076 B2 | 9/2007 | Yamazaki et al. |
| 7,285,476 B2 | 10/2007 | Shimoda et al. |
| RE40,601 E | 12/2008 | Inoue et al. |
| 7,468,308 B2 | 12/2008 | Shimoda |
| 7,566,633 B2 | 7/2009 | Koyama et al. |
| 7,591,863 B2 | 9/2009 | Watanabe et al. |
| 8,043,936 B2 | 10/2011 | Eguchi et al. |
| 8,048,770 B2 | 11/2011 | Eguchi et al. |
| 8,048,777 B2 | 11/2011 | Eguchi et al. |
| 8,123,896 B2 | 2/2012 | Watanabe et al. |
| 8,137,417 B2 | 3/2012 | Eguchi et al. |
| 8,367,440 B2 | 2/2013 | Takayama et al. |
| 8,415,208 B2 | 4/2013 | Takayama et al. |
| 8,698,156 B2 | 4/2014 | Watanabe et al. |
| 9,242,414 B2 | 1/2016 | Ahn et al. |
| 2004/0164302 A1 | 8/2004 | Arai et al. |
| 2005/0285231 A1* | 12/2005 | Arao ............. H01L 21/6835 257/635 |
| 2006/0199382 A1 | 9/2006 | Sugiyama et al. |
| 2007/0078228 A1 | 4/2007 | Tateishi et al. |
| 2008/0042168 A1 | 2/2008 | Watanabe et al. |
| 2008/0113486 A1 | 5/2008 | Eguchi et al. |
| 2008/0185100 A1 | 8/2008 | Jang et al. |
| 2008/0236743 A1 | 10/2008 | Kye et al. |
| 2009/0203174 A1 | 8/2009 | Ichijo et al. |
| 2012/0045861 A1 | 2/2012 | Eguchi et al. |
| 2012/0168066 A1 | 7/2012 | Eguchi et al. |
| 2013/0214324 A1 | 8/2013 | Takayama et al. |
| 2014/0008022 A1 | 1/2014 | Ahn et al. |
| 2014/0220745 A1 | 8/2014 | Watanabe et al. |
| 2014/0234664 A1 | 8/2014 | Yasumoto et al. |
| 2015/0059986 A1 | 3/2015 | Komatsu et al. |
| 2015/0059987 A1 | 3/2015 | Kumakura et al. |
| 2015/0060933 A1 | 3/2015 | Ohno et al. |
| 2015/0068683 A1 | 3/2015 | Ohno et al. |
| 2016/0016397 A1 | 1/2016 | Xie et al. |

* cited by examiner

PEELING APPARATUS AND STACK MANUFACTURING APPARATUS

BACKGROUND OF THE INVENTION

1. Field of the Invention

One embodiment of the present invention relates to a peeling apparatus and a stack manufacturing apparatus. One embodiment of the present invention relates to a peeling method and a stack manufacturing method.

Note that one embodiment of the present invention is not limited to the above technical field. One embodiment of the invention disclosed in this specification and the like relates to an object, a method, or a manufacturing method. Moreover, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a storage device, an electronic device, a lighting device, an input device (e.g., a touch sensor), an output device, an input/output device (e.g., a touch panel), a driving method thereof, and a manufacturing method thereof.

2. Description of the Related Art

In recent years, a flexible device in which a functional element such as a semiconductor element, a display element, or a light-emitting element is provided over a substrate having flexibility (hereinafter also referred to as a flexible substrate) has been developed. Typical examples of the flexible device include a lighting device, an image display device, a variety of semiconductor circuits including a semiconductor element such as a transistor, and the like.

As a method for manufacturing a device including a flexible substrate, a technique has been developed in which a functional element such as a thin film transistor or an organic electroluminescence (EL) element is formed over a formation substrate (e.g., a glass substrate or a quartz substrate), and then the functional element is transferred to a flexible substrate. This technique needs a step of peeling a layer including the functional element from the formation substrate (also referred to as a peeling process).

For example, Patent Document 1 discloses the following peeling technique using laser ablation: a separation layer formed of amorphous silicon or the like is provided over a substrate, a peeled layer which includes a thin film element is provided over the separation layer, and the peeled is bonded to a transfer body with the use of a bonding layer. The separation layer is ablated by laser irradiation, so that peeling occurs at the separation layer.

In addition, Patent Document 2 discloses a technique in which peeling is performed by physical force with human hands or the like. In addition, Patent Document 2 discloses the following peeling technique: a metal layer is formed between a substrate and an oxide layer and peeling is caused at the interface between the oxide layer and the metal layer by utilizing weak bonding at the interface between the oxide layer and the metal layer, so that a peeled layer and the substrate are separated from each other.

REFERENCE

Patent Documents

[Patent Document 1] Japanese Published Patent Application No. H10-125931
[Patent Document 2] Japanese Published Patent Application No. 2003-174153

SUMMARY OF THE INVENTION

An object of one embodiment of the present invention is to improve the yield of a peeling process.

An object of one embodiment of the present invention is to improve the yield of the process of manufacturing a device such as a semiconductor device, a light-emitting device, a display device, an electronic device, or a lighting device. In particular, an object is to improve the yield of the process of manufacturing a lightweight, thin, or flexible semiconductor device, light-emitting device, display device, electronic device, or lighting device.

An object of one embodiment of the present invention is to provide a novel peeling apparatus or a novel stack manufacturing apparatus.

An object of one embodiment of the present invention is to provide a highly reliable light-emitting device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a peeling apparatus including a structure body which can hold a first member of a process member and a stage which can hold a second member of the process member. The first member is wound to separate the first member and the second member of the process member between the structure body and the stage from each other.

One embodiment of the present invention is a peeling apparatus including a structure body with a convex surface and a stage with a supporting surface which faces the convex surface. The structure body can hold a first member of a process member between the convex surface and the supporting surface. The stage can hold a second member of the process member. The radius of curvature of the convex surface is less than the radius of curvature of the supporting surface. The linear velocity of the convex surface is greater than or equal to the speed of a rotation center of the structure body passing the stage. The first member is wound along the convex surface to be separated from the second member.

In the peeling apparatus, the radius of curvature of the convex surface is preferably greater than or equal to 0.5 mm and less than or equal to 1000 mm.

In the peeling apparatus, at least part of the convex surface may have viscosity. Alternatively, at least part of the convex surface may have adhesion to the first member.

In the peeling apparatus, at least one of the stage and the structure body may move so that a position of the rotation center of the structure body with respect to the stage changes.

In the peeling apparatus, the first member and the second member may be separated from each other while tension is applied to the process member.

The peeling apparatus may include a liquid feeding mechanism for feeding liquid to a separation surface between the first member and the second member.

In the peeling apparatus, the whole first member may be wound along the convex surface before the structure body rotates a half turn.

One embodiment of the present invention can improve the yield of a peeling process.

One embodiment of the present invention can improve the yield of a fabrication process of a device such as a semiconductor device, a light-emitting device, a display device, an electronic appliance, or a lighting device. In particular, one embodiment of the present invention can improve the yield of a fabrication process of a semiconductor device, a light-emitting device, a display device, an electronic appliance, or a lighting device that is lightweight, thin, or flexible.

One embodiment of the present invention can provide a novel peeling apparatus or a novel stack manufacturing apparatus.

One embodiment of the present invention can provide a highly reliable light-emitting device.

Note that the description of these effects does not disturb the existence of other effects. One embodiment of the present invention does not necessarily obtain all the effects listed above. Other effects will be apparent from and can be derived from the description of the specification, the drawings, the claims, and the like.

DETAILED DESCRIPTION OF THE INVENTION

Figure 1A:
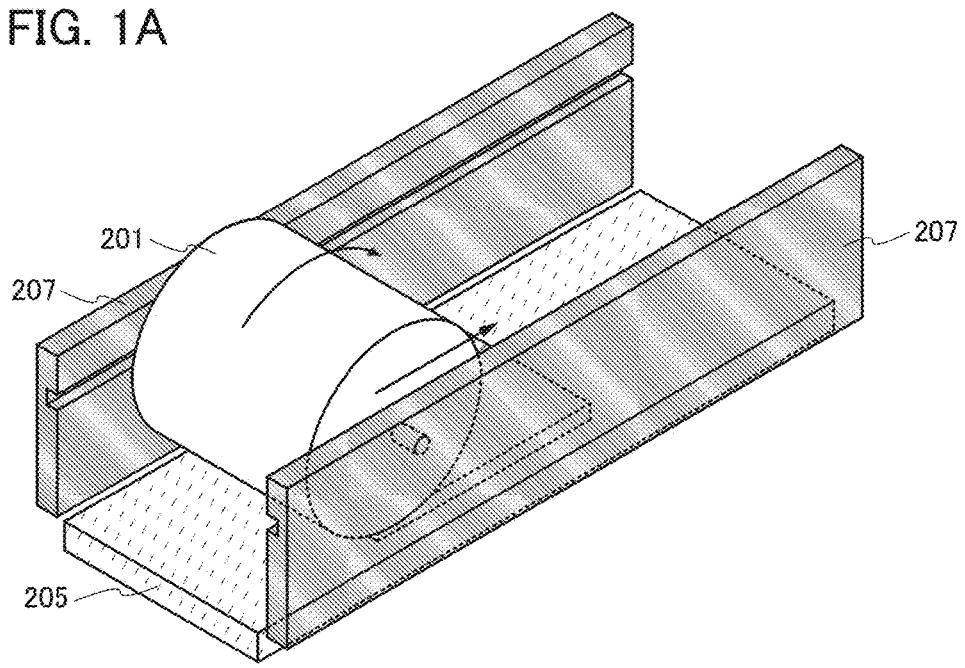
FIGS. 1A to 1D illustrate an example of a peeling apparatus.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Further, the same hatch pattern is applied to similar functions, and these are not especially denoted by reference numerals in some cases.

In addition, the position, size, range, or the like of each structure illustrated in drawings and the like is not accurately represented in some cases for easy understanding. Therefore, the disclosed invention is not necessarily limited to the position, size, range, or the like disclosed in the drawings and the like.

A peeled layer can be formed over a formation substrate, separated from the formation substrate, and then transferred to another substrate. With this method, for example, a peeled layer which is formed over a formation substrate having high heat resistance can be transferred to a substrate having low heat resistance. The temperature at which the peeled layer is formed is not limited by the substrate having low heat resistance. The peeled layer is transferred to a substrate or the like which is more lightweight, thin, or flexible than the formation substrate, whereby a variety of devices such as a semiconductor device, a light-emitting device, or a display device can be made lightweight, thin, and flexible.

Furthermore, electronic devices including the variety of devices, such as television devices, monitors for computers, cameras such as digital cameras and digital video cameras, digital photo frames, cellular phones, portable game machines, portable information terminals, and audio reproducing devices, can be made lightweight, thin, and flexible.

A device that can be manufactured according to one embodiment of the present invention includes a functional element. Examples of the functional element include a semiconductor element such as a transistor; a light-emitting diode; a light-emitting element such as an inorganic EL element and an organic EL element; and a display element such as a liquid crystal element. For example, a semiconductor device including a sealed transistor and a light-emitting device including a sealed light-emitting element (here, a display device including a transistor and a light-emitting element which are sealed is also included) are also examples of the device that can be manufactured according to one embodiment of the present invention.

For example, in order to protect an organic EL element that is likely to deteriorate because of moisture or the like, a protective film having a high moisture-proof property can be formed over a glass substrate at high temperatures and transferred to a flexible organic resin substrate. By forming the organic EL element over the protective film transferred to the organic resin substrate, a highly reliable flexible light-emitting device can be fabricated even when the organic resin substrate has low heat resistance and a moisture-proof property.

As another example, a protective film having an excellent moisture-proof property may be formed over a glass substrate at high temperatures, and an organic EL element may be formed over the protective film. After that, the protective film and the organic EL element may be separated from the glass substrate and transferred to a flexible organic resin substrate. Even when the organic resin substrate has a low heat resistance or a poor gas barrier property, a highly reliable flexible light-emitting device can be manufactured by transferring the protective film and the organic EL element to the organic resin substrate.

One embodiment of the present invention relates to a manufacturing apparatus by performing such peeling and transfer. One embodiment of the present invention relates to a manufacturing apparatus for a variety of devices such as a semiconductor device, a light-emitting device, and a display device, or relates to a manufacturing apparatus for a stack which is a part of the variety of devices.

A stack manufacturing apparatus of one embodiment of the present invention includes a supply unit for supplying a process member, a separation unit for dividing the process member into a surface layer and a remaining portion, a bonding unit for bonding a support body to the remaining portion, a support body supply unit for supplying the support body, and an unloading unit for unloading a stack including the remaining portion and the support body bonded to each other with a bonding layer.

Thus, one surface layer of a process member can be peeled, and a support body can be bonded to a remaining portion of the process member from which the surface layer has been peeled. One embodiment of the present invention can provide a novel stack manufacturing apparatus capable of manufacturing a stack including a support body and a remaining portion of a process member from which a surface layer has been peeled.

In Embodiment 1, peeling apparatuses of one embodiment of the present invention will be described. In Embodiments 2 and 3, stack manufacturing apparatuses of one embodiment of the present invention each of which includes the peeling apparatus will be described. In Embodiment 4, process members which can be processed in the stack manufacturing apparatus of one embodiment of the present invention will be described. In Embodiments 5 to 7, a stack which can be manufactured with the stack manufacturing apparatus of one embodiment of the present invention, and examples of a device, an electronic device, and a lighting device which include the stack will be described.

Embodiment 1

In this embodiment, a peeling apparatus of one embodiment of the present invention will be described with reference to FIGS. 1A to 1D, FIGS. 2A to 2C, FIGS. 3A to 3C, FIGS. 4A to 4D, FIGS. 5A to 5C, FIGS. 6A to 6C, FIGS. 7A to 7C, and FIGS. 8A and 8B.

One embodiment of the present invention is a peeling apparatus including a structure body which can hold a first member of a process member and a stage which can hold a second member of the process member. The first member is wound to separate the first member and the second member of the process member between the structure body and the stage from each other.

With the use of the peeling apparatus of one embodiment of the present invention, the first member and the second member of the process member can be separated from each other with a high yield. The peeling apparatus of one embodiment of the present invention does not require a complicated structure and can be used for the peeling of process members with a variety of sizes.

Examples of the structures and operations of peeling apparatuses and peeling methods using any of the peeling apparatuses will be described below.

Structural Example 1

FIGS. 1A to 1D, FIGS. 2A to 2C, and FIGS. 3A to 3C illustrate an example where a first member 203a is peeled from a process member 203 so that the first member 203a and a second member 203b are separated from each other.

Figure 1B:
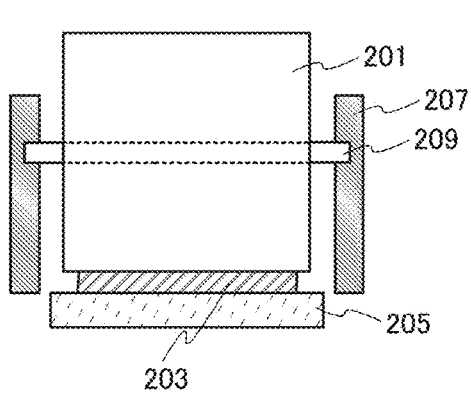
Figure 1C:
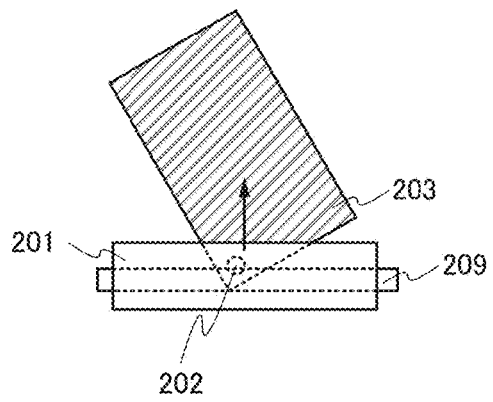
Figure 1D:
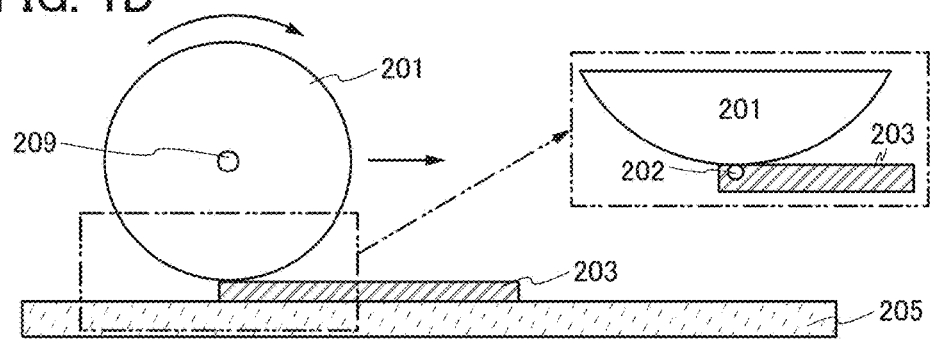

FIG. 1A, FIG. 1B, and FIG. 1D are a perspective view, a front view, and a side view, respectively, of a peeling apparatus just before peeling.

The peeling apparatus illustrated in FIGS. 1A to 1D includes a structure body 201 and a stage 205. The structure body 201 has a convex surface. The stage 205 has a supporting surface facing the convex surface.

In FIGS. 1A to 1D, the process member 203 is positioned between the convex surface and the supporting surface in the peeling apparatus.

FIG. 1C is a top view showing the case where the process member 203 is positioned differently from that illustrated in FIGS. 1A, 1B, and 1D. FIG. 1A illustrates the case where peeling is performed from a side portion of the process member 203, whereas FIG. 1C illustrates the case where peeling is performed from a corner portion of the process member 203. In the case where peeling is performed from the side portion of the process member 203, the peeling is preferably performed from a short side in a long side direction, in which case conditions such as the rotation speed of the structure body can be easily controlled and the yield of the peeling can be improved.

The process member 203 has a sheet-like shape and includes the first member 203a and the second member 203b each having a sheet-like shape. Each of the first member 203a and the second member 203b may have a single-layer structure or a stacked-layer structure. A peeling trigger is preferably formed in the process member 203, in which case peeling can be easily performed at the interface between the first member 203a and the second member 203b.

In the case where the peeling apparatus includes a transfer mechanism, the process member 203 may be positioned over the stage 205 by the transfer mechanism.

As illustrated in an enlarged view of a portion surrounded by dashed-two dotted line in FIG. 1D, the convex surface of the structure body 201 is positioned so as to overlap with a peeling trigger 202, which is formed to have a point-like shape or a linear shape (including a solid line shape, a dashed line shape, and a frame-like shape) in the process member 203. After that, when the structure body 201 rotates, the force of peeling the first member 203a is applied to the process member 203; thus, the first member 203a is peeled from the vicinity of the peeling trigger 202. As a result, the process member 203 is divided into the first member 203a and the second member 203b.

Figure 10A:
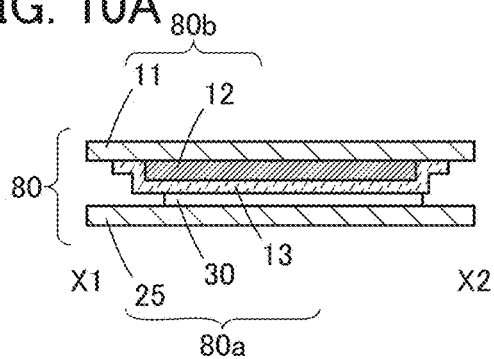
FIGS. 10A to 10E illustrate a stack manufacturing process.
Figure 10A:
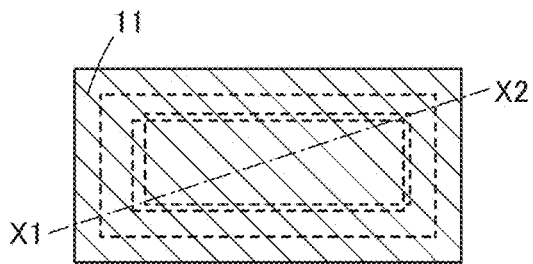
Figure 10B:
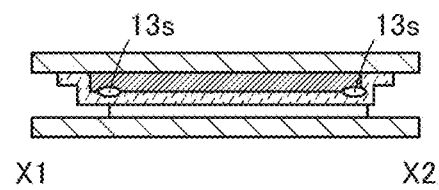
Figure 10B:
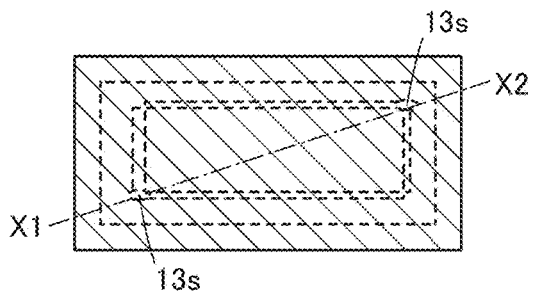
Figure 12A:
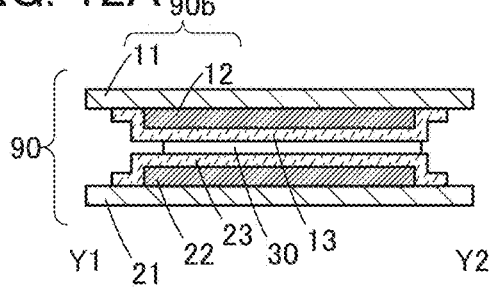
FIGS. 12A to 12E illustrate a stack manufacturing process.
Figure 12A:
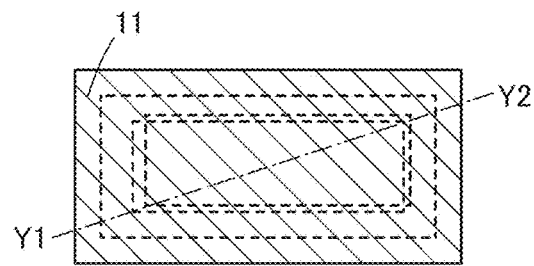
Figure 12B:
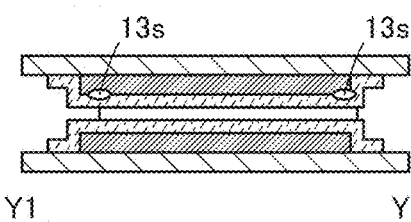
Figure 12B:
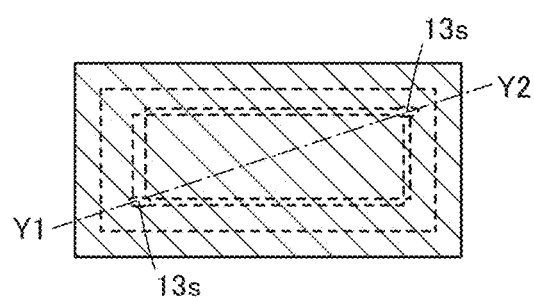
Figure 12E:
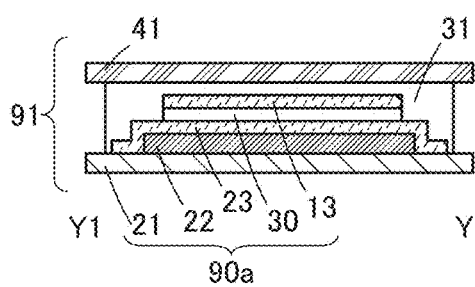
Figure 12E:
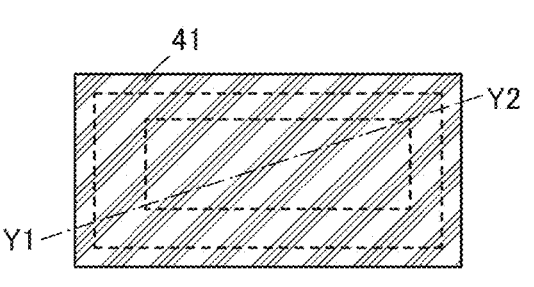
Figure 13A:
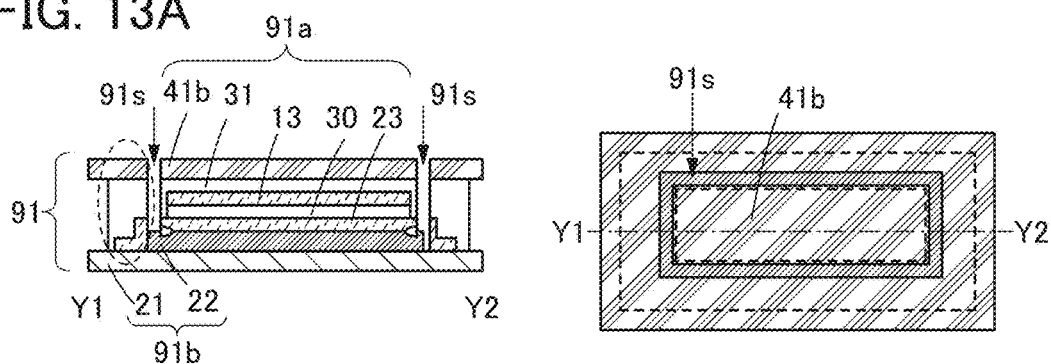
FIGS. 13A to 13E illustrate a stack manufacturing process.

Note that examples of the peeling trigger 202 include a peeling trigger 13s illustrated in FIG. 10B and FIG. 12B and a peeling trigger 91s illustrated in FIG. 13A. Examples of the process member 203 include structures described in Embodiment 4 (FIGS. 15A and 15B) and a stack 91 illustrated in FIG. 12E. Examples of the first member 203a include a first remaining portion 80a (FIG. 10A and the like), a first remaining portion 90a (FIG. 12A and the like), and a second remaining portion 91a (FIG. 13A and the like). Examples of the second member 203b include one surface layer 80b (FIG. 10A and the like) and one surface layer 90b (FIG. 12A and the like). Note that one embodiment of the present invention is not limited thereto.

The structure body 201 can have any shape as long as it has a convex surface (also referred to as a convex curved surface) and can have, for example, a cylindrical shape (including a columnar shape, a right cylindrical shape, an elliptic cylindrical shape, and a parabolic cylindrical shape) or a sphere shape. The structure body 201 can be a roller such as a drum roller, for example. Examples of the shape of the structure body 201 include a column with a bottom surface whose boundary includes a curved line (a cylinder with a perfect circle-shaped bottom surface, an elliptic cylinder with an ellipse-shaped bottom surface, or the like), and a column with a bottom surface whose boundary includes a curved line and a straight line (e.g., a column with a semi cylindrical-shaped bottom surface or a semi elliptical cylindrical-shaped bottom surface). If the shape of the structure body 201 is any of such columns, the convex surface corresponds to a curved surface of the column.

As a material of the structure body, a metal, an alloy, an organic resin, rubber, or the like can be used. The structure body may have a space or a hollow inside. Examples of the rubber include natural rubber, urethane rubber, nitrile rubber, and neoprene rubber.

Figure 4A:
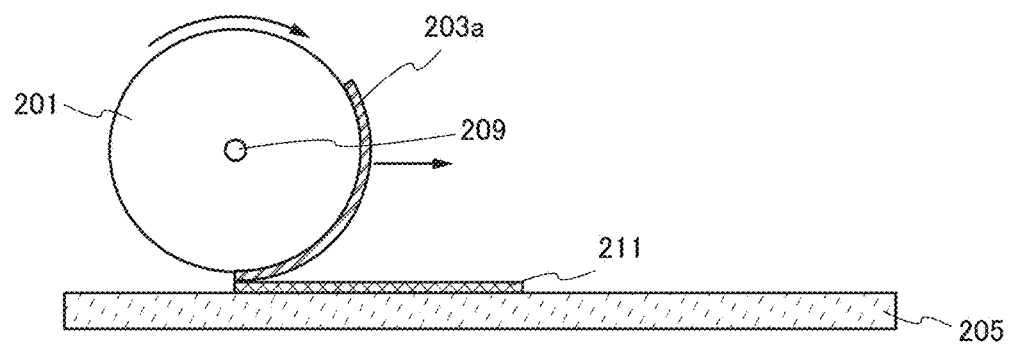
FIGS. 4A to 4D each illustrate an example of a peeling apparatus.
Figure 4B:
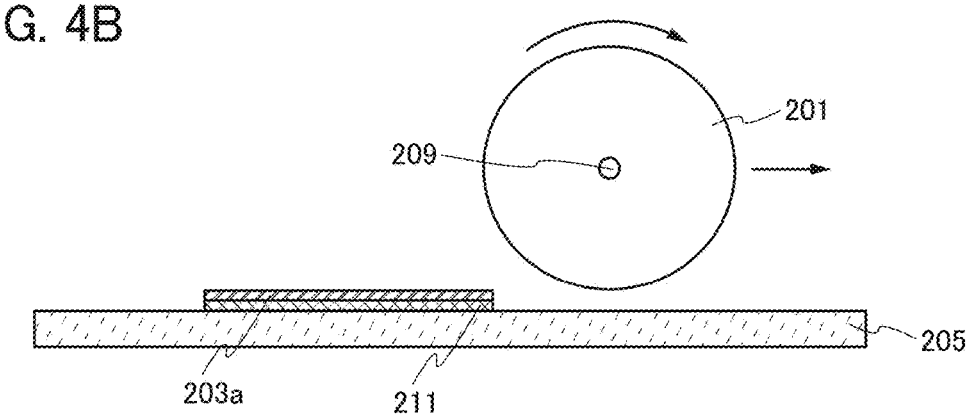
Figure 4C:
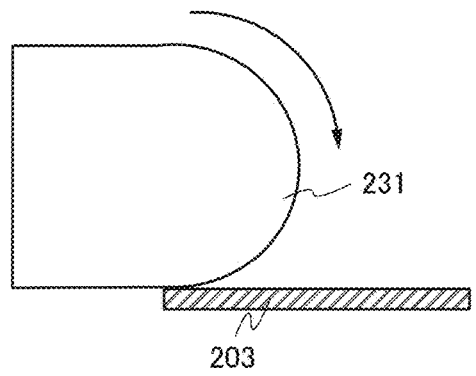
Figure 4D:
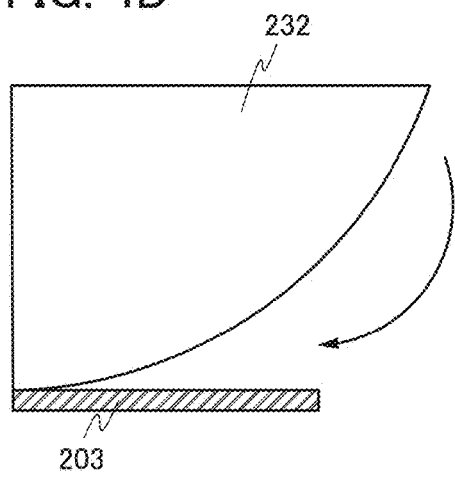

FIG. 4C and FIG. 4D illustrate a structure body 231 and a structure body 232, respectively. The structure bodies 231 and 232 are each an example of a column with a bottom surface whose boundary includes a curved line and a straight line.

The radius of curvature of the convex surface of the structure body is less than the radius of curvature of the supporting surface of the stage 205. The radius of curvature of the convex surface can be, for example, greater than or equal to 0.5 mm and less than or equal to 1000 mm. In the case where a film is peeled, for example, the radius of curvature of the convex surface can be greater than or equal to 0.5 mm and less than or equal to 500 mm, and specifically can be 150 mm, 225 mm, or 300 mm. As an example of the structure body having such a convex surface, a roller with a diameter of 300 mm, 450 mm, or 600 mm can be given. Note that a preferred radius of curvature of the convex surface depends on the thickness or the size of a process member. For this reason, in one embodiment of the present invention, the radius of curvature of the convex surface of the structure body is not limited to the above range as long as the radius of curvature of the convex surface is less than that of the supporting surface of the stage 205.

In the case where the process member 203 includes a stacked-layer structure with low adhesion, peeling might occur at an interface with low adhesion, which causes a reduction in the yield of peeling. In the case where the process member 203 includes an organic EL element, for example, peeling might occur at the interface between two layers in the EL layer or the interface between the EL layer and an electrode, in which case peeling does not occur at the interface between the first member 203a and the second member 203b. Thus, the radius of curvature of the convex surface or the rotation speed of the structure body 201 is set so that peeling can occur at the interface between the first member 203a and the second member 203b.

When the radius of curvature of the convex surface is too small, an element included in the first member 203a which is wound along the convex surface might be broken. For this reason, the radius of curvature of the convex surface is preferably greater than or equal to 0.5 mm. Furthermore, when a large stack is manufactured by the peeling apparatus, the radius of curvature of the convex surface is preferably greater than or equal to 100 mm.

When the radius of curvature of the convex surface is large, a substrate of glass, sapphire, quartz, silicon, or the like, which has low flexibility and high stiffness, can be wound along the convex surface. For this reason, the radius of curvature of the convex surface is preferably greater than or equal to 300 mm, for example.

When the radius of curvature of the convex surface is too large, the size of the peeling apparatus might be increased, which might limit the installation location. For this reason, the radius of curvature of the convex surface is preferably less than or equal to 1000 mm, further preferably less than or equal to 500 mm, for example.

At least part of the convex surface may have viscosity. For example, an adhesive tape may be put on part or the whole of the convex surface. Alternatively, at least part of the convex surface may have adhesion to the first member 203a. Further alternatively, the structure body 201 may include a suction mechanism so that the convex surface can be attached to the first member 203a.

The structure body 201 or the stage 205 may be movable in at least one of the following directions: forward and backward; right and left; and up and down. The distance between the convex surface of the structure body 201 and the supporting surface of the stage 205 is preferably changeable because peeling of process members with a variety of thicknesses can be performed. In Structural Example 1, the structure body 201 is movable in the longitudinal direction of the stage 205.

Examples of holding mechanisms for holding a member or the like (e.g., the process member 203 or the second member 203b) placed over the stage 205 include chucks such as a suction chuck, an electrostatic chuck, and a mechanical chuck. For example, a porous chuck may be used. Alternatively, a member may be fixed to a suction table, a heater table, a spinner table, or the like.

Figure 2A:
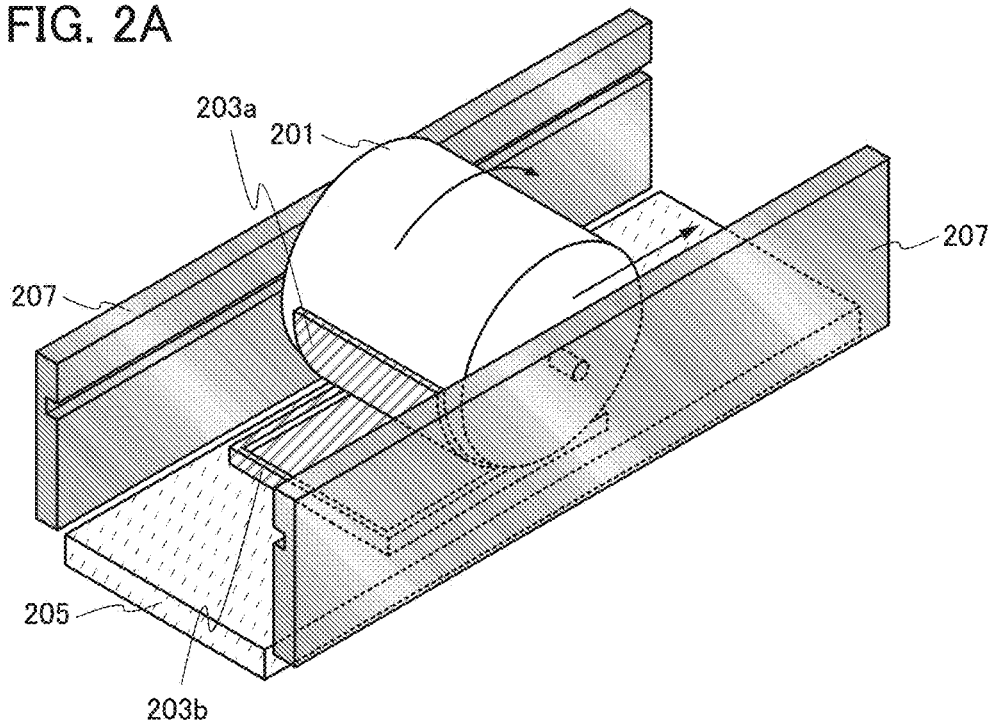
FIGS. 2A to 2C illustrate an example of a peeling apparatus.
Figure 2B:
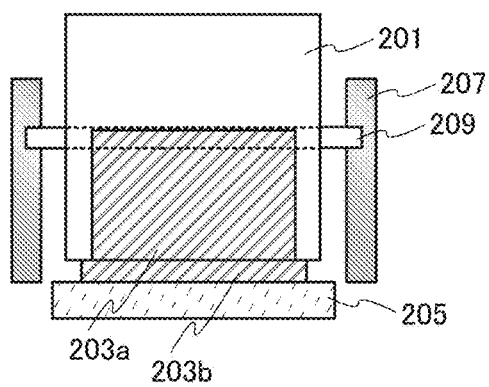
Figure 2C:
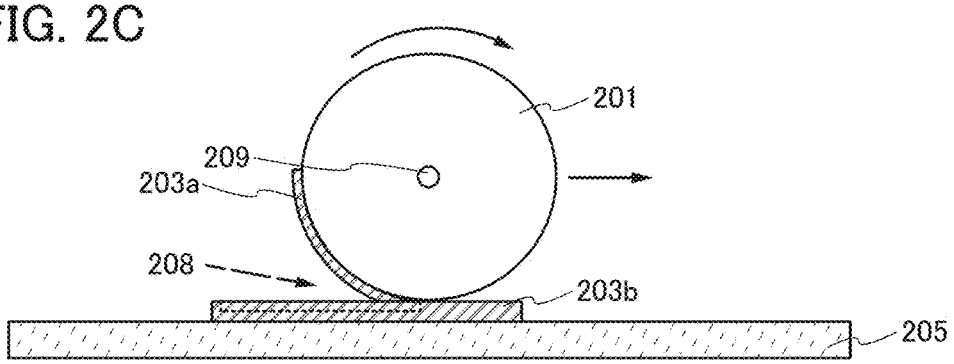
Figure 3A:
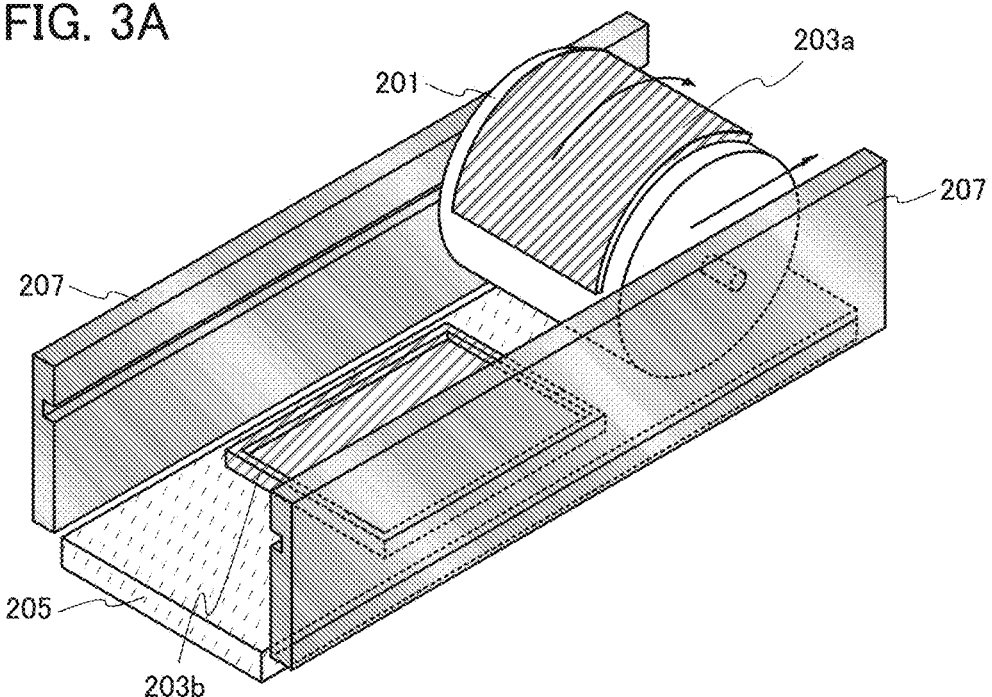
FIGS. 3A to 3C illustrate an example of a peeling apparatus.
Figure 3B:
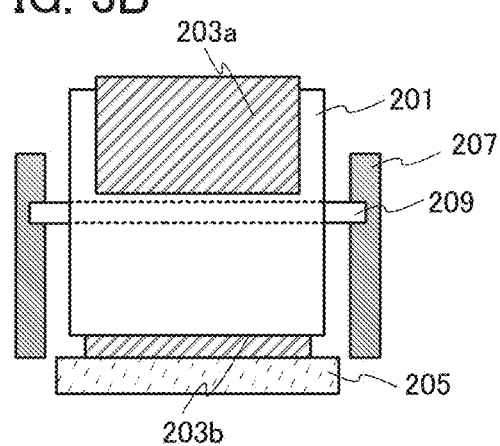
Figure 3C:
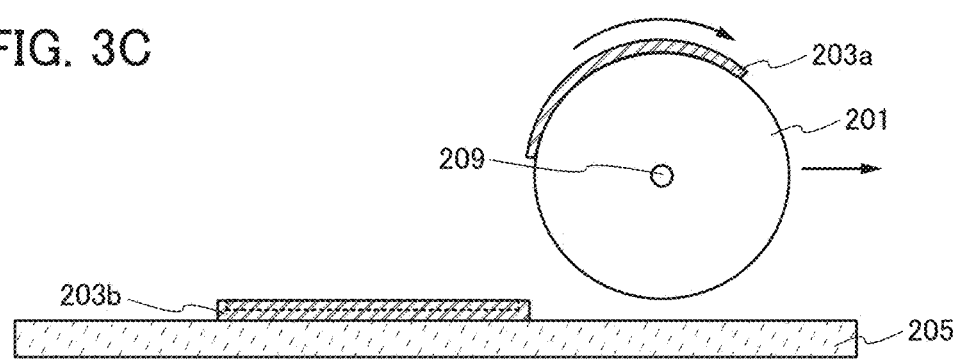

FIG. 2A, FIG. 2B, and FIG. 2C are a perspective view, a front view, and a side view, respectively, of the peeling apparatus during the peeling. FIG. 3A, FIG. 3B, and FIG. 3C are a perspective view, a front view, and a side view, respectively, of the peeling apparatus after the peeling.

The structure body 201 includes a rotation axis 209 at the center. FIG. 2A, FIG. 2C, and the like show the rotation direction of the structure body 201; however, the structure body 201 may rotate in the reverse direction. The rotation axis 209 moves along a groove of a guide 207, whereby the structure body 201 can move in the longitudinal direction of the stage 205 (the horizontal direction in FIG. 2C and FIG. 3C).

When the structure body 201 rotates, the first member 203a overlapping with the convex surface of the structure body 201 is peeled from the process member 203 from the vicinity of the peeling trigger and wound along the convex surface to be separated from the second member 203b. The first member 203a is held by the convex surface of the structure body 201 and the second member 203b is held over the stage 205.

In the peeling apparatus of one embodiment of the present invention, at least one of the stage 205 and the structure body 201 moves so that the position of the rotation center of the structure body 201 with respect to the stage 205 changes. In Structural Example 1, the rotation center of the structure body 201 moves. Specifically, with the stationary (or fixed) stage 205, the structure body 201 can move (roll) from one end portion side of the process member 203 to the opposite end portion while the first member 203a is wound by the structure body 201.

The linear velocity of the convex surface of the structure body 201 is greater than or equal to the speed of the rotation center of the structure body 201 passing the stage 205.

The first member 203a and the second member 203b may be separated from each other while tension is applied to the first member 203a or the second member 203b.

A liquid feeding mechanism for feeding liquid to the separation surface between the first member 203a and the second member 203b may be provided. For example, liquid is fed in the direction of an arrow 208 in FIG. 2C.

In that case, an adverse effect of static electricity caused at the time of peeling (e.g., damage to a semiconductor element from static electricity) on an element or the like included in the first member 203a can be suppressed. Note that mist or vapor of liquid may be sprayed. As liquid, pure water, an organic solvent, a neutral solution, an alkaline solution, an acid solution, a solution into which salt is dissolved, or the like can be used.

In the case where the peeling apparatus includes a transfer mechanism, the second member 203b over the stage 205 and the first member 203a wound by the structure body 201 may be individually transferred by the transfer mechanism after the peeling.

Alternatively, as illustrated in FIGS. 4A and 4B, the structure body 201 may further rotate so that the first member 203a is bonded to a sheet-like member 211 positioned over the stage 205.

The member 211 may have a single-layer structure or a stacked-layer structure. At least part of a surface, which is in contact with the first member 203a, of the member 211 preferably has adhesion to the first member 203a. For example, an adhesive layer may be provided.

The whole first member 203a may be wound along the convex surface before the structure body 201 finishes rotating one turn. This is preferred because the first member 203a can be prevented from touching by the stage 205 and from pressure application by the structure body 201.

It is also preferable that the first member 203a wound along the convex surface be bonded to the member 211 without touching the stage 205.

For example, it is possible that the structure body 201 rotates ¼ turn so that the whole first member 203a is wound along the convex surface, the structure body 201 further rotates ¾ turn to move to the vicinity of an end portion of the member 211, and the structure body 201 further rotates ¼ turn so that the first member 203a is bonded on the member 211.

The distance between the structure body 201 and the stage 205 may be adjusted after the peeling so that the first member 203a wound by the structure body 201 does not touch the stage 205. Alternatively, the distance between the structure body 201 and the stage 205 may be adjusted after the peeling so that the first member 203a touches the member 211.

Structural Example 2

In Structural Example 2, a stage moves so that the position of the rotation center of a structure body with respect to the stage changes.

FIGS. 5A to 5C, FIGS. 6A to 6C, and FIGS. 7A to 7C illustrate an example where a first member 253a is peeled from a process member 253 so that the first member 253a and a second member 253b are separated from each other.

Figure 5A:
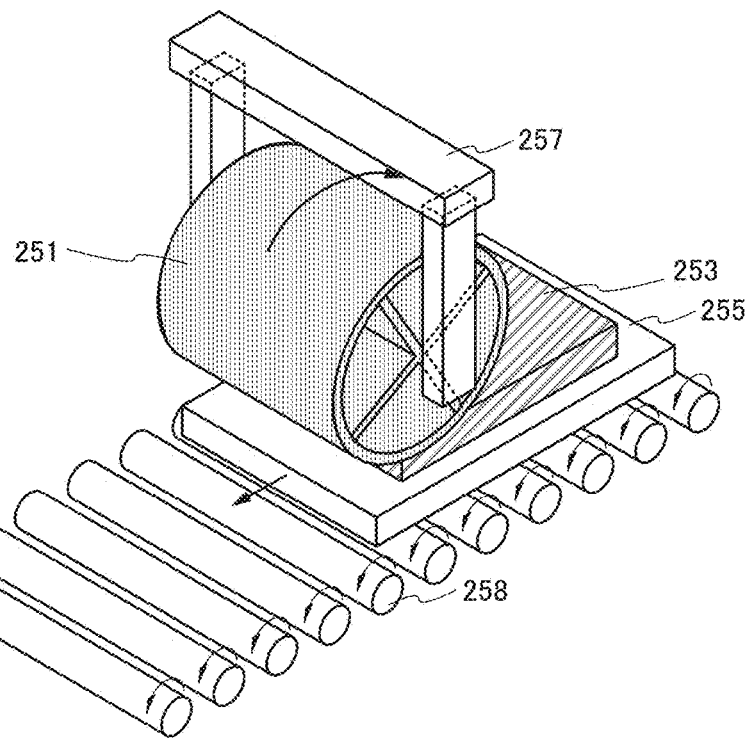
FIGS. 5A to 5C illustrate an example of a peeling apparatus.
Figure 5B:
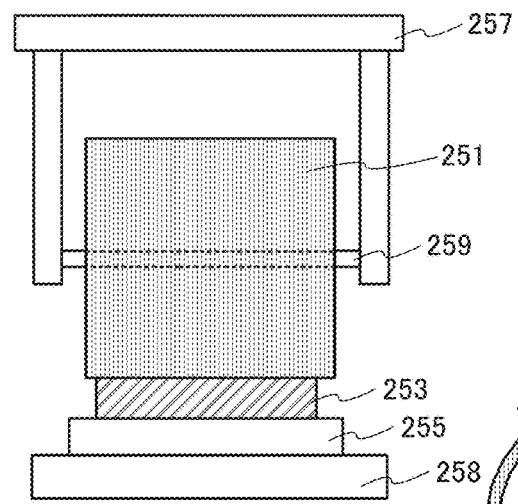
Figure 5C:
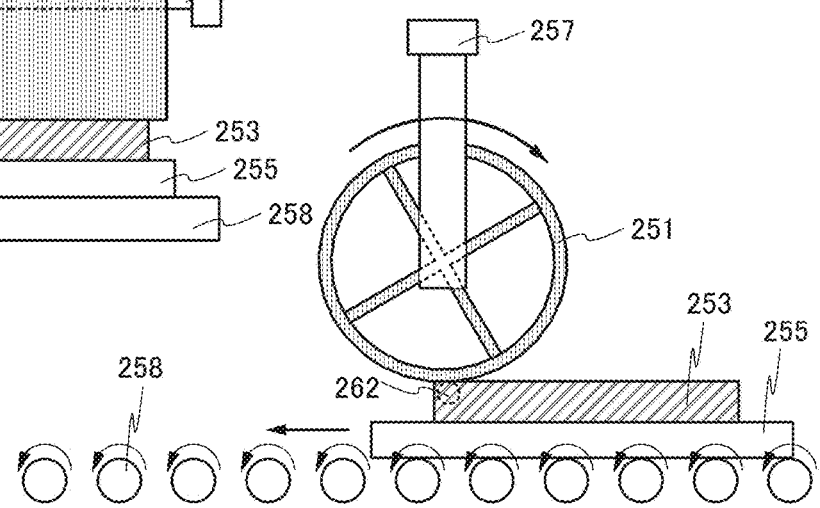

FIG. 5A, FIG. 5B, and FIG. 5C are a perspective view, a front view, and a side view, respectively, of a peeling apparatus just before peeling.

The peeling apparatus illustrated in FIGS. 5A to 5C includes a structure body 251, a stage 255, a support body 257, and transfer rollers 258. The structure body 251 has a convex surface. The stage 255 has a supporting surface facing the convex surface. The support body 257 supports the structure body 251.

In FIGS. 5A to 5C, the process member 253 is positioned between the convex surface and the supporting surface in the peeling apparatus.

Although FIG. 5A illustrates the case where peeling is performed from a side portion of the process member 253, peeling can be performed from a corner portion of the process member 253 as described in Structural Example 1.

The structure body 251, the process member 253, and the stage 255 can have structures similar to those of the structure body 201, the process member 203, and the stage 205 in Structural Example 1, respectively; thus, the descriptions are omitted. In the process member 253, a peeling trigger 262 is formed.

The support body 257 supports a rotation axis 259 of the structure body 251. The support body 257 adjusts the vertical position of the structure body 251. Thus, the distance between the convex surface of the structure body 251 and the supporting surface of the stage 255 can be changed.

The transfer rollers 258 can transfer the stage 255. There is no particular limitation on a transfer means of the stage 255, and a conveyor belt or a transfer robot can be used.

In the case where the peeling apparatus includes a transfer mechanism, the process member 253 may be positioned over the stage 255 by the transfer mechanism.

Figure 6A:
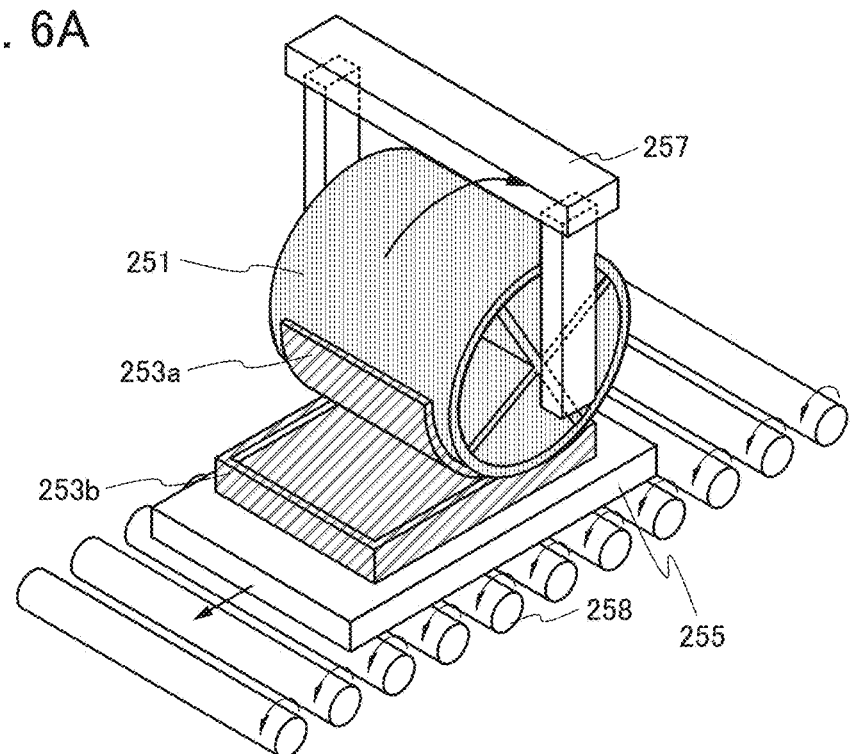
FIGS. 6A to 6C illustrate an example of a peeling apparatus.
Figure 6B:
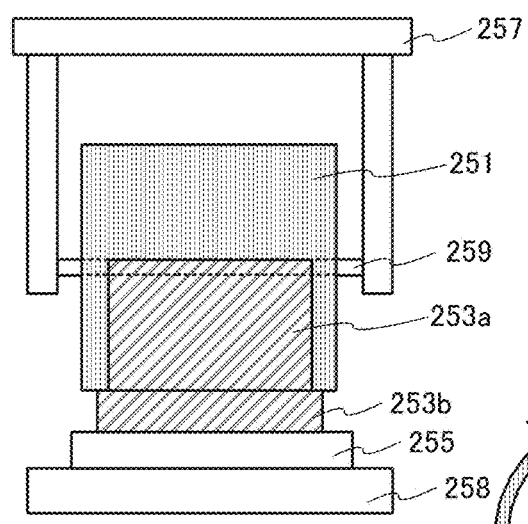
Figure 6C:
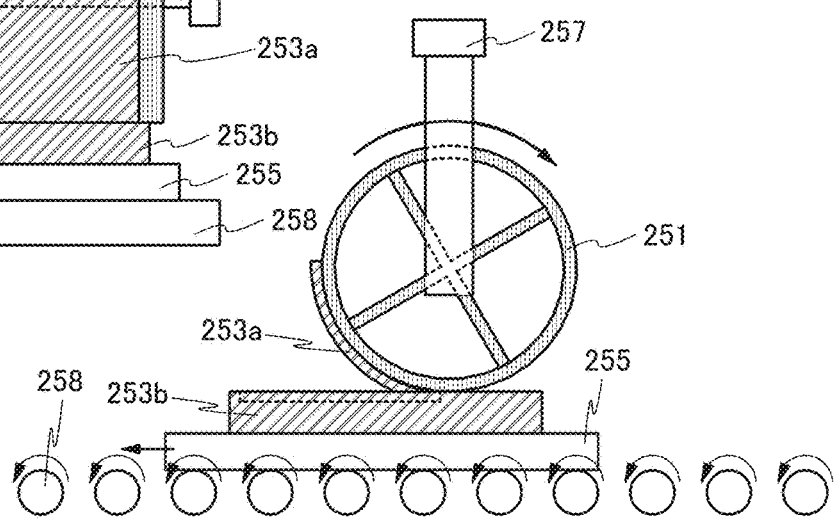
Figure 7A:
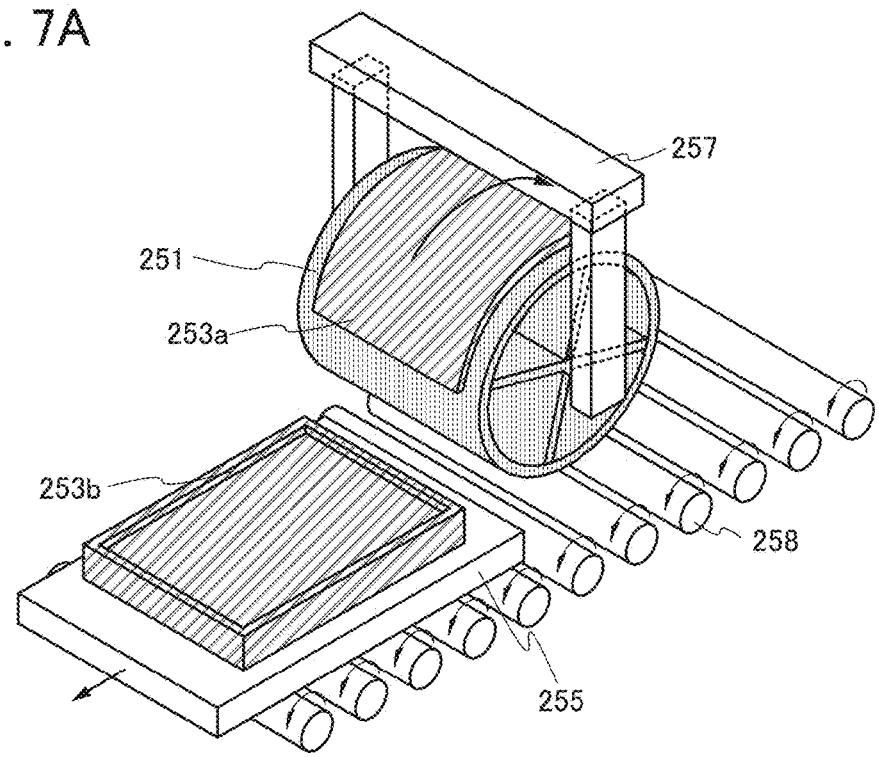
FIGS. 7A to 7C illustrate an example of a peeling apparatus.
Figure 7B:
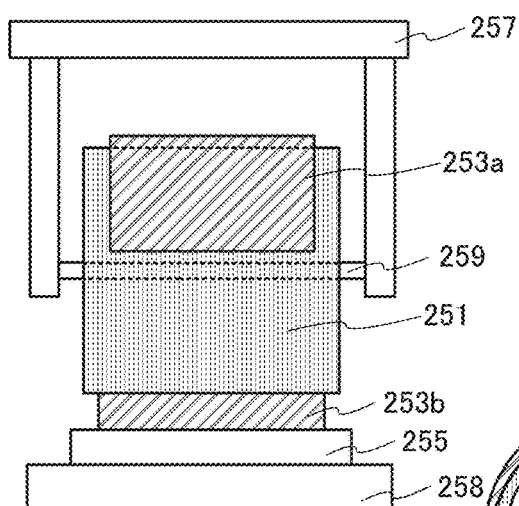
Figure 7C:
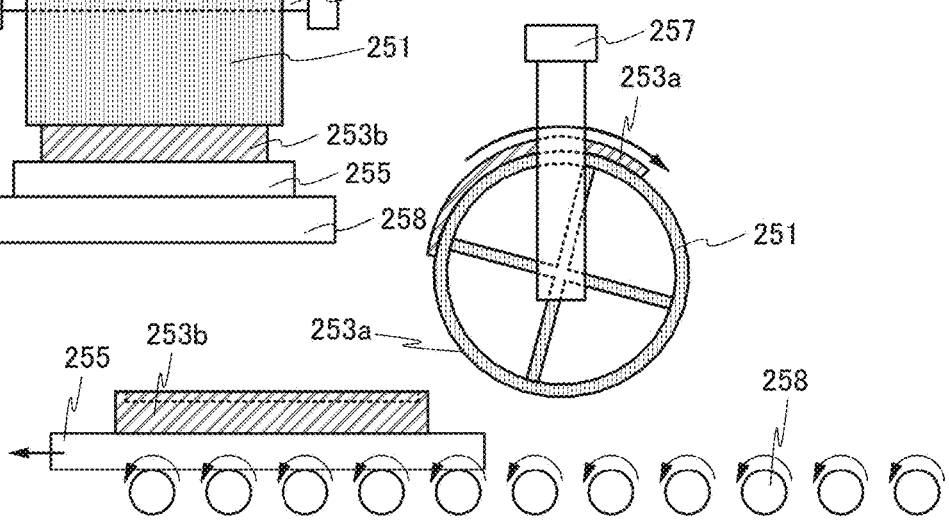

FIG. 6A, FIG. 6B, and FIG. 6C a perspective view, a front view, and a side view, respectively, of the peeling apparatus during the peeling. FIG. 7A, FIG. 7B, and FIG. 7C a perspective view, a front view, and a side view, respectively, of the peeling apparatus after the peeling.

The structure body 251 includes the rotation axis 259 at the center. FIG. 6A, FIG. 6C, and the like show the rotation directions of the structure body 251 and the transfer rollers 258; however, the structure body 251 and the transfer rollers 258 may each rotate in the reverse direction. The transfer rollers 258 rotate, whereby a positional relation between the rotation center of the structure body 251 and the stage 255 and the process member 253 over the stage 255 can change (specifically, the stage 255 and the process member 253 move in the horizontal direction in FIG. 6C or FIG. 7C).

The first member 253a held by the structure body 251 is peeled from the process member 253 and wound along the convex surface to be separated from the second member 253b. The second member 253b is held over the stage 255.

The convex surface of the structure body 251 is positioned so as to overlap with the peeling trigger 262 formed in the process member 253. After that, when the structure body 251 rotates, the force of peeling the first member 253a is applied to the process member 253; thus, the first member 253a is peeled from the vicinity of the peeling trigger 262. As a result, the first member 253a peeled from the process member 253 is wound along the convex surface and separated from the second member 253b. The first member 253a is held by the convex surface of the structure body 251 and the second member 253b is held over the stage 255.

In the case where the peeling apparatus includes a transfer mechanism, the second member 253b over the stage 255 and the first member 253a wound by the structure body 251 may be individually transferred by the transfer mechanism after the peeling.

Figure 8A:
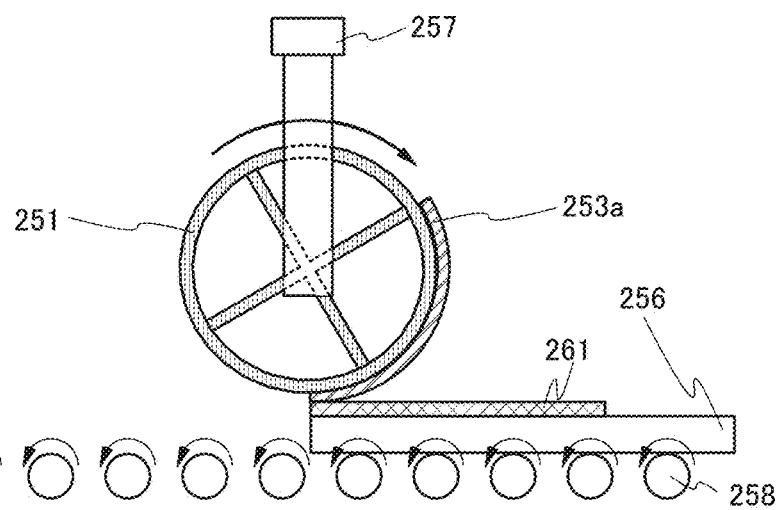
FIGS. 8A and 8B illustrate an example of a peeling apparatus, and FIGS. 8C to 8E each illustrate a planar shape of a separation layer.
Figure 8B:
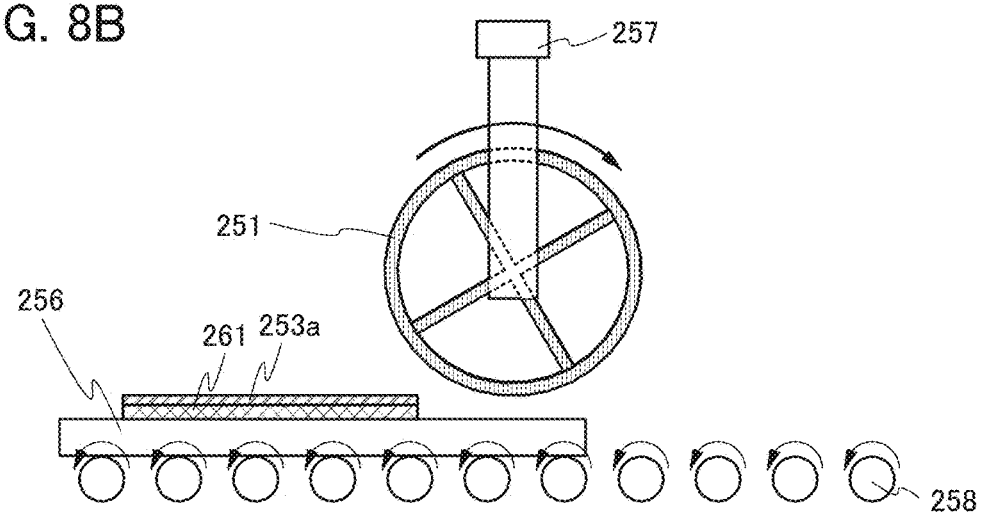

Alternatively, as illustrated in FIGS. 8A and 8B, the structure body 251 and the transfer rollers 258 may further rotate so that the first member 253a is bonded to a sheet-like member 261 positioned over a stage 256. Note that the member 261 may be positioned over the same stage (the stage 255) as the process member 253.

This embodiment can be combined with any of the other embodiments as appropriate.

Embodiment 2

In this embodiment, a stack manufacturing apparatus of one embodiment of the present invention will be described with reference to FIG. 9 and FIGS. 10A to 10E.

The stack manufacturing apparatus of one embodiment of the present invention includes a first supply unit configured to supply a process member having a sheet-like shape, a first separation unit configured to be supplied with the process member and divide the process member into one surface layer and a first remaining portion, a support body supply unit configured to supply a first support body having a sheet-like shape, a first bonding unit configured to be supplied with the first remaining portion and the first support body and bond the first remaining portion and the first support body to each other with a first bonding layer, and a first unloading unit configured to unload a first stack including the first remaining portion, the first bonding layer, and the first support body. The first separation unit includes the peeling apparatus described in Embodiment 1.

The stack manufacturing apparatus having the above structure manufactures a stack using the sheet-like process member supplied to the first supply unit. The first separation unit divides the process member into the one surface layer and the first remaining portion. The first bonding unit bonds the first remaining portion and the sheet-like first support body supplied from the support body supply unit to each other with the first bonding layer. Then, the first unloading unit unloads the first stack including the first remaining portion, the first bonding layer, and the first support body.

In the case where the first separation unit includes the peeling apparatus described in Embodiment 1, the peeling apparatus includes a structure body which can hold the first remaining portion of the process member and a stage which can hold the one surface layer of the process member. The first remaining portion is wound to separate the first remaining portion and the one surface layer of the process member between the structure body and the stage from each other.

Furthermore, the structure body may supply the first remaining portion to the first bonding unit and the first remaining portion may be peeled from the structure body so that the first remaining portion is bonded to the first support body.

In this manner, by using the stack manufacturing apparatus of one embodiment of the present invention, the first stack including the first remaining portion, the first bonding layer, and the first support body can be manufactured.

Figure 9:
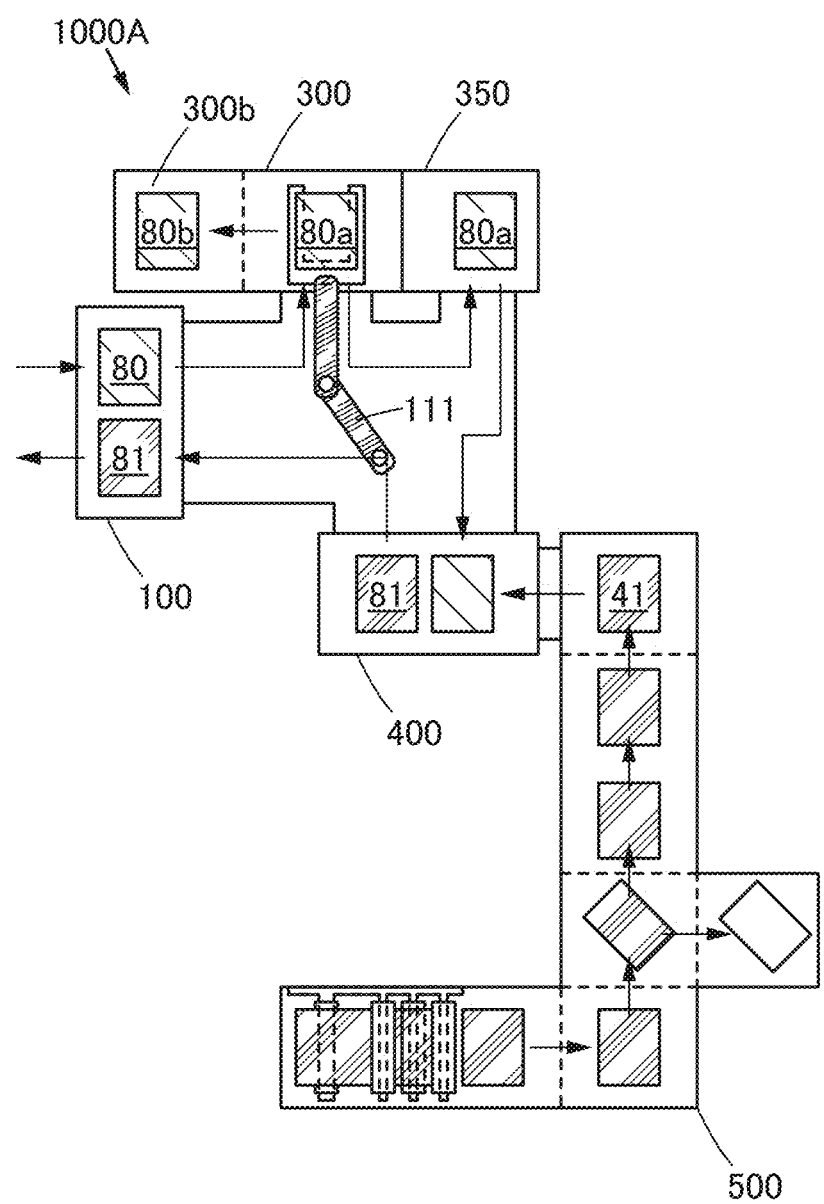
FIG. 9 illustrates a stack manufacturing apparatus.

FIG. 9 is a schematic view illustrating a structure of a stack manufacturing apparatus 1000A of one embodiment of the present invention, and a transfer path of a process member and a stack in a process.

Figure 10C:
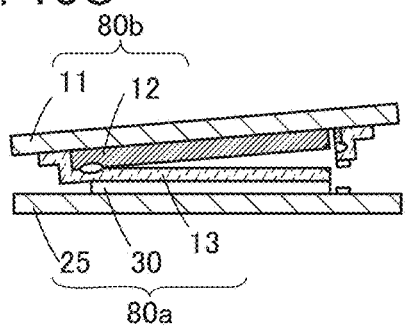

FIGS. 10A to 10E are schematic views illustrating a process for manufacturing a stack with the use of the stack manufacturing apparatus 1000A of one embodiment of the present invention. FIGS. 10A, 10B, 10D, and 10E each illustrate a plan view and a cross-sectional view taken along dashed-dotted line X1-X2 in the plan view. FIG. 10C illustrates only a cross-sectional view.

The stack manufacturing apparatus 1000A described in this embodiment includes a first supply unit 100, a first separation unit 300, a first bonding unit 400, and a support body supply unit 500 (FIG. 9).

Note that each unit can be named freely, and the name does not limit the function of each unit.

In this embodiment, an example in which the first separation unit 300 includes the peeling apparatus of one embodiment of the present invention that is described in Embodiment 1 is described.

The first supply unit 100 can supply a process member 80. Note that the first supply unit 100 can also serve as a first unloading unit.

The first separation unit 300 can separate the one surface layer 80b and the first remaining portion 80a of the process member 80 from each other (FIG. 9 and FIGS. 10A to 10C).

Note that in this specification, the surface layer may have a stacked-layer structure instead of a single-layer structure as long as it includes an outermost layer. For example, the one surface layer 80b in FIG. 10A corresponds to a first substrate 11 and a first separation layer 12.

Figure 10D:
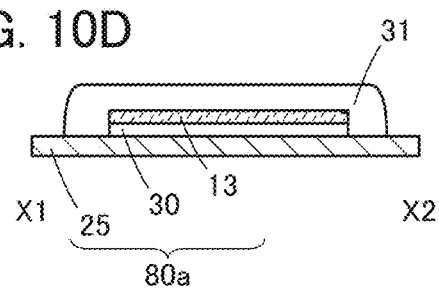
Figure 10D:
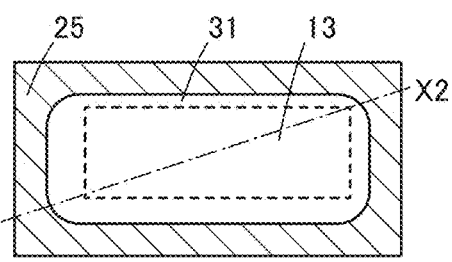

The first bonding unit 400 is supplied with the first remaining portion 80a and a first support body 41. The first bonding unit 400 bonds the first support body 41 and the first remaining portion 80a to each other with a first adhesive layer 31 (FIG. 9 and FIGS. 10D and 10E).

The support body supply unit 500 supplies the first support body 41 (FIG. 9).

Figure 10E:
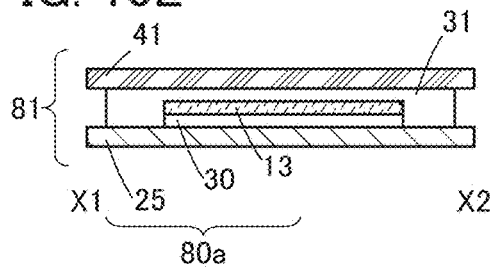
Figure 10E:
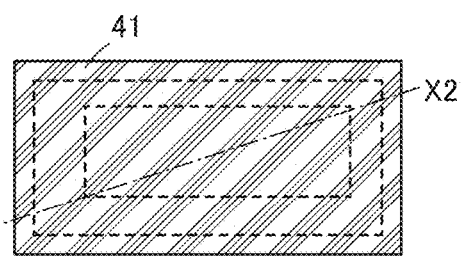

The first supply unit 100 also serving as the first unloading unit can unload a stack 81 including the first remaining portion 80a, the first adhesive layer 31, and the first support body 41 (FIG. 9 and FIG. 10E). The stack manufacturing apparatus of one embodiment of the present invention may include an unloading unit and a supply unit separately.

The above stack manufacturing apparatus of one embodiment of the present invention includes the first supply unit 100 that supplies the process member 80 and also serves as a first unloading unit for unloading the stack 81, the first separation unit 300 that separates the one surface layer 80b and the first remaining portion 80a of the process member 80 from each other, the first bonding unit 400 that bonds the first support body 41 to the first remaining portion 80a, and the support body supply unit 500 that supplies the first support body 41. This structure makes it possible to peel the one surface layer 80b of the process member 80 and bond the first support body 41 to the first remaining portion 80a which is separated. As described above, one embodiment of the present invention can provide an apparatus for manufacturing a stack including a support body and a remaining portion of a process member.

Furthermore, the stack manufacturing apparatus 1000A in this embodiment includes a first storage portion 300b, a first cleaning device 350, a transfer mechanism 111, and the like.

The first storage portion 300b stores the one surface layer 80b peeled from the process member 80.

The first cleaning device 350 cleans the first remaining portion 80a peeled from the process member 80.

The transfer mechanism 111 transfers the process member 80, the first remaining portion 80a peeled from the process member 80, and the stack 81.

<<Stack Manufacturing Apparatus>>

Individual components of the stack manufacturing apparatus of one embodiment of the present invention will be described below.

<First Supply Unit>

The first supply unit 100 supplies the process member 80. For example, to allow the transfer mechanism 111 to transfer a plurality of process members 80 successively, a multistage storage capable of storing the plurality of process members 80 can be included.

Furthermore, the first supply unit 100 in this embodiment also serves as the first unloading unit. The first supply unit 100 unloads the stack 81 including the first remaining portion 80a, the first adhesive layer 31, and the first support body 41. For example, to allow the transfer mechanism 111 to transfer a plurality of stacks 81 successively, a multistage storage capable of storing the plurality of stacks 81 can be included.

<First Separation Unit>

The first separation unit 300 includes the peeling apparatus of one embodiment of the present invention that is described in Embodiment 1 as an example.

<First Bonding Unit>

The first bonding unit 400 includes a mechanism for forming the first adhesive layer 31 and a crimp mechanism for attaching the first remaining portion 80a and the first support body 41 to each other with the use of the first adhesive layer 31.

Examples of the mechanism for forming the first adhesive layer 31 include a dispenser for applying a liquid adhesive and a device feeding an adhesive sheet shaped as a sheet in advance.

Note that the first adhesive layer 31 may be formed on the first remaining portion 80a and/or the first support body 41. Specifically, the first support body 41 on which the first adhesive layer 31 is formed in advance may be used.

Figure 31:
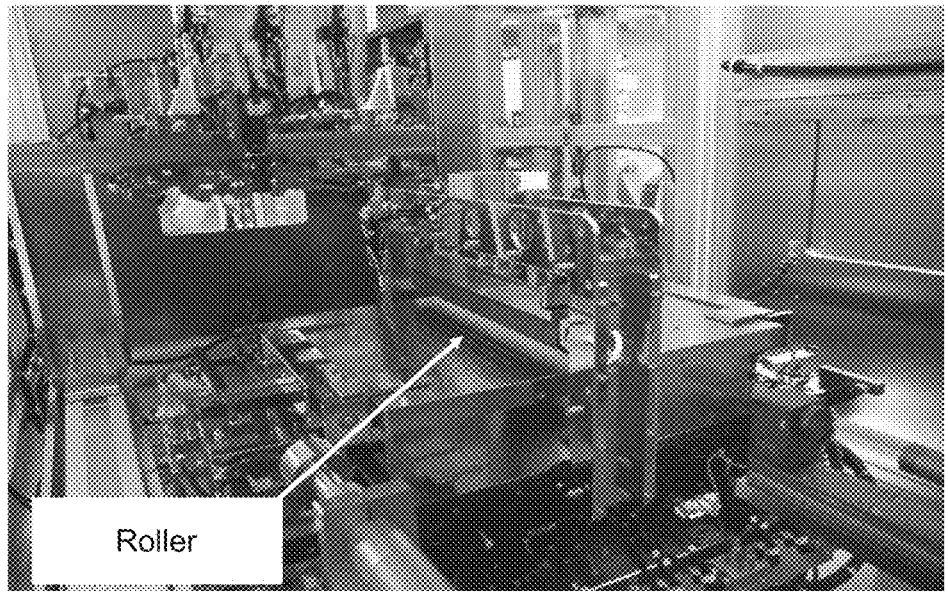
FIG. 31 is a photograph showing an example of a bonding apparatus.

Examples of the crimp mechanism for attaching the first remaining portion 80a and the first support body 41 include mechanisms for applying pressure that are controlled to apply a constant pressure or provide a uniform gap, such as a pair of rollers, a flat plate and a roller, and a pair of flat plates facing each other. FIG. 31 is a photograph of as an example, a bonding apparatus having a roller as a pressurization mechanism, which is a crimp mechanism.

<Support Body Supply Unit>

Figure 32:
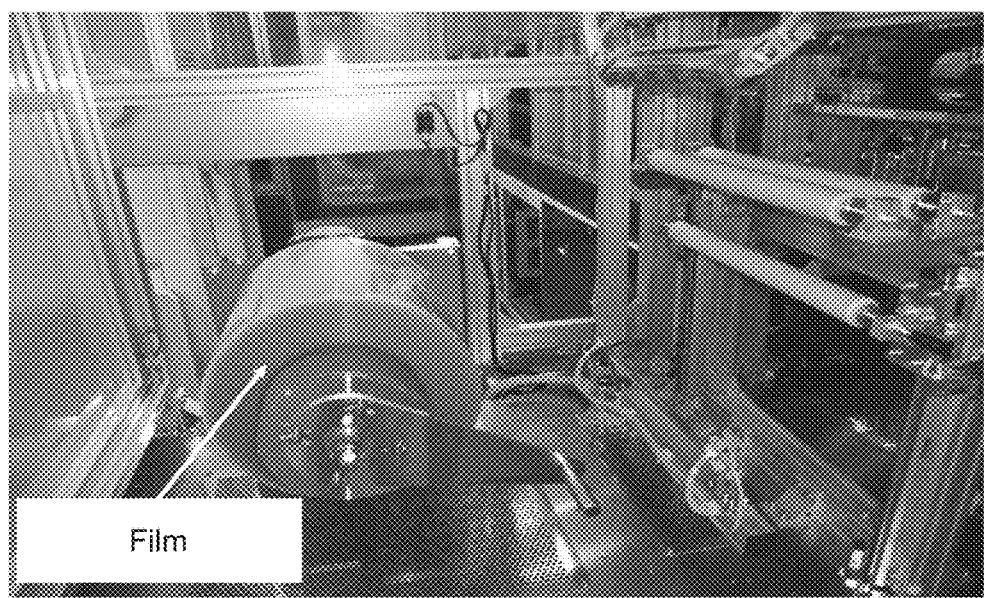
FIG. 32 is a photograph showing an example of an unwinding mechanism in a support body supply apparatus.

The support body supply unit 500 supplies the first support body 41. For example, the support body supply unit 500 unrolls a film which is supplied in a rolled shape, cuts the film to a predetermined length, activates a surface of the film, and supplies the film as the first support body 41. FIG. 32 is a photograph of, as an example, an unwinding mechanism included in a support body supply apparatus, which is used to unwind a rolled film.

<Stack Manufacturing Method>

A method for manufacturing the stack 81 from the process member 80 with the use of the stack manufacturing apparatus 1000A will be described below with reference to FIG. 9 and FIGS. 10A to 10E.

The process member 80 includes the first substrate 11, the first separation layer 12 on the first substrate 11, a first peeled layer 13 whose one surface is in contact with the first separation layer 12, a bonding layer 30 whose one surface is in contact with the other surface of the first peeled layer 13, a base 25 in contact with the other surface of the bonding layer 30 (FIG. 10A). Note that in this embodiment, description is given of a case of using the process member 80 in which the peeling triggers 13s are formed in advance near end portions of the bonding layer 30 (FIG. 10B). The structure of the process member 80 is described in detail in Embodiment 4.

<First Step>

The process member 80 is loaded into the first supply unit 100. The first supply unit 100 supplies the process member 80, and the transfer mechanism 111 transfers the process member 80 and supplies the process member 80 to the first separation unit 300.

<Second Step>

The first separation unit 300 separates the one surface layer 80b of the process member 80. Specifically, from the peeling trigger 13s formed near the end portion of the bonding layer 30, the first substrate 11 and the first separation layer 12 are separated from the first peeled layer 13 (FIG. 10C).

By this step, the first remaining portion 80a is obtained from the process member 80. Specifically, the first remaining portion 80a includes the first peeled layer 13, the bonding layer 30 whose one surface is in contact with the first peeled layer 13, and the base 25 in contact with the other surface of the bonding layer 30. Note that a portion of the bonding layer 30 on the outer side of the peeling triggers 13s remains at least in the first remaining portion 80a or on the one surface layer 80b. Although FIG. 10C illustrates an example in which portions of the bonding layer 30 remain on both sides, the present invention is not limited to this example. After the separation, a portion of the bonding layer 30 which remains in the first remaining portion 80a and which does not contribute to bonding between the first peeled layer 13 and the base 25 may be removed. Such removal is preferable because an adverse effect on the functional element in a subsequent step (e.g., entry of impurities) can be suppressed. For example, an unnecessary part of the bonding layer 30 can be removed by wiping, cleaning, or the like.

<Third Step>

The transfer mechanism 111 transfers the first remaining portion 80a. The first cleaning device 350 cleans the first remaining portion 80a supplied thereto.

The transfer mechanism 111 transfers the first remaining portion 80a after the cleaning and supplies the first remaining portion 80a to the first bonding unit 400. The support body supply unit 500 supplies the first support body 41 to the first bonding unit 400.

Note that the transfer mechanism 111 may supply the first remaining portion 80a from the first separation unit 300 directly to the first bonding unit 400 without supplying it to the cleaning device.

The first bonding unit 400 forms the first adhesive layer 31 on the first remaining portion 80a supplied thereto (FIG. 10D), and bonds the first remaining portion 80a and the first support body 41 to each other with the first adhesive layer 31 (FIG. 10E).

By this step, the stack 81 is obtained using the first remaining portion 80*a*. Specifically, the stack 81 includes the first support body 41, the first adhesive layer 31, the first peeled layer 13, the bonding layer 30 whose one surface is in contact with the first peeled layer 13, and the base 25 in contact with the other surface of the bonding layer 30.

<Fourth Step>

The transfer mechanism 111 transfers the stack 81, and the stack 81 is supplied to the first supply unit 100 also serving as the first unloading unit.

After this step, the stack 81 can be unloaded.

<Another Step>

Note that when it takes time to cure the first adhesive layer 31, it is preferable that the stack 81 in which the first adhesive layer 31 is not cured yet be unloaded and the first adhesive layer 31 be cured outside the stack manufacturing apparatus 1000A, in which case occupancy time of the apparatus can be reduced.

<Another Peeling Apparatus>

Figure 27:
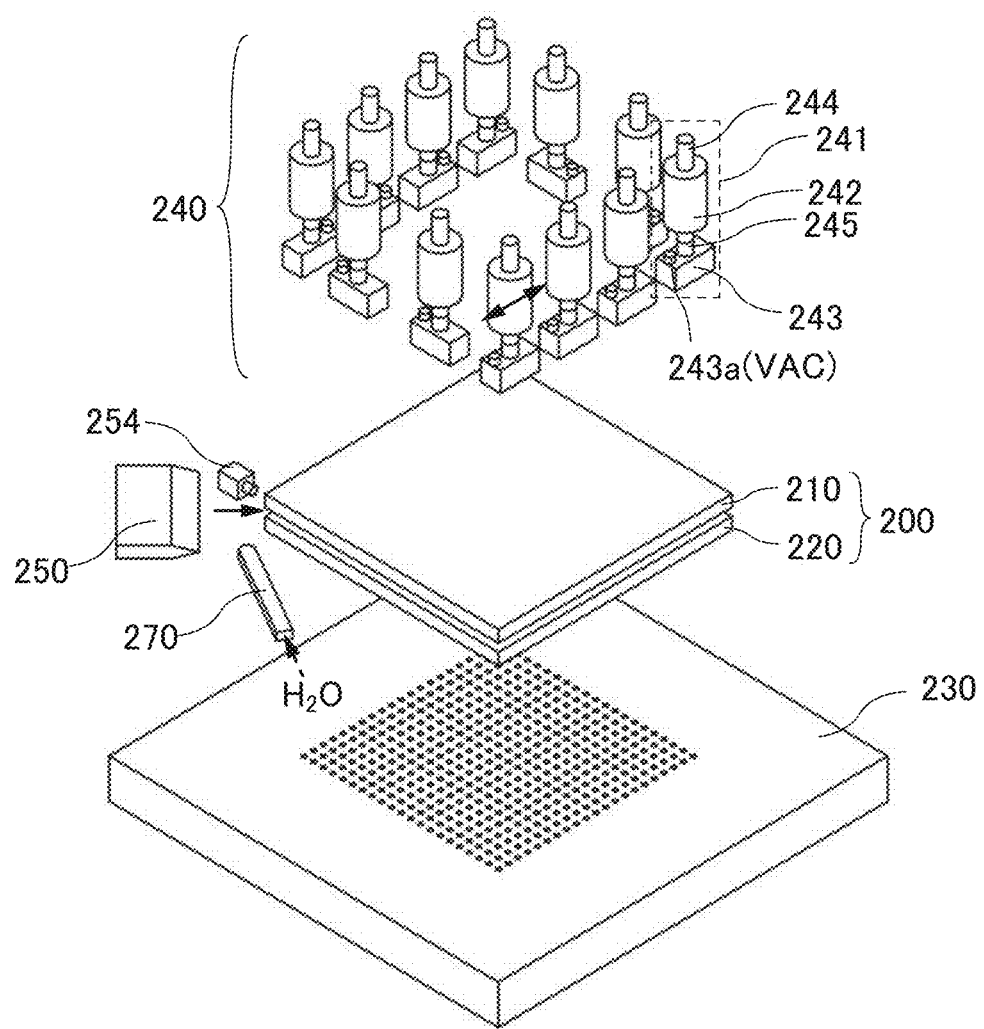
FIG. 27 illustrates an example of a peeling apparatus.

Another peeling apparatus that can be used as the stack manufacturing apparatus of one embodiment of the present invention is described. FIG. 27 is a perspective view of a peeling apparatus. The peeling apparatus includes a fixing stage 230, a suction mechanism 240, and a wedge-shaped jig 250. Note that a detail such as a power mechanism of each component is not illustrated in FIG. 27.

A process member 200 can be a member including a substrate 210, a substrate 220, and a thin component provided between the substrates. Examples of the process member 200 will be described in detail in Embodiment 4.

As the fixing stage 230 to which the process member 200 is fixed, for example, a vacuum suction stage, an electrostatic attachment stage, or the like can be used. Alternatively, the process member 200 may be fixed to the stage with a screwing jig or the like.

The suction mechanism 240 includes a plurality of suction jigs 241. The suction jigs 241 are placed to fix the vicinity of the rim of a first plane (the substrate 210 in FIG. 27) of the process member 200. The suction jigs 241 each include a vertical movement mechanism 242 and a suction portion 243. The vertical movement mechanisms 242 are included in the suction jigs 241 to independently control the vertical movements of the suction portions 243. The suction portions 243 each have an inlet 243*a* connected to a vacuum pump or the like, and perform vacuum suction of the process member 200. A movable portion 245 is provided between an axis 244 of the vertical movement mechanism 242 and the suction portion 243. The suction jig 241 includes a mechanism for movement in the horizontal direction indicated by a double-headed arrow. Thus, suction can be maintained even when the substrate 210 is deformed or its position is changed in the peeling process. Note that the movable portion 245 may be formed using a mechanical mechanism including a joint or a material with elasticity such as a rubber or a spring. Although FIG. 27 illustrates the suction mechanism 240 including the twelve suction jigs, the structure is not limited thereto. The number of suction jigs 241, the size of the suction portion 243, and the like in the suction mechanism 240 may be determined depending on the size and the physical property of the process member 200.

As the wedge-shaped jig 250, a blade jig can be used. Here, the wedge-shaped jig 250 pushes the attached substrates 210 and 220 apart by being inserted into an extremely narrow gap between the substrates 210 and 220. For this reason, it is preferable that the thickness of the pointed tip of the wedge-shaped jig 250 be smaller than the gap and the thickness of a plate-like portion of the wedge-shaped jig 250 be larger than the gap. A sensor 254 that senses an inserted position of the wedge-shaped jig 250 may be included. Note that the teen "gap" in this embodiment refers to a region in which the component is not provided between the substrate 210 and the substrate 220, and mainly refers to a region of outer edges of the substrates.

Furthermore, a nozzle 270 to which liquid is supplied is preferably provided in the vicinity of the position of the process member 200 where the wedge-shaped jig 250 is inserted. As the liquid, water can be used, for example. When water exists in a portion where the peeling is in process, peeling strength can be decreased. Moreover, electrostatic discharge damage to an electronic device or the like can be prevented. As the liquid, water, an organic solvent, a neutral solution, an alkaline solution, an acid solution, or the like can be used.

In the peeling method of one embodiment of the present invention, peeling is performed from a short side of a process member or a stack in a long side direction. Accordingly, peeling conditions such as the force for peeling can be easily controlled and the yield of the peeling can be improved. Such peeling of the process member 200 having a long side and a short side using the peeling apparatus will be described with reference to FIGS. 28A to 28C.

Figure 28A:
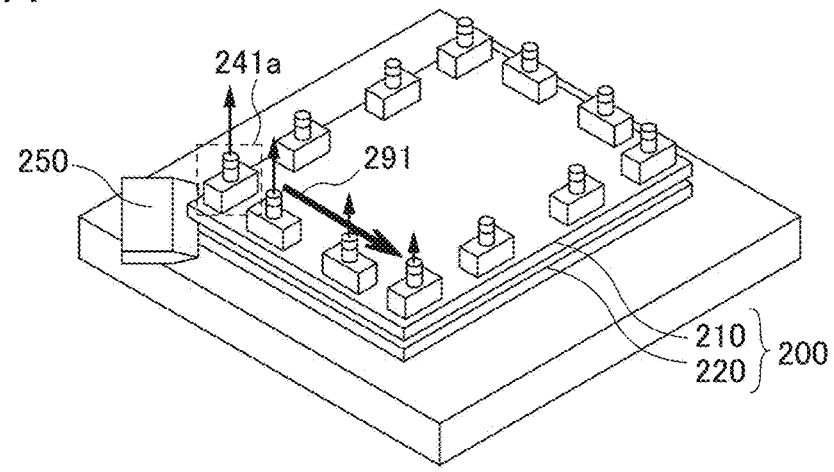
FIGS. 28A to 28C illustrate an example of a peeling apparatus.
Figure 28B:
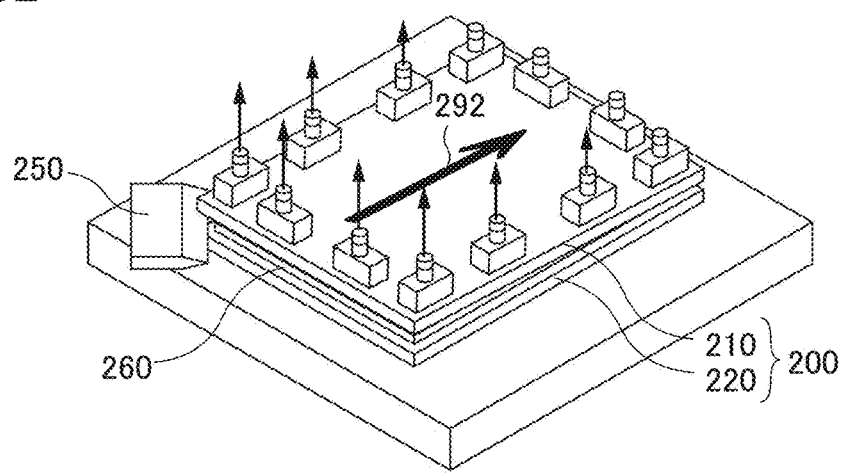
Figure 28C:
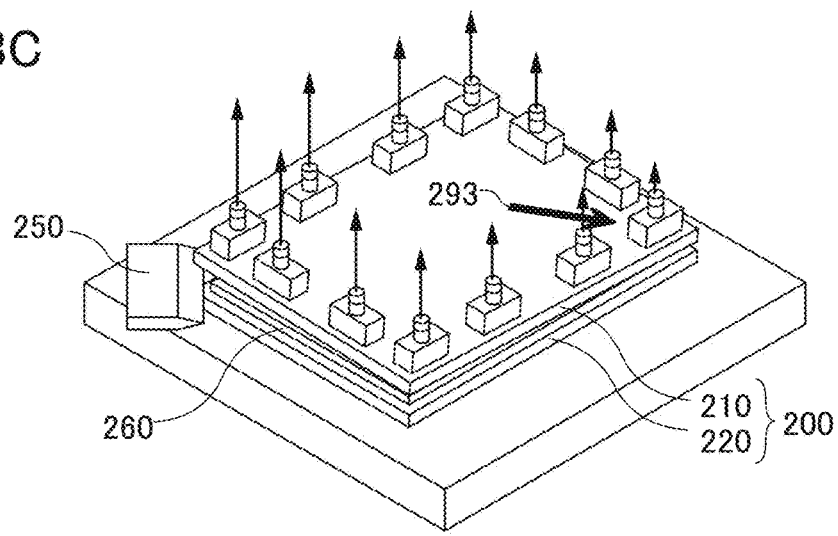

Note that some of the components illustrated in FIG. 27 are omitted in FIGS. 28A to 28C for simplicity. An arrow illustrated with each suction jig schematically illustrates the move distance in the upward direction of the suction portion 243 which is included in each suction jig, or strength required of lifting the suction portion 243 upward.

FIG. 28A illustrates a perspective view of a state in which a peeled side of the process member 200 (the substrate 220) is fixed to the fixing stage 230, the plurality of suction jigs 241 included in the suction mechanism 240 are placed on a peeling side of the process member 200 (the substrate 210), and the wedge-shaped jig 250 is inserted into a gap in the process member 200.

Here, a component provided between the substrates 210 and 220 has extremely small thickness, and thus the process member 200 has an extremely narrow gap. Given that the component is included in a light-emitting device, the gap is approximately 10 µm to 15 µm, and it is very difficult to fix the position of the wedge-shaped jig 250 and insert the wedge-shaped jig 250 into the gap. Therefore, it is preferable that the position of the gap be sensed with the use of the sensor 254 (e.g., an optical sensor, a displacement sensor, or a camera) illustrated in FIG. 27, and then the wedge-shaped jig 250 be inserted into the position.

In addition, it is preferable that a structure in which the wedge-shaped jig 250 can move in the thickness direction of the process member 200 be employed and a substrate whose end portions are chamfered be used for the process member 200. Thus, it is possible to include chamfers in an area to which the wedge-shaped jig 250 can be inserted, and the area including the chamfers on the gap side is sensed with the sensor 254.

As illustrated in FIG. 28A, when the wedge-shaped jig 250 is inserted into a gap in a corner of the process member 200 to push the attached substrates 210 and 220 apart, peeling starts in the region to be the peeling starting point that is formed in advance. At this time, water is preferably supplied to the portion where the peeling is in process as described above.

After the wedge-shaped jig 250 is inserted into the gap in the corner of the process member 200 and the peeling starts, the suction portion 243 included in the suction jig 241*a* which is closest to the corner is moved slowly. Then, the suction portions 243 included in the corresponding suction jigs are moved sequentially so that the peeling is carried on in a direction 291 indicated by an arrow in FIG. 28A; thus, one side of the process member 200 is peeled.

Next, as illustrated in FIG. 28B, the suction portions 243 included in the corresponding suction jigs are moved sequentially so that the peeling is carried on from the peeled side of the process member 200 in a direction 292 indicated by an arrow.

Then, as illustrated in FIG. 28C, the suction portions 243 included in the corresponding suction jigs are moved sequentially so that a position on the diagonal line of the corner of the process member 200 to which the wedge-shaped jig 250 is inserted becomes a peeling end point; thus, the peeling is carried on in a direction 293 indicated by an arrow.

Note that in the peeling process, the peeling rate is preferably managed. When the movement of the suction portions 243 of the suction jigs is fast and the peeling cannot follow the movement, the peeling portion is cut. For this reason, it is preferable that the angle between the substrates 210 and 220 at the time of peeling, tractive force in the movement of the suction portions 243 included in the suction jigs, and the like be managed with the use of image processing, a displacement sensor, a pull gauge, or the like to prevent the peeling rate from being excessively high.

In the above manner, a crack in the substrate, cutting of the peeling portion, and the like are less likely to occur and the peeling process of the process member 200 can be performed with a high yield.

Figure 29:
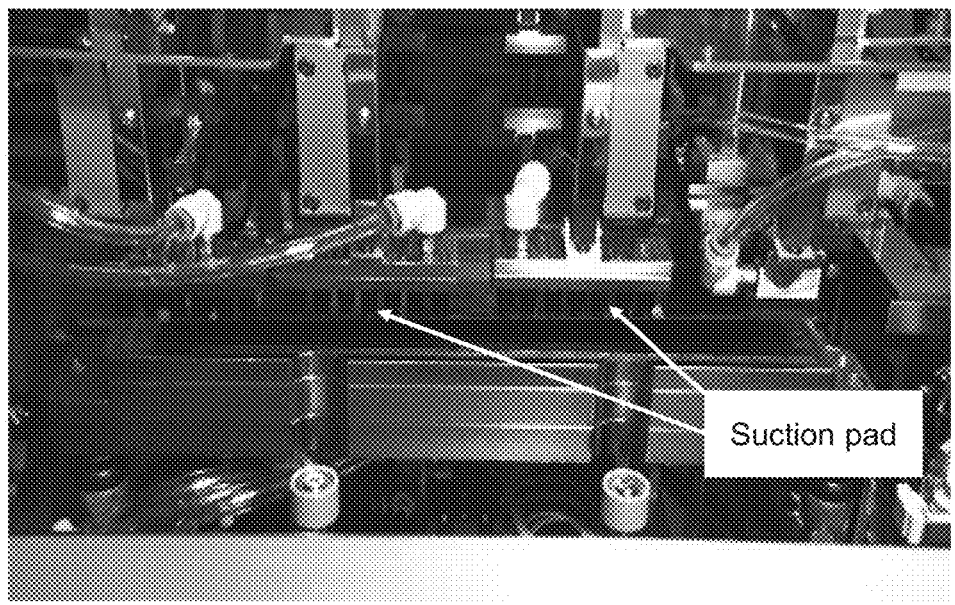
FIG. 29 is a photograph showing an example of a peeling apparatus.

FIG. 29 is a photograph of, as an example, a peeling apparatus in which a suction mechanism includes a plurality of suction pads as suction portions.

Figure 30:
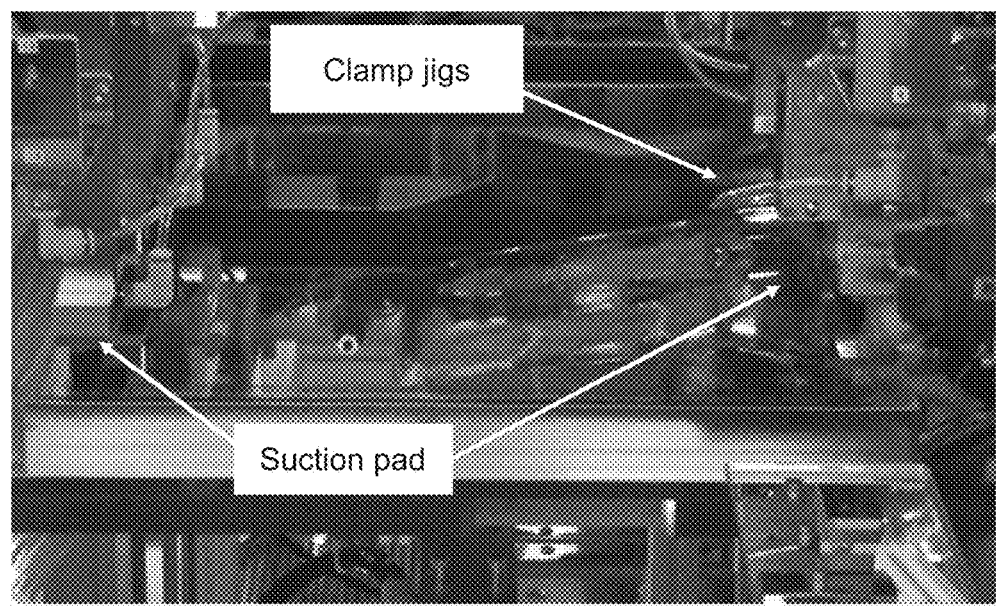
FIG. 30 is a photograph showing an example of a peeling apparatus.

FIG. 30 is a photograph of, as another example, a peeling apparatus including a fixing stage, a clamping jig, and a suction mechanism. In FIG. 30, a suction jig included in the suction mechanism has a suction pad in a suction portion.

The clamping jig clamps part of the process member 200 to fix it and allows the part to be moved in the vertical direction and the horizontal direction. The peeling can be performed only with suction jigs; however, when a flexible member is fixed only with suction jigs, the member might be warped, which makes it difficult to carry on the peeling uniformly. When the member is deformed, the suction jigs might come off or the member might be cut, for example. For this reason, it is preferred to perform stable peeling in the following manner: a member is fixed with clamping jigs in addition to suction jigs, and then the clamping jigs are pulled in the vertical and horizontal directions to make the member under tension.

This embodiment can be combined with any of the other embodiments as appropriate.

Embodiment 3

In this embodiment, a stack manufacturing apparatus of one embodiment of the present invention will be described with reference to FIG. 11, FIGS. 12A to 12E, and FIGS. 13A to 13E.

The stack manufacturing apparatus of one embodiment of the present invention includes a first supply unit configured to supply a process member having a sheet-like shape, a first separation unit configured to be supplied with the process member and divide the process member into one surface layer and a first remaining portion, a support body supply unit configured to supply a first support body and a second support body each having a sheet-like shape, a first bonding unit configured to be supplied with the first remaining portion and the first support body and bond the first remaining portion and the first support body to each other with a first bonding layer, a first unloading unit configured to unload a first stack including the first remaining portion, the first bonding layer, and the first support body, a second supply unit configured to supply the first stack, a trigger formation unit configured to be supplied with the first stack and form a peeling trigger near an end portion of the first remaining portion, a second separation unit configured to be supplied with the first stack including the peeling trigger and divide the first stack into one surface layer and a second remaining portion, a second bonding unit configured to be supplied with the second remaining portion and the second support body and bond the second remaining portion and the second support body to each other with a second bonding layer, and a second unloading unit configured to unload a second stack including the second remaining portion, the second bonding layer, and the second support body. At least one of the first separation unit and the second separation unit includes the peeling apparatus described in Embodiment 1.

The stack manufacturing apparatus having the above structure manufactures a stack using the sheet-like process member supplied to the first supply unit. The first separation unit divides the process member into the one surface layer and the first remaining portion. The first bonding unit bonds the first remaining portion and the first support body supplied from the support body supply unit to each other with the first bonding layer. Then, the first unloading unit unloads the first stack including the first remaining portion, the first bonding layer, and the first support body, and supplies the first stack to the second supply unit. The trigger formation unit forms the peeling trigger in the first stack supplied from the second supply unit. The second separation unit divides the first stack including the peeling trigger into the one surface layer and the second remaining portion. The second bonding unit bonds the second remaining portion and the second support body supplied from the support body supply unit to each other with the second bonding layer. Then, the second unloading unit unloads the second stack including the second remaining portion, the second bonding layer, and the second support body.

In the case where the first separation unit includes the peeling apparatus described in Embodiment 1, the peeling apparatus includes a structure body which can hold the first remaining portion of the process member and a stage which can hold the one surface layer of the process member. The first remaining portion is wound to separate the first remaining portion and the one surface layer of the process member between the structure body and the stage from each other.

Furthermore, the structure body may supply the first remaining portion to the first bonding unit and the first remaining portion may be peeled from the structure body so that the first remaining portion is bonded to the first support body.

In this manner, by using the stack manufacturing apparatus of one embodiment of the present invention, the first stack including the first remaining portion, the first bonding layer, and the first support body can be manufactured.

In the case where the second separation unit includes the peeling apparatus described in Embodiment 1, the peeling apparatus includes a structure body which can hold the second remaining portion of the first stack and a stage which can hold the one surface layer of the first stack. The second remaining portion is wound to separate the second remaining portion and the one surface layer of the first stack between the structure body and the stage from each other.

Furthermore, the structure body may supply the second remaining portion to the second bonding unit and the second remaining portion may be peeled from the structure body so that the second remaining portion is bonded to the second support body.

In this manner, by using the stack manufacturing apparatus of one embodiment of the present invention, the second stack including the second remaining portion, the second adhesive layer, and the second support body can be manufactured.

Figure 11:
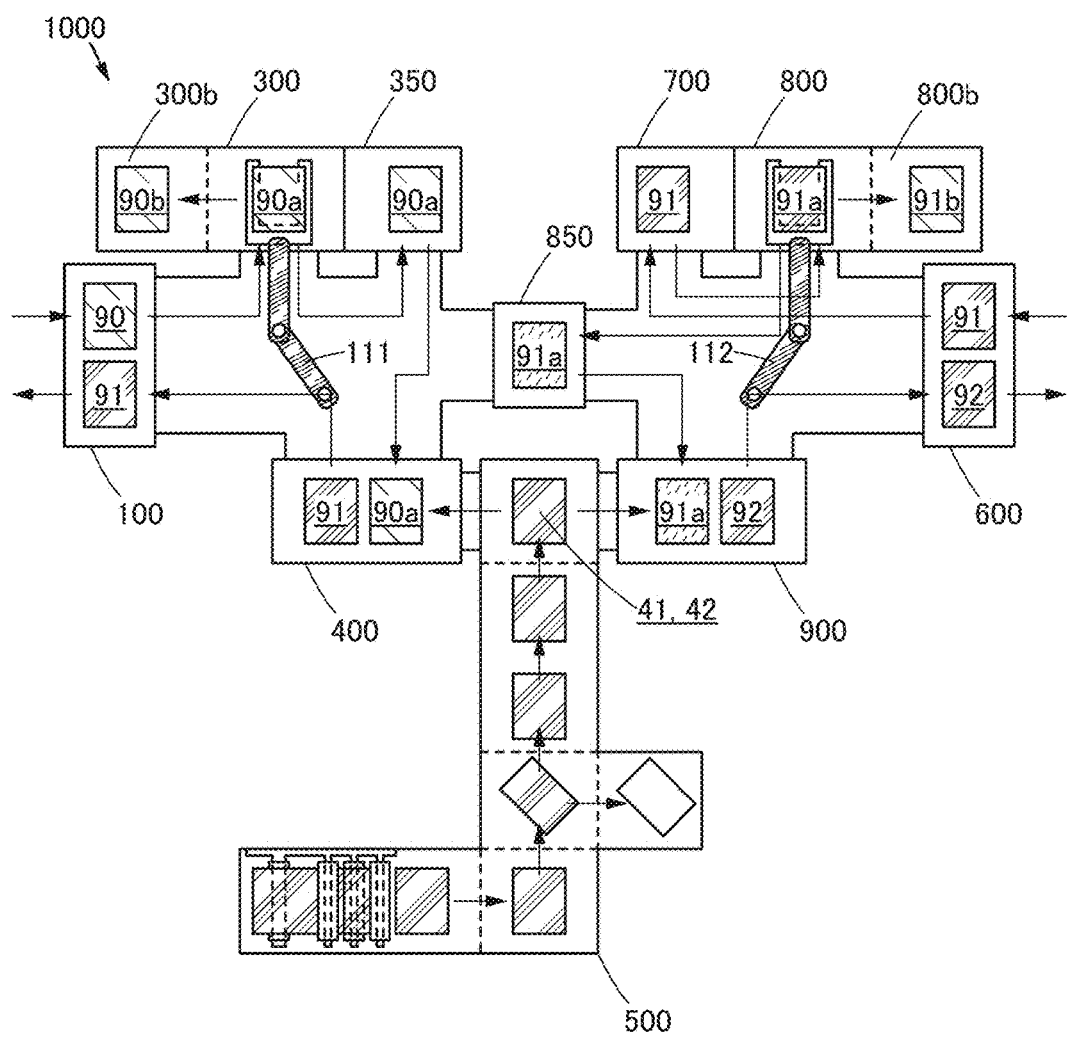
FIG. 11 illustrates a stack manufacturing apparatus.

FIG. 11 is a schematic view illustrating a structure of a stack manufacturing apparatus 1000 of one embodiment of the present invention, and a transfer path of a process member and a stack in a process.

Figure 12C:
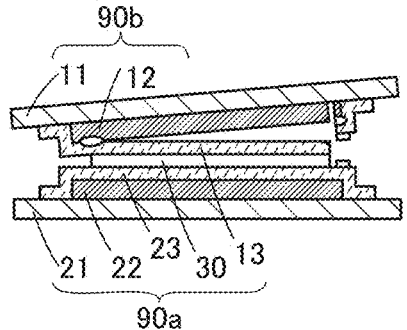
Figure 12D:
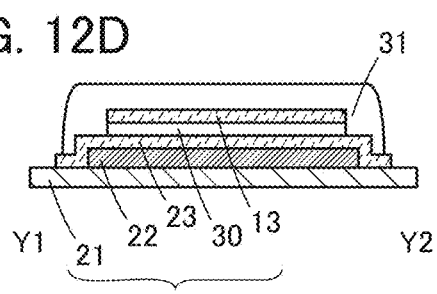
Figure 12D:
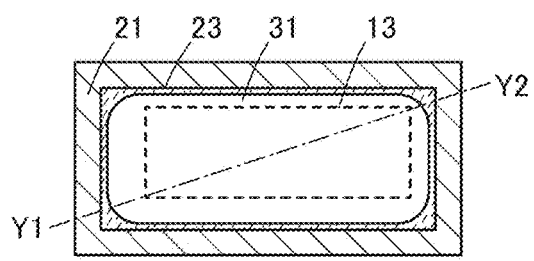
Figure 13B:
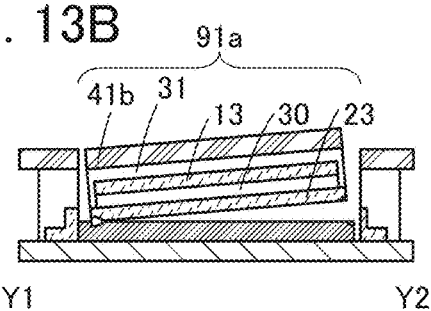
Figure 13C:
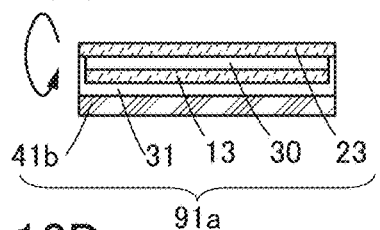

FIGS. 12A to 12E and FIGS. 13A to 13E are schematic views illustrating a process for manufacturing a stack with the use of the stack manufacturing apparatus 1000 of one embodiment of the present invention. FIGS. 12A, 12B, 12D, and 12E and FIGS. 13A, 13D, and 13E each illustrate a plan view and a cross-sectional view taken along dashed-dotted line Y1-Y2 in the plan view. FIG. 12C and FIGS. 13B and 13C each illustrate only a cross-sectional view.

The stack manufacturing apparatus 1000 described in this embodiment includes a first supply unit 100, the first separation unit 300, the first bonding unit 400, the support body supply unit 500, a second supply unit 600, a trigger formation unit 700, a second separation unit 800, and a second bonding unit 900.

Note that each unit can be named freely, and the name does not limit the function of each unit.

In this embodiment, an example in which the first separation unit 300 and the second separation unit 800 each include the peeling apparatus of one embodiment of the present invention that is described in Embodiment 1 is described. The present invention is not limited to this example, and in the stack manufacturing apparatus of one embodiment of the present invention, at least one of the first separation unit 300 and the second separation unit 800 includes the peeling apparatus of one embodiment of the present invention.

The first supply unit 100 can be supplied with a process member 90 and supply the process member 90. Note that the first supply unit 100 can also serve as a first unloading unit.

The first separation unit 300 can separate one surface layer 90b and the first remaining portion 90a of the process member 90 from each other (FIG. 11 and FIGS. 12A to 12C).

The first bonding unit 400 is supplied with the first remaining portion 90a and the first support body 41, and bonds the first support body 41 and the first remaining portion 90a to each other with a first adhesive layer 31 (FIG. 11 and FIGS. 12D and 12E).

The support body supply unit 500 supplies the first support body 41 and a second support body 42 (FIG. 11).

The first supply unit 100 also serving as the first unloading unit can be supplied with the stack 91 including the first remaining portion 90a, the first adhesive layer 31, and the first support body 41 and unload the stack 91 (FIG. 11 and FIG. 12E).

The second supply unit 600 can be supplied with the stack 91 and supply the stack 91. Note that the second supply unit 600 can also serve as a second unloading unit.

The trigger formation unit 700 forms the peeling trigger 91s near end portions of the first remaining portion 90a (FIG. 13A). Specifically, part of a second peeled layer 23 which overlaps with a second separation layer 22 and the first adhesive layer 31 is removed.

The second separation unit 800 separates one surface layer 91b and the second remaining portion 91a of the stack 91 from each other (FIGS. 13A and 13B).

Figure 13D:
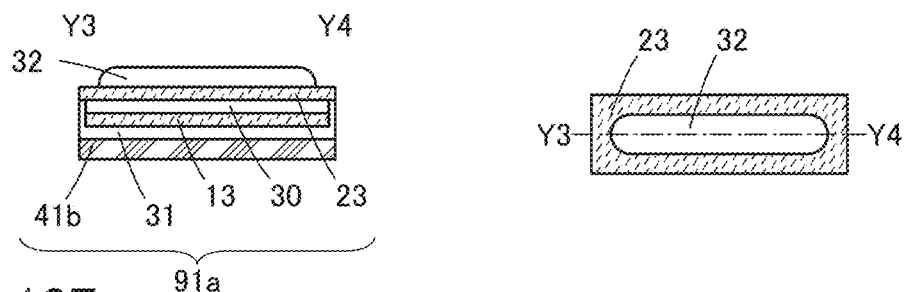
Figure 13E:
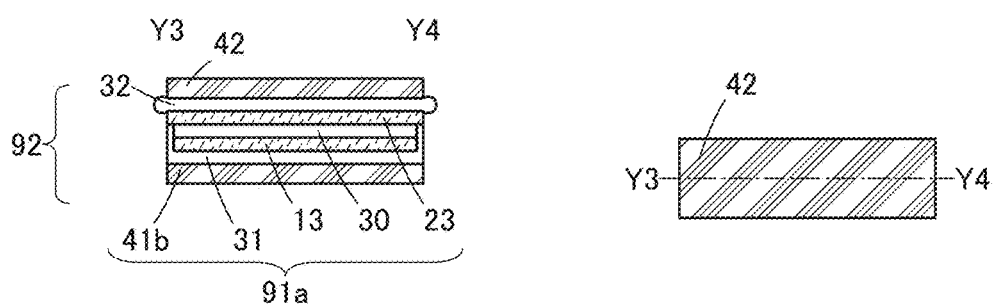

The second bonding unit 900 is supplied with the second remaining portion 91a and the second support body 42, and bonds the second support body 42 and the second remaining portion 91a to each other with a second adhesive layer 32 (FIGS. 13D and 13E).

The second supply unit 600 also serving as the second unloading unit can be supplied with a stack 92 including the second remaining portion 91a, the second adhesive layer 32, and the second support body 42 and unload the stack 92 (FIG. 11 and FIG. 13E).

The above stack manufacturing apparatus of one embodiment of the present invention includes the first supply unit 100 that supplies the process member 90 and also serves as an unloading unit for unloading the stack 91, the first separation unit 300 that separates the one surface layer 90b and the first remaining portion 90a of the process member 80 from each other, the first bonding unit 400 that bonds the first support body 41 to the first remaining portion 90a, the support body supply unit 500 that supplies the first support body 41 and the second support body 42, the second supply unit 600 that supplies the stack 91 and unloads the stack 92, the trigger formation unit 700 that forms the peeling trigger, the second separation unit 800 that separates the one surface layer 91b and the second remaining portion 91a of the stack 91 from each other, and the second bonding unit 900 that bonds the second support body 42 to the second remaining portion 91a. This structure makes it possible to peel the both surface layers of the process member 90 and bond the first support body 41 and the second support body 42 to the remaining portion. As described above, one embodiment of the present invention can provide an apparatus for manufacturing a stack including a remaining portion of a process member and a pair of support bodies.

Furthermore, the stack manufacturing apparatus 1000 in this embodiment includes the first storage portion 300b, a second storage portion 800b, the first cleaning device 350, a second cleaning device 850, the transfer mechanism 111, a transfer mechanism 112, and the like.

The first storage portion 300b stores the one surface layer 90b peeled from the process member 90.

The second storage portion 800b stores the one surface layer 91b peeled from the stack 91.

The first cleaning device 350 cleans the first remaining portion 90a peeled from the process member 90.

The second cleaning device 850 cleans the second remaining portion 91a peeled from the stack 91.

The transfer mechanism 111 transfers the process member 90, the first remaining portion 90a peeled from the process member 90, and the stack 91.

The transfer mechanism 112 transfers the stack 91, the second remaining portion 91a peeled from the stack 91, and the stack 92.

<<Stack Manufacturing Apparatus>>

Individual components of the stack manufacturing apparatus of one embodiment of the present invention will be described below.

Note that the stack manufacturing apparatus 1000 differs from the stack manufacturing apparatus 1000A described in Embodiment 2 in including the second supply unit 600, the trigger formation unit 700, the second separation unit 800, the second bonding unit 900, the second storage portion 800b, and the second cleaning device 850. In this embodiment, a structure different from that of the stack manufacturing apparatus 1000A is described, and the description in Embodiment 2 is referred to for a structure common to that of the stack manufacturing apparatus 1000.

<Second Supply Unit>

The second supply unit 600 can have a structure similar to that of the first supply unit described in Embodiment 2 except that the second supply unit 600 is supplied with the stack 91 and supplies the stack 91 (i.e., is supplied with and supplies an object different from that of the first supply unit).

Furthermore, the second supply unit 600 in this embodiment also serves as the second unloading unit. The second unloading unit can have a structure similar to that of the first unloading unit described in Embodiment 2 except that the second unloading unit is supplied with the stack 92 and unloads the stack 92 (i.e., is supplied with and unloads an object different from that of the first unloading unit).

<Trigger Formation Unit>

The trigger formation unit 700 includes a cutting mechanism which cuts the first support body 41 and the first adhesive layer 31 and separates part of the second peeled layer 23 from the second separation layer 22, for example.

Specifically, the cutting mechanism includes at least one blade which has a sharp tip and a transfer mechanism which transfers the blade relatively to the stack 91.

<Second Separation Unit>

The second separation unit 800 includes the peeling apparatus of one embodiment of the present invention that is described in Embodiment 1 as an example.

<Second Bonding Unit>

The second bonding unit 900 includes a mechanism for forming the second adhesive layer 32 and a crimp mechanism for attaching the second remaining portion 91a and the second support body 42 to each other with the use of the second adhesive layer 32.

The mechanism for forming the second adhesive layer 32 can have a structure similar to that of the first bonding unit 400 described in Embodiment 2.

Note that the second adhesive layer 32 may be formed on the second remaining portion 91a and/or the second support body 42. Specifically, the second support body 42 on which the second adhesive layer 32 is formed in advance may be used.

The crimp mechanism for attaching the second remaining portion 91a and the second support body 42 to each other can have a structure similar to that of the first bonding unit 400 described in Embodiment 2.

<Stack Manufacturing Method>

A method for manufacturing the stack 92 from the process member 90 with the use of the stack manufacturing apparatus 1000 will be described below with reference to FIG. 11, FIGS. 12A to 12E, and FIGS. 13A to 13E.

The process member 90 has the same structure as the process member 80 except that a first base includes a second substrate 21, the second separation layer 22 on the second substrate 21, and the second peeled layer 23 whose one surface is in contact with the second separation layer 22.

Specifically, the process member 90 includes the first substrate 11, the first separation layer 12 on the first substrate 11, the first peeled layer 13 whose one surface is in contact with the first separation layer 12, the bonding layer 30 whose one surface is in contact with the other surface of the first peeled layer 13, the second peeled layer 23 whose one surface is in contact with the other surface of the bonding layer 30, the second separation layer 22 whose one surface is in contact with the other surface of the second peeled layer 23, and the second substrate 21 on the second separation layer 22 (FIG. 12A). Note that in this embodiment, description is given of a case of using the process member 90 in which the peeling triggers 13s are formed in advance near end portions of the bonding layer 30 (FIG. 12B). The structure of the process member 90 is described in detail in Embodiment 4.

<First Step>

The process member 90 is loaded into the first supply unit 100. The first supply unit 100 supplies the process member 90, and the transfer mechanism 111 transfers the process member 90 and supplies the process member 90 to the first separation unit 300.

<Second Step>

The first separation unit 300 separates the one surface layer 90b of the process member 90. Specifically, from the peeling trigger 13s formed near the end portion of the bonding layer 30, the first substrate 11 and the first separation layer 12 are separated from the first peeled layer 13 (FIG. 12C).

By this step, the first remaining portion 90a is obtained from the process member 90. Specifically, the first remaining portion 90a includes the first peeled layer 13, the bonding layer 30 whose one surface is in contact with the first peeled layer 13, the second peeled layer 23 whose one surface is in contact with the other surface of the bonding layer 30, the second separation layer 22 whose one surface is in contact with the other surface of the second peeled layer 23, and the second substrate 21 on the second separation layer 22.

<Third Step>

The transfer mechanism 111 transfers the first remaining portion 90a. The first cleaning device 350 cleans the first remaining portion 90a supplied thereto.

The transfer mechanism 111 transfers the first remaining portion 90a after the cleaning and supplies the first remaining portion 90a to the first bonding unit 400. The support body supply unit 500 supplies the first support body 41 to the first bonding unit 400.

The first bonding unit 400 forms the first adhesive layer 31 over the first remaining portion 90a supplied thereto (FIG. 12D), and bonds the first remaining portion 90a and the first support body 41 to each other with the first adhesive layer 31.

By this step, the stack 91 is obtained using the first remaining portion 90a. Specifically, the stack 91 includes the first support body 41, the first adhesive layer 31, the first peeled layer 13, the bonding layer 30 whose one surface is in contact with the first peeled layer 13, the second peeled layer 23 whose one surface is in contact with the other surface of the bonding layer 30, the second separation layer 22 whose one surface is in contact with the other surface of the second peeled layer 23, and the second substrate 21 on the second separation layer 22 (FIG. 12E).

<Fourth Step>

The transfer mechanism 111 transfers the stack 91, and the stack 91 is supplied to the first supply unit 100 also serving as the first unloading unit.

After this step, the stack 91 can be unloaded. For example, when it takes time to cure the first adhesive layer 31, it is possible that the stack 91 in which the first adhesive layer 31 is not cured yet is unloaded and the first adhesive layer 31 is cured outside the stack manufacturing apparatus 1000. In that case, occupancy time of the apparatus can be reduced.

<Fifth Step>

The stack 91 is loaded into the second supply unit 600. The second supply unit 600 supplies the stack 91, and the transfer mechanism 112 transfers the stack 91 and supplies the stack 91 to the trigger formation unit 700.

<Sixth Step>

The trigger formation unit 700 forms the peeling trigger 91s by separating, from the second separation layer 22, part of the second peeled layer 23 near the end portion of the first adhesive layer 31 of the stack 91.

For example, the first support body 41 and the first adhesive layer 31 are cut from the first support body 41 side, and part of the second peeled layer 23 is separated from the second separation layer 22.

Specifically, the first adhesive layer 31 and the first support body 41 in a region which is on the second separation layer 22 and in which the second peeled layer 23 is provided are cut to draw a closed curve with a blade or the like including a sharp tip, and along the closed curve, the second peeled layer 23 is partly separated from the second separation layer 22 (FIG. 13A).

By this step, the peeling trigger 91s is formed in the cut portion near the end portions of the first support body 41b and the first adhesive layer 31.

<Seventh Step>

The second separation unit 800 separates the one surface layer 91b of the stack 91. Specifically, from the peeling trigger 91s formed near the end portion of the first adhesive layer 31, the second substrate 21 and the second separation layer 22 are separated from the second peeled layer 23 (FIG. 13B).

By this step, the second remaining portion 91a is obtained from the stack 91. Specifically, the second remaining portion 91a includes the first support body 41b, the first adhesive layer 31, the first peeled layer 13, the bonding layer 30 whose one surface is in contact with the first peeled layer 13, and the second peeled layer 23 whose one surface is in contact with the other surface of the bonding layer 30.

<Eighth Step>

The transfer mechanism 112 transfers the second remaining portion 91a, and turns the second remaining portion 91a so that the second peeled layer 23 faces upward (FIG. 13C). The second cleaning device 850 cleans the second remaining portion 91a supplied thereto.

The transfer mechanism 112 transfers the second remaining portion 91a after the cleaning and supplies the second remaining portion 91a to the second bonding unit 900. The support body supply unit 500 supplies the second support body 42 to the second bonding unit 900.

Note that the transfer mechanism 112 may supply the second remaining portion 91a from the second separation unit 800 directly to the second bonding unit 900 without supplying it to the cleaning device.

The second bonding unit 900 forms the second adhesive layer 32 on the second remaining portion 91a supplied thereto (FIG. 13D), and bonds the second remaining portion 91a and the second support body 42 to each other with the second adhesive layer 32 (FIG. 13E).

By this step, the stack 92 is obtained using the second remaining portion 91a. Specifically, the stack 92 includes the first peeled layer 13, the first adhesive layer 31, the first support body 41b, the bonding layer 30, the second peeled layer 23, and the second support body 42.

<Ninth Step>

The transfer mechanism 112 transfers the stack 92, and the stack 92 is supplied to the second supply unit 600 also serving as the second unloading unit.

After this step, the stack 92 can be unloaded.

Modification Example

A modification example of this embodiment is described with reference to FIG. 14.

Figure 14:
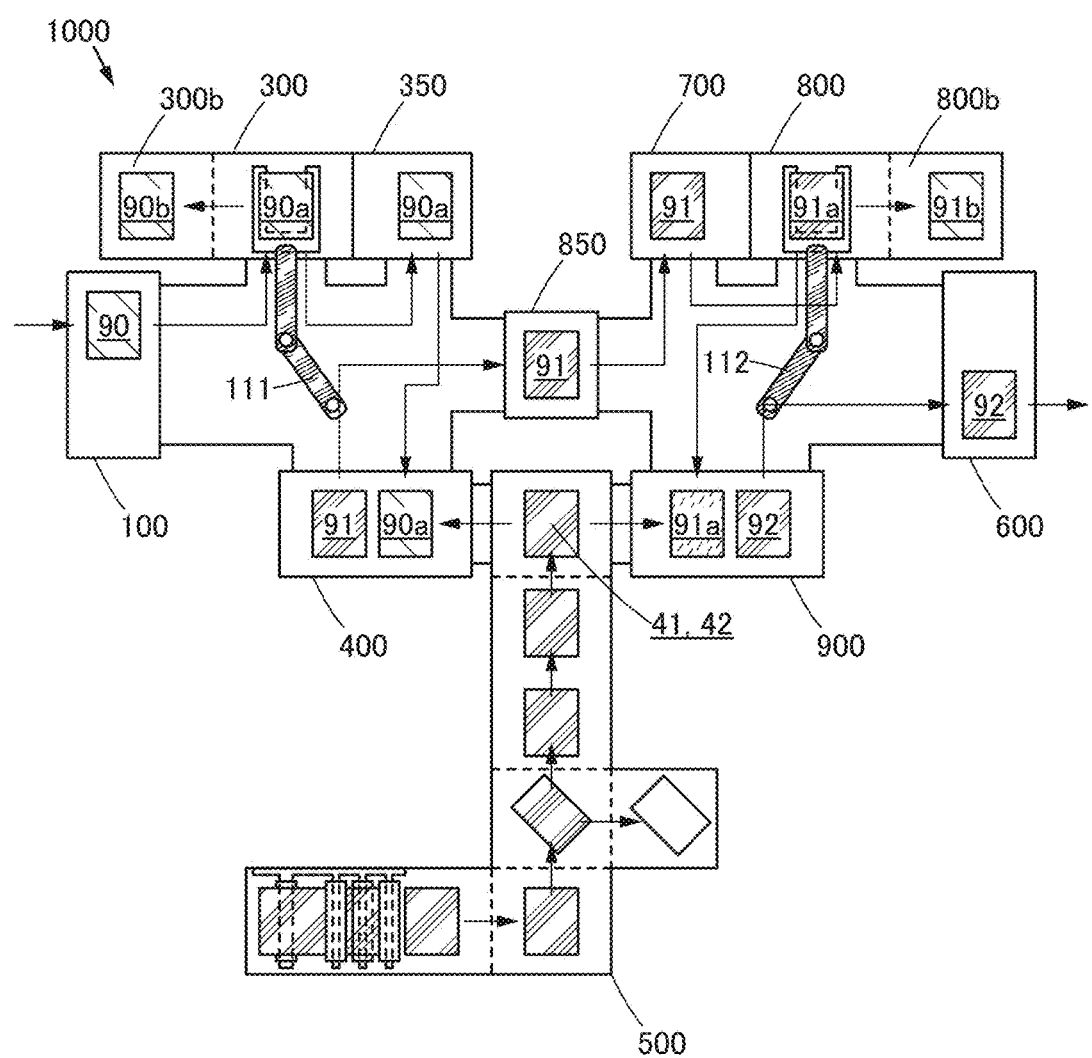
FIG. 14 illustrates a stack manufacturing apparatus.

FIG. 14 is a schematic view illustrating a structure of the stack manufacturing apparatus 1000 of one embodiment of the present invention, and a transfer path of a process member and a stack in a process.

In the modification example of this embodiment, a method for manufacturing the stack 92 from the process member 90 with the use of the stack manufacturing apparatus 1000, which is different from the above-described method, will be described with reference to FIGS. 12A to 12E, FIGS. 13A to 13E, and FIG. 14.

Specifically, the differences between the method in this modification example and the above-described method are as follows: in the fourth step, the transfer mechanism 111 transfers the stack 91 and the stack 91 is supplied not to the first supply unit 100 also serving as the first unloading unit but to the second cleaning device 850; in the fifth step, the transfer mechanism 112 transfers the stack 91 and the stack 91 is supplied to the trigger formation unit 700; and in the eighth step, the second remaining portion 91a is directly supplied to the second bonding unit 900 without being supplied to the second cleaning device 850. Thus, different portions will be described in detail below. Refer to the above description for portions where the same methods can be employed.

Modification Example of Fourth Step

The transfer mechanism 111 transfers the stack 91 and the stack 91 is supplied to the second cleaning device 850.

In the modification example of this embodiment, the second cleaning device 850 is used as a delivery chamber in which the transfer mechanism 111 delivers the stack 91 to the transfer mechanism 112 (FIG. 14).

By this step, the stack 91 can be continuously processed without being unloaded from the stack manufacturing apparatus 1000. The stack manufacturing apparatus 1000 may include a delivery chamber separately. In that case, the second remaining portion 91a can be cleaned in the second cleaning device 850 and the stack 91 can be delivered via the delivery chamber at the same time.

Modification Example of Fifth Step

The transfer mechanism 112 transfers the stack 91, and the stack 91 is supplied to the trigger formation unit 700.

Modification Example of Eighth Step

The transfer mechanism 112 transfers the second remaining portion 91a, and turns the second remaining portion 91a so that the second peeled layer 23 faces upward. The second remaining portion 91a is supplied to the second bonding unit 900.

The second bonding unit 900 forms the second adhesive layer 32 on the second remaining portion 91a supplied thereto (FIG. 12D), and bonds the second remaining portion 91a and the second support body 42 to each other with the second adhesive layer 32 (FIG. 12E).

By this step, the stack 92 is obtained using the second remaining portion 91a.

This embodiment can be combined with any of the other embodiments as appropriate.

Embodiment 4

In this embodiment, a process member which can be used in the stack manufacturing apparatus of one embodiment of the present invention will be described with reference to FIGS. 15A and 15B.

Figure 15A:
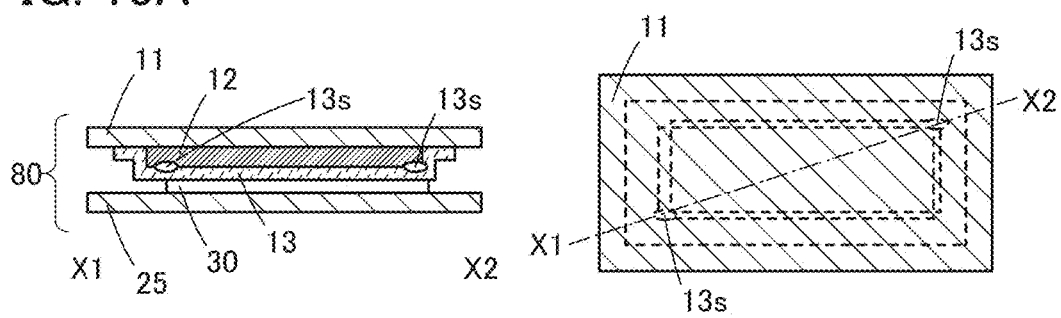
FIGS. 15A and 15B each illustrate a stack manufacturing process.
Figure 15B:
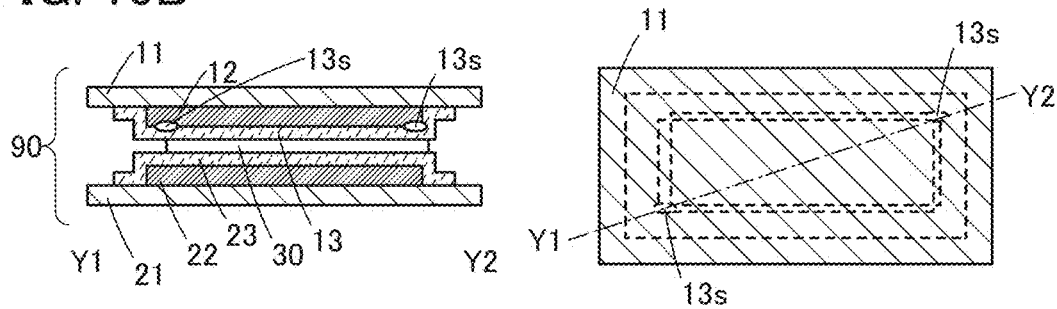

FIGS. 15A and 15B are schematic views illustrating structures of process members that can be used to form a stack with the use of the stack manufacturing apparatus of one embodiment of the present invention.

FIG. 15A illustrates a plan view of a structure of the process member 80 and a cross-sectional view taken along dashed-dotted line X1-X2 in the plan view.

FIG. 15B illustrates a plan view of a structure of the process member 90 and a cross-sectional view taken along dashed-dotted line Y1-Y2 in the plan view.

Example 1 of Process Member

The process member 80 illustrated in FIG. 15A includes the first substrate 11, the first separation layer 12 on the first substrate 11, the first peeled layer 13 whose one surface is in contact with the first separation layer 12, the bonding layer 30 whose one surface is in contact with the other surface of the first peeled layer 13, the base 25 in contact with the other surface of the bonding layer 30.

Note that the peeling triggers 13s may be provided near the end portions of the bonding layer 30.

There is no particular limitation on the first substrate 11 as long as the first substrate 11 has heat resistance high enough to withstand a manufacturing process and a thickness and a size which can be used in a manufacturing apparatus.

Examples of materials that can be used for the first substrate 11 include glass, quartz, sapphire, ceramics, metal, an inorganic material, and a resin.

Specific examples of glass include non-alkali glass, soda-lime glass, potash glass, crystal glass, and the like. Examples of metals include SUS, aluminum, and the like.

The structure of the first substrate 11 is not limited to a single-layer structure and may be a stacked-layer structure. For example, a base and an insulating layer which prevents impurity diffusion from the base may be stacked. Specifically, a stack including glass and any of a variety of base layers which prevent impurity diffusion from glass, such as a silicon oxide layer, a silicon nitride layer, a silicon nitride oxide layer, or a silicon oxynitride layer, can be used.

There is no particular limitation on the first separation layer 12 as long as the first separation layer 12 can be used to separate the first peeled layer 13 formed thereon and has heat resistance high enough to withstand the manufacturing process.

Examples of materials that can be used for the first separation layer 12 include an inorganic material, an organic material, and the like.

Specific examples of the inorganic material include a metal, an alloy, a compound, and the like that contain any of the following elements: tungsten, molybdenum, titanium, tantalum, niobium, nickel, cobalt, zirconium, zinc, ruthenium, rhodium, palladium, osmium, iridium, and silicon. A crystal structure of a layer containing silicon may be amorphous, microcrystal, or polycrystal.

Specific examples of the organic material include polyimide, polyester, polyolefin, polyamide, polycarbonate, an acrylic resin, and the like.

The first separation layer 12 may have a single-layer structure or a stacked-layer structure.

In the case where the first separation layer 12 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum is, for example, an alloy of tungsten and molybdenum.

In the case where the first separation layer 12 has a stacked-layer structure, a stacked-layer structure including a layer containing tungsten and a layer containing an oxide of tungsten can be employed.

The layer containing an oxide of tungsten may be formed by stacking another layer with a layer containing tungsten; for example, the layer containing an oxide of tungsten may be formed by stacking a film containing oxygen, such as a silicon oxide film or a silicon oxynitride film, over a layer containing tungsten.

The layer containing an oxide of tungsten may be formed by performing thermal oxidation treatment, oxygen plasma treatment, nitrous oxide ($N_2O$) plasma treatment, treatment with a solution having strong oxidizing power (e.g., ozone water), or the like on a surface of a layer containing tungsten.

The first separation layer 12 can be formed by a sputtering method, a plasma CVD method, a coating method, a printing method, or the like. Note that the coating method includes a spin coating method, a droplet discharge method, and a dispensing method.

There is no particular limitation on the first peeled layer 13 as long as the first peeled layer 13 can be separated from the first separation layer 12 and has heat resistance high enough to withstand the manufacturing process.

Examples of materials that can be used for the first peeled layer 13 include an inorganic material, an organic resin, and the like.

The first peeled layer 13 may have a single-layer structure or a stacked-layer structure. For example, a structure may be employed in which a functional layer that overlaps with the first separation layer 12 and an insulating layer that is provided between the first separation layer 12 and the functional layer to prevent diffusion of impurities which impair the characteristics of the functional layer are stacked. Specifically, a structure can be employed in which a silicon oxynitride layer, a silicon nitride layer, and the functional layer are stacked in this order over the first separation layer 12.

The functional layer that can be used for the first peeled layer 13 includes at least one of a functional circuit, a functional element, an optical element, a functional film, and the like, for example. Specifically, a structure can be employed which includes at least one of a pixel circuit of a display device, a pixel driver circuit, a display element, a color filter, a moisture-proof film, and the like.

There is no particular limitation on the bonding layer 30 as long as the bonding layer 30 bonds the first peeled layer 13 and the base 25 to each other.

Examples of materials that can be used for the bonding layer 30 include an inorganic material, an organic resin, and the like.

Specifically, a glass layer with a melting point of 400° C. or lower, preferably 300° C. or lower, an adhesive, or the like can be used.

Examples of the adhesive that can be used for the bonding layer 30 include a light curable adhesive such as a UV curable adhesive, a reactive curable adhesive, a heat curable adhesive, and an anaerobic adhesive.

Examples of such adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin.

There is no particular limitation on the base 25 as long as the base 25 has heat resistance high enough to withstand a manufacturing process and a thickness and a size which can be used in a manufacturing apparatus.

A material used for the base 25 can be similar to that used for the first substrate 11, for example.

In the process member 80, the peeling triggers 13s may be provided near the end portions of the bonding layer 30. In the case where the end portions of the bonding layer do not overlap with the separation layer, peeling triggers may be provided near end portions of the separation layer.

The peeling triggers 13s are formed by separating part of the first peeled layer 13 from the first separation layer 12.

The peeling triggers 13s can be formed by inserting a sharp tip into the first peeled layer 13; alternatively, the peeling triggers 13s can be formed by separating part of the first peeled layer 13 from the first separation layer 12 by a noncontact method using a laser or the like (e.g., a laser ablation method). Note that the peeling triggers 13s correspond to opening portions (also referred to as grooves) provided at least in the first separation layer and between the first peeled layer 13 and the first separation layer 12.

Example 2 of Process Member

The process member 90 illustrated in FIG. 15B includes the second substrate 21, the second separation layer 22 on the second substrate 21, and the second peeled layer 23 whose other surface is in contact with the second separation layer 22 instead of the base 25 of the process member 80, and differs in that one surface of the second peeled layer 23 is in contact with the other surface of the bonding layer 30. Thus, different portions will be described in detail below. Refer to the above description for similar components.

As the second substrate 21, the same substrate as the first substrate 11 can be used. Note that the second substrate 21 and the first substrate 11 do not need to have the same structure.

As the second separation layer 22, the same layer as the first separation layer 12 can be used. Note that the second separation layer 22 and the first separation layer 12 do not need to have the same structure.

As the second peeled layer 23, the same layer as the first peeled layer 13 can be used. Alternatively, the second peeled layer 23 can have a structure different from that of the first peeled layer 13.

For example, a structure may be employed in which the first peeled layer 13 includes a functional circuit and the second peeled layer 23 includes a functional layer that prevents diffusion of impurities into the functional circuit.

Specifically, a structure may be employed in which the first peeled layer 13 includes a pixel circuit of a display device, a driver circuit of the pixel circuit, and a light-emitting element that is connected to the pixel circuit and emits light toward the second peeled layer 23, and the second peeled layer 23 includes a color filter and a moisture-proof film.

<Planar Shapes of Separation Layer>

There is no particular limitation on the planar shape of the separation layer used in one embodiment of the present invention. It is preferable that at a peeling process, force of separating the peeled layer and the separation layer be concentrated at the peeling starting point; therefore, it is preferable to form the peeling starting point in the vicinity of the corner portion compared to the center portion or the side portion of the separation layer.

Figure 8C:
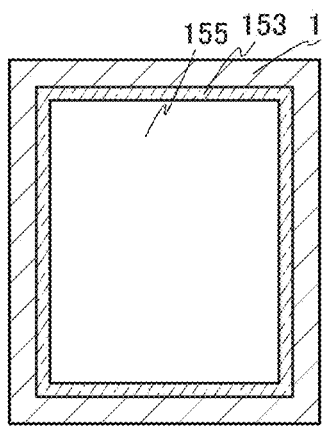
Figure 8D:
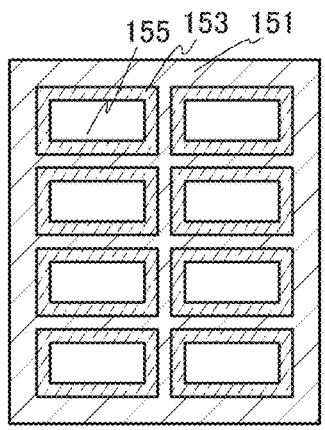
Figure 8E:
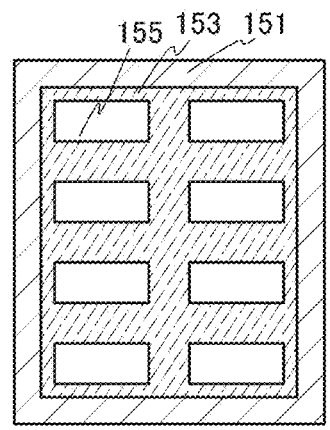

An end portion of a region that can be peeled and transferred is on an inner side than the end portion of a separation layer. As illustrated in FIG. 8C, a peeled layer 155 is formed over a formation substrate 151 so that an end portion of the peeled layer 155 is positioned on an inner side than the end portion of a separation layer 153. In the case where there are a plurality of peeled layers 155, the separation layer 153 may be provided in each peeled layer 155 as illustrated in FIG. 8D or a plurality of peeled layers 155 may be provided over one separation layer 153 as illustrated in FIG. 8E.

This embodiment can be combined with any of the other embodiments as appropriate.

Embodiment 5

In this embodiment, examples of flexible light-emitting devices which can be manufactured using the peeling apparatus of one embodiment of the present invention or the stack manufacturing apparatus of one embodiment of the present invention will be described.

Specific Example 1

Figure 16A:
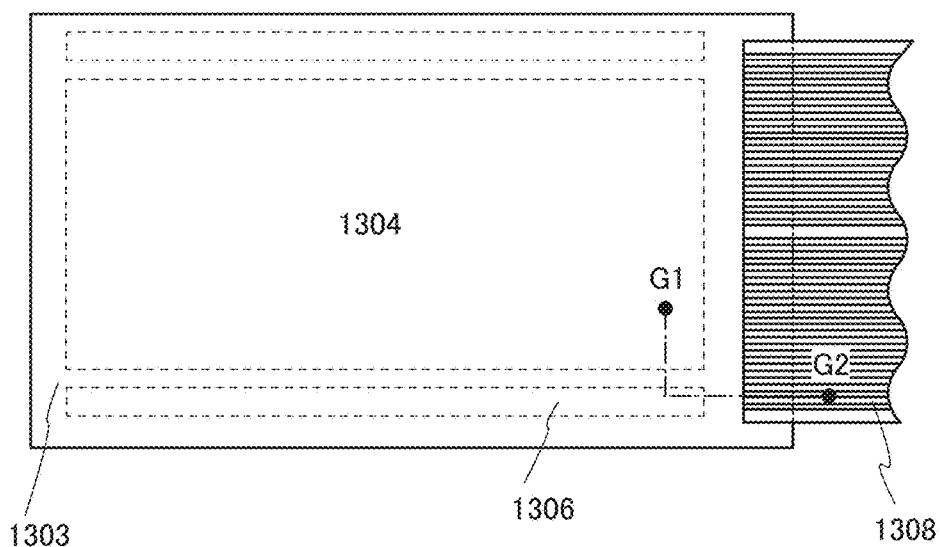
FIGS. 16A and 16B illustrate an example of a light-emitting device.
Figure 16B:
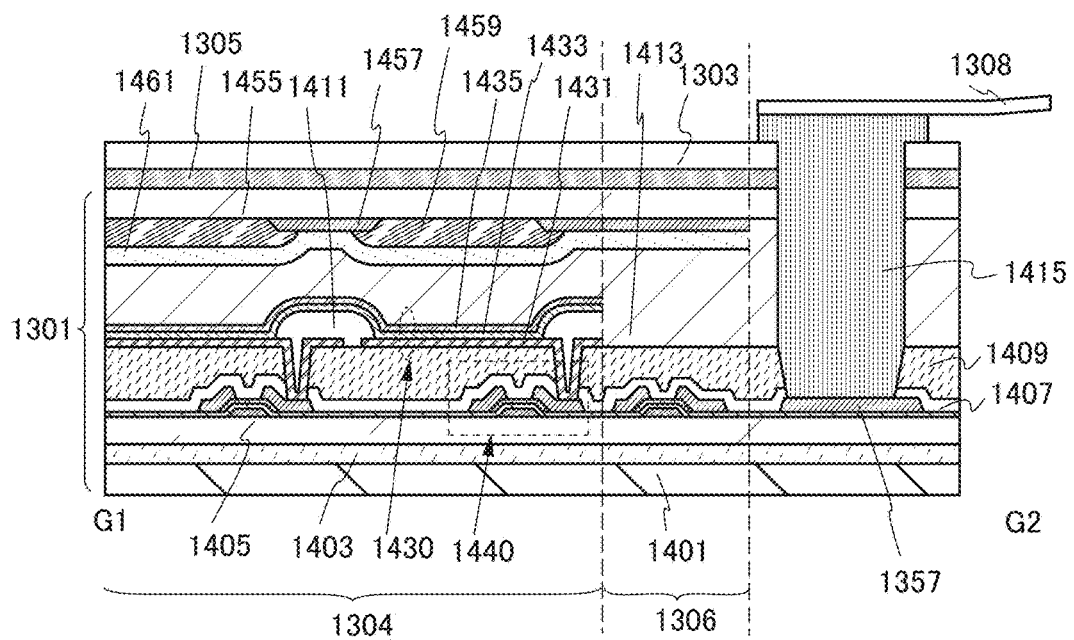
Figure 17A:
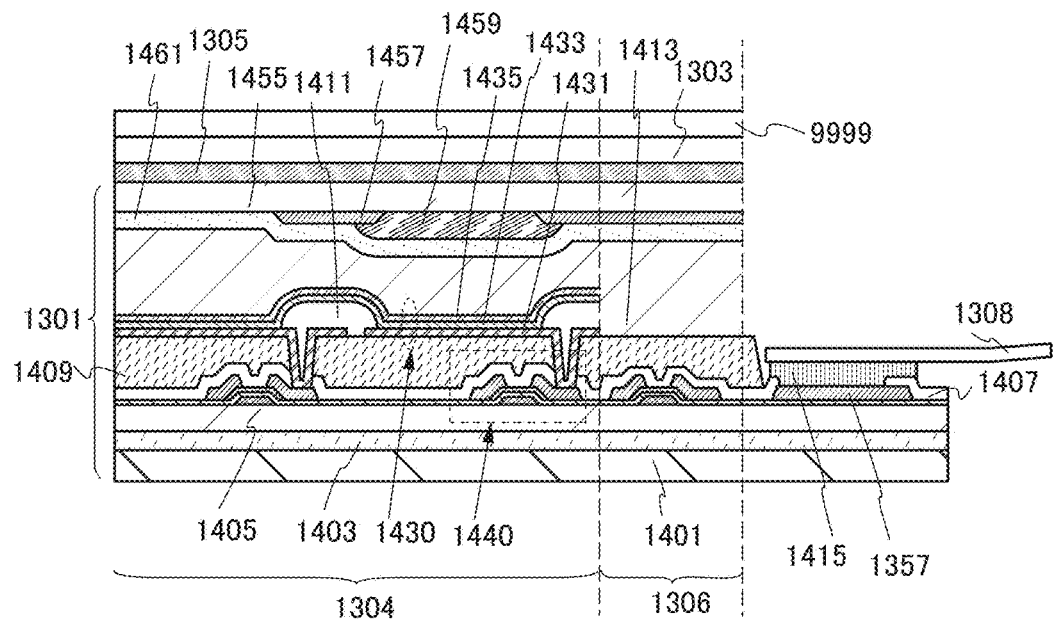
FIGS. 17A and 17B each illustrate an example of a light-emitting device.
Figure 17B:
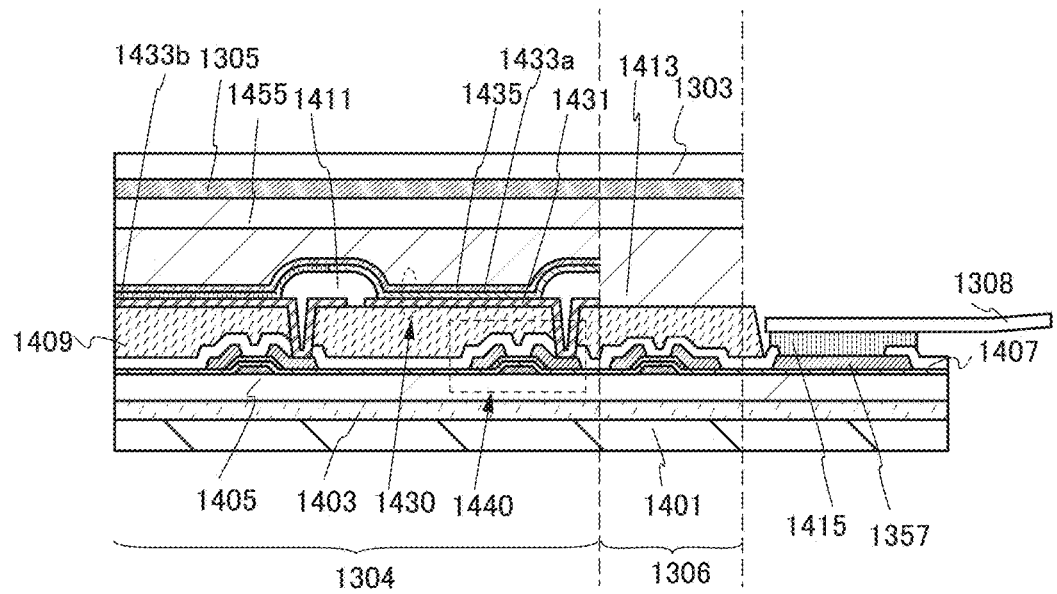

FIG. 16A is a plan view of a flexible light-emitting device, and FIG. 16B is an example of a cross-sectional view taken along dashed-dotted line G1-G2 in FIG. 16A. FIGS. 17A and 17B are each a cross-sectional view illustrating a flexible light-emitting device, which is a modification example.

The light-emitting device illustrated in FIG. 16B, FIG. 17A, or FIG. 17B includes an element layer 1301, an adhesive layer 1305, and a substrate 1303. The element layer 1301 includes a substrate 1401, an adhesive layer 1403, an insulating layer 1405, a plurality of transistors, a conductive layer 1357, an insulating layer 1407, an insulating layer 1409, a plurality of light-emitting elements, an insulating layer 1411, a sealing layer 1413, and an insulating layer 1455.

In FIG. 16B, coloring layers 1459 are provided so as to overlap with their respective light-emitting elements. The coloring layer 1459 is provided to overlap with a light-emitting element 1430, and a light-blocking layer 1457 is provided to overlap with the insulating layer 1411. The coloring layer 1459 and the light-blocking layer 1457 are covered with an insulating layer 1461. The space between the light-emitting element 1430 and the insulating layer 1461 is filled with the sealing layer 1413.

In FIG. 17A, the coloring layers 1459 are provided so as to overlap with some light-emitting elements. In FIG. 17B, the coloring layers 1459 are not provided. The light-emitting element 1430 which does not overlap with the coloring layer 1459 may be provided as illustrated in FIGS. 17A and 17B. For example, in the case where one pixel includes four sub-pixels which are red, blue, green, and white sub-pixels, the coloring layer 1459 does not need to be provided in the white sub-pixel. Accordingly, the amount of light absorbed by the coloring layer can be reduced, and thus, the power consumption of the light-emitting device can be reduced. As illustrated in FIG. 17B, with the use of different materials for an EL layer 1433a and an EL layer 1433b, light-emitting elements exhibiting different colors may be manufactured in pixels.

The conductive layer 1357 is electrically connected to an FPC 1308 through a connector 1415. In the case where the conductive layer 1357 is provided between the substrates 1401 and 1303 as illustrated in FIG. 16B, the connector 1415 may be provided in an opening formed in the substrate 1303, the adhesive layer 1305, and the like. In the case where the substrate 1303 and the conductive layer 1357 do not overlap with each other as illustrated in FIGS. 17A and 17B, the connector 1415 may be provided in an opening formed in the insulating layers 1407 and 1409 over the substrate 1401.

The light-emitting element 1430 includes a lower electrode 1431, an EL layer 1433, and an upper electrode 1435. The lower electrode 1431 is electrically connected to a source electrode or a drain electrode of a transistor 1440. An end portion of the lower electrode 1431 is covered with the insulating layer 1411. The light-emitting element 1430 has a top emission structure. The upper electrode 1435 has a light-transmitting property and transmits light emitted from the EL layer 1433.

The light-emitting device includes a plurality of transistors in a light extraction portion 1304 and a driver circuit portion 1306. The transistor 1440 is provided over the insulating layer 1405. The insulating layer 1405 and the substrate 1401 are bonded to each other with the adhesive layer 1403. The insulating layer 1455 and the substrate 1303 are bonded to each other with the adhesive layer 1305. It is preferable to use insulating films having a high gas barrier property for the insulating layer 1405 and the insulating layer 1455, in which case an impurity such as moisture or oxygen can be prevented from entering the light-emitting element 1430 or the transistor 1440, leading to improved reliability of the light-emitting device.

The light-emitting device in Specific Example 1 can be manufactured in the following manner: the insulating layer 1405, the transistor 1440, and the light-emitting element 1430 are formed over a formation substrate with high heat resistance; the formation substrate is separated; and the insulating layer 1405, the transistor 1440, and the light-emitting element 1430 are transferred to the substrate 1401 and bonded thereto with the adhesive layer 1403. The light-emitting device in Specific Example 1 can be manufactured in the following manner: the insulating layer 1455, the coloring layer 1459, and the light-blocking layer 1457 are formed over a formation substrate with high heat resistance; the formation substrate is separated; and the insulating layer 1455, the coloring layer 1459, and the light-blocking layer 1457 are transferred to the substrate 1303 and bonded thereto with the adhesive layer 1305.

In the case where a material with high moisture permeability and low heat resistance (e.g., resin) is used for a substrate, it is not allowed to expose the substrate to high temperatures in the manufacturing process. Thus, there is a limitation on conditions for forming a transistor and an insulating film over the substrate. In a manufacturing method employing the device of one embodiment of the present invention, a transistor and the like can be formed over a formation substrate having high heat resistance; thus, a highly reliable transistor and an insulating film having a sufficiently high gas barrier property can be formed. Then, the transistor and the insulating film are transferred to the substrate 1303 or the substrate 1401, whereby a highly reliable light-emitting device can be manufactured. Thus, with one embodiment of the present invention, a thin and/or lightweight light-emitting device with high reliability can be provided. Details of the manufacturing method will be described later.

The substrate 1303 and the substrate 1401 are each preferably formed using a material with high toughness. In that case, a display device with high impact resistance that is less likely to be broken can be provided. For example, when the substrate 1303 is an organic resin substrate and the substrate 1401 is a substrate of a thin metal material or a thin alloy material, the light-emitting device can be lightweight and unlikely to be broken as compared with the case where a glass substrate is used.

A metal material and an alloy material, which have high thermal conductivity, are preferred because they can easily conduct heat to the whole substrate and accordingly can prevent a local temperature rise in the light-emitting device. The thickness of a substrate using a metal material or an alloy material is preferably greater than or equal to 10 μm and less than or equal to 200 μm, further preferably greater than or equal to 20 μm and less than or equal to 50 μm.

Furthermore, when a material with high thermal emissivity is used for the substrate 1401, the surface temperature of the light-emitting device can be prevented from rising, leading to prevention of breakage or a decrease in reliability of the light-emitting device. For example, the substrate 1401 may have a stacked structure of a metal substrate and a layer with high thermal emissivity (the layer can be formed using a metal oxide or a ceramic material, for example).

Note that the light-emitting device of this embodiment may be provided with a touch sensor or a touch panel. For example, FIG. 17A illustrates the case where a touch panel 9999 is provided. A touch sensor may be directly formed on the substrate 1303; alternatively, the touch panel 9999 formed on another substrate may be placed over the substrate 1303.

Specific Example 2

Figure 18A:
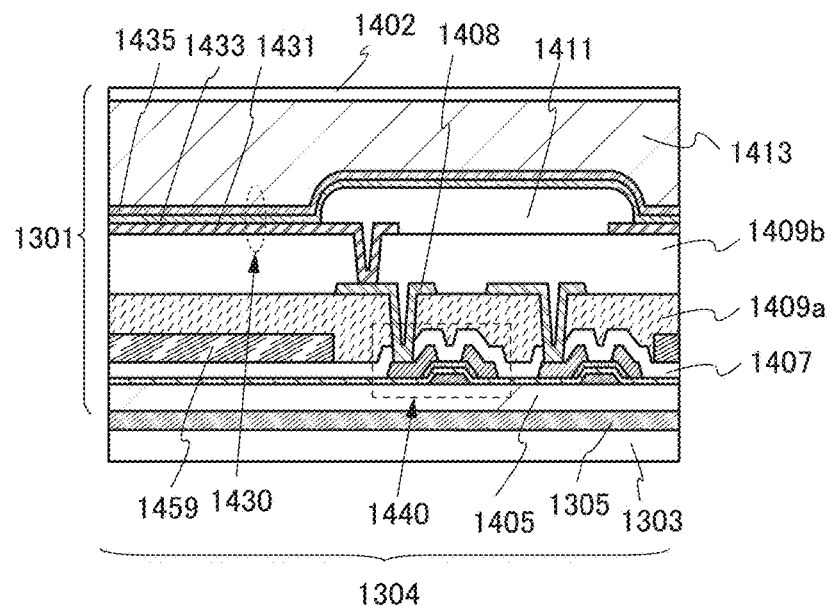
FIGS. 18A and 18B each illustrate an example of a light-emitting device.

FIG. 18A illustrates another example of the light extraction portion 1304 in the light-emitting device.

The light extraction portion 1304 illustrated in FIG. 18A includes the substrate 1303, the adhesive layer 1305, a substrate 1402, the insulating layer 1405, a plurality of transistors, the insulating layer 1407, a conductive layer 1408, an insulating layer 1409a, an insulating layer 1409b, a plurality of light-emitting elements, the insulating layer 1411, the sealing layer 1413, and the coloring layer 1459.

The light-emitting element 1430 includes the lower electrode 1431, the EL layer 1433, and the upper electrode 1435. The lower electrode 1431 is electrically connected to the source electrode or the drain electrode of the transistor 1440 through the conductive layer 1408. An end portion of the lower electrode 1431 is covered with the insulating layer 1411. The light-emitting element 1430 has a bottom emission structure. The lower electrode 1431 has a light-transmitting property and transmits light emitted from the EL layer 1433.

The coloring layer 1459 is provided to overlap with the light-emitting element 1430, and light emitted from the light-emitting element 1430 is extracted from the substrate 1303 side through the coloring layer 1459. The space between the light-emitting element 1430 and the substrate 1402 is filled with the sealing layer 1413. The substrate 1402 can be formed using a material similar to that of the substrate 1401.

Specific Example 3

Figure 18B:
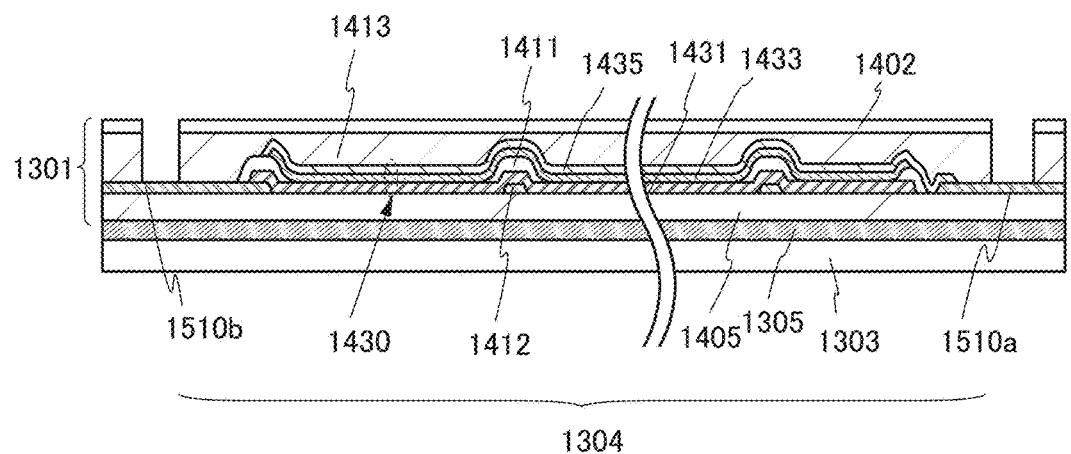

FIG. 18B illustrates another example of a light-emitting device.

The light-emitting device illustrated in FIG. 18B includes the element layer 1301, the adhesive layer 1305, and the substrate 1303. The element layer 1301 includes the substrate 1402, the insulating layer 1405, a conductive layer 1510a, a conductive layer 1510b, a plurality of light-emitting elements, the insulating layer 1411, a conductive layer 1412, and the sealing layer 1413.

The conductive layer 1510a and the conductive layer 1510b, which are external connection electrodes of the light-emitting device, can each be electrically connected to an FPC or the like.

The light-emitting element 1430 includes the lower electrode 1431, the EL layer 1433, and the upper electrode 1435. An end portion of the lower electrode 1431 is covered with the insulating layer 1411. The light-emitting element 1430 has a bottom emission structure. The lower electrode 1431 has a light-transmitting property and transmits light emitted from the EL layer 1433. The conductive layer 1412 is electrically connected to the lower electrode 1431.

The substrate 1303 may have, as a light extraction structure, a hemispherical lens, a micro lens array, a film provided with an uneven surface structure, a light diffusing film, or the like. For example, the light extraction structure can be formed by bonding the above lens or film to a resin substrate with an adhesive or the like having substantially the same refractive index as the substrate or the lens or film.

The conductive layer 1412 is preferably, though not necessarily, provided because voltage drop due to the resistance of the lower electrode 1431 can be prevented. In addition, for a similar purpose, a conductive layer electrically connected to the upper electrode 1435 may be provided over the insulating layer 1411.

The conductive layer 1412 can be a single layer or a stacked layer formed using a material selected from copper, titanium, tantalum, tungsten, molybdenum, chromium, neodymium, scandium, nickel, or aluminum or an alloy material containing any of these materials as its main component. The thickness of the conductive layer 1412 can be greater than or equal to 0.1 μm and less than or equal to 3 μm, preferably greater than or equal to 0.1 μm and less than or equal to 0.5 μm.

When a paste (e.g., silver paste) is used as a material for the conductive layer (also referred to as an auxiliary wiring or an auxiliary electrode) electrically connected to the upper electrode 1435, metal particles forming the conductive layer aggregate; therefore, the surface of the conductive layer is rough and has many gaps. Thus, it is difficult for the EL layer 1433 to completely cover the conductive layer; accordingly, the upper electrode and the auxiliary wiring are electrically connected to each other easily, which is preferable.

Examples of Materials

Next, materials and the like that can be used for a light-emitting device are described. Note that description on the components already described in this embodiment is omitted.

The element layer 1301 includes at least a light-emitting element. As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The element layer 1301 may further include a transistor for driving the light-emitting element, a touch sensor, or the like.

There is no particular limitation on the structure of the transistors in the light-emitting device. For example, a forward staggered transistor or an inverted staggered transistor may be used. A top-gate transistor or a bottom-gate transistor may be used. A semiconductor material used for the transistors is not particularly limited, and for example, silicon, germanium, or an oxide semiconductor can be used.

There is no particular limitation on the state of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is particularly preferable that a semiconductor having crystallinity be used, in which case deterioration of the transistor characteristics can be suppressed.

Here, a polycrystalline semiconductor is preferably used for the transistor. For example, polycrystalline silicon or the like is preferably used. Polycrystalline silicon can be formed at a lower temperature than single crystal silicon and has higher field effect mobility and higher reliability than amorphous silicon. When such a polycrystalline semiconductor is used for a pixel, the aperture ratio of the pixel can be improved. Even in the case where pixels are provided at extremely high resolution, a gate driver circuit and a source driver circuit can be formed over a substrate over which the pixels are formed, and the number of components of an electronic device can be reduced.

Alternatively, an oxide semiconductor is preferably used for the transistor. For example, an oxide semiconductor having a wider band gap than silicon is preferably used. A semiconductor material having a wider band gap and a lower carrier density than silicon is preferably used because off-state current of the transistor can be reduced.

The oxide semiconductor preferably contains at least indium (In) or zinc (Zn), for example. More preferably, the oxide semiconductor contains an oxide represented by an In-M-Zn-based oxide (M is a metal such as Al, Ti, Ga, Ge, Y, Zr, Sn, La, Ce, or Hf).

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than the In, Ga, and Zn.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like. The CAAC-OS film is one of oxide semiconductor films having a plurality of c-axis aligned crystal parts.

As the semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary. There is no grain boundary in such an oxide semiconductor; therefore, generation of a crack in an oxide semiconductor film which is caused by stress when a flexible device formed using one embodiment of the present invention is bent is prevented. Therefore, such an oxide semiconductor can be preferably used for a flexible device (e.g., a display device) which is used in a bent state, or the like.

The use of such materials for the semiconductor layer makes it possible to provide a highly reliable transistor in which a change in the electrical characteristics is suppressed.

Charge accumulated in a capacitor through a transistor can be held for a long time because of the low off-state current of the transistor. When such a transistor is used for a pixel, a driver circuit can be stopped while the luminance of an image displayed on each display region is maintained. As a result, an electronic device with extremely low power consumption can be obtained.

The light-emitting element included in the light-emitting device includes a pair of electrodes (the lower electrode 1431 and the upper electrode 1435), and the EL layer 1433 between the pair of electrodes. One of the pair of electrodes functions as an anode and the other functions as a cathode.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stacked film of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Further, lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Further, when a metal film or a metal oxide film is stacked on and in contact with an aluminum alloy film, oxidation of the aluminum alloy film can be prevented. Examples of materials for the metal film or the metal oxide film include titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

When a voltage higher than the threshold voltage of the light-emitting element is applied between the lower electrode 1431 and the upper electrode 1435, holes are injected to the EL layer 1433 from the anode side and electrons are injected to the EL layer 1433 from the cathode side. The injected electrons and holes are recombined in the EL layer 1433 and a light-emitting substance contained in the EL layer 1433 emits light.

The EL layer 1433 includes at least a light-emitting layer. In addition to the light-emitting layer, the EL layer 1433 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 1433, either a low molecular compound or a high molecular compound can be used, and an inorganic compound may also be used. Each of the layers included in the EL layer 1433 can be formed by any of the following methods: an evaporation method (including a vacuum evaporation method), a transfer method, a printing method, an inkjet method, a coating method, and the like.

In the element layer 1301, the light-emitting element is preferably provided between a pair of insulating films having high gas barrier properties. In that case, an impurity such as water can be prevented from entering the light-emitting element, leading to prevention of a decrease in the reliability of the light-emitting device.

As an insulating film having a high gas barrier property, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film having a high gas barrier property is lower than or equal to $1 \times 10^{-5}$ [g/m$^2$·day], preferably lower than or equal to $1 \times 10^{-6}$ [g/m$^2$·day], further preferably lower than or equal to 1×10$^{-7}$ [g/m$^2$·day], still further preferably lower than or equal to 1×10$^{-8}$ [g/m$^2$·day].

The substrate 1303 has a light-transmitting property and transmits at least light emitted from the light-emitting element included in the element layer 1301. The substrate 1303 has flexibility. The refractive index of the substrate 1303 is higher than that of the air.

An organic resin, which is lighter than glass, is preferably used for the substrate 1303, in which case the light-emitting device can be lightweight as compared with the case where glass is used.

Examples of materials having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low is preferred, and for example, an aramid resin, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used.

The substrate 1303 may have a stacked structure of a layer of any of the above-mentioned materials and a hard coat layer (e.g., a silicon nitride layer) which protects a surface of the light-emitting device from damage or the like, a layer (e.g., an aramid resin layer) which can disperse pressure, or the like. Furthermore, to suppress a decrease in the lifetime of the light-emitting element due to moisture and the like, the insulating film having a high gas barrier property may be provided.

The adhesive layer 1305 has a light-transmitting property and transmits at least light emitted from the light-emitting element included in the element layer 1301. The refractive index of the adhesive layer 1305 is higher than that of the air.

For the adhesive layer 1305, a curable resin that is curable at room temperature (e.g., a two-component-mixture-type resin), a light curable resin, a heat curable resin, or the like can be used. Examples include an epoxy resin, an acrylic resin, a silicone resin, a phenol resin, and the like. In particular, a material with low moisture permeability, such as an epoxy resin, is preferred.

Further, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent an impurity such as moisture from entering the light-emitting element, thereby improving the reliability of the light-emitting device.

In addition, it is preferable to mix a filler with a high refractive index (e.g., titanium oxide) into the resin, in which case the efficiency of light extraction from the light-emitting element can be improved.

The adhesive layer 1305 may also include a scattering member for scattering light. For example, the adhesive layer 1305 can be a mixture of the above resin and particles having a refractive index different from that of the resin. The particles function as the scattering member for scattering light.

The difference in refractive index between the resin and the particles with a refractive index different from that of the resin is preferably 0.1 or more, further preferably 0.3 or more. Specifically, an epoxy resin, an acrylic resin, an imide resin, a silicone resin, or the like can be used as the resin, and titanium oxide, barium oxide, zeolite, or the like can be used as the particles.

Particles of titanium oxide or barium oxide are preferable because they scatter light excellently. When zeolite is used, it can adsorb water contained in the resin and the like, thereby improving the reliability of the light-emitting element.

A material similar to that of the adhesive layer 1305 can be used for the adhesive layer 1403. In the case where the adhesive layer 1403 is provided on the side where light emitted from the light-emitting element is not extracted, there is no limitation on the light-transmitting property or the refractive index of the adhesive layer 1403.

The insulating layer 1405 and the insulating layer 1455 can each be formed using an inorganic insulating material. It is particularly preferable to use the insulating film having a high gas barrier property, in which case a highly reliable light-emitting device can be provided.

The insulating layer 1407 has an effect of preventing diffusion of impurities into a semiconductor included in the transistor. As the insulating layer 1407, an inorganic insulating film such as a silicon oxide film, a silicon oxynitride film, or an aluminum oxide film can be used.

As each of the insulating layers 1409, 1409a, and 1409b, an insulating film with a planarization function is preferably selected in order to reduce surface unevenness due to the transistor or the like. For example, an organic material such as a polyimide resin, an acrylic resin, or a benzocyclobutene-based resin can be used. Other than such organic materials, it is also possible to use a low-dielectric constant material (a low-k material) or the like. Note that a plurality of any of insulating films formed of these materials and inorganic insulating films may be stacked.

The insulating layer 1411 is provided to cover an end portion of the lower electrode 1431. In order that the insulating layer 1411 be favorably covered with the EL layer 1433 and the upper electrode 1435 formed thereover, a side wall of the insulating layer 1411 preferably has a tilted surface with continuous curvature.

As a material for the insulating layer 1411, a resin or an inorganic insulating material can be used. As the resin, for example, a polyimide resin, a polyamide resin, an acrylic resin, a siloxane resin, an epoxy resin, or a phenol resin can be used. In particular, either a negative photosensitive resin or a positive photosensitive resin is preferably used for easy formation of the insulating layer 1411.

There is no particular limitation on the method for forming the insulating layer 1411; a photolithography method, a sputtering method, an evaporation method, a droplet discharging method (e.g., an inkjet method), a printing method (e.g., a screen printing method or an off-set printing method), or the like may be used.

For the sealing layer 1413, a curable resin that is curable at room temperature (e.g., a two-component-mixture-type resin), a light curable resin, a heat curable resin, or the like can be used. For example, a polyvinyl chloride (PVC) resin, an acrylic resin, a polyimide resin, an epoxy resin, a silicone resin, a polyvinyl butyral (PVB) resin, an ethylene vinyl acetate (EVA) resin, or the like can be used. The sealing layer 1413 may include a drying agent. In the case where light emitted from the light-emitting element 1430 is extracted outside through the sealing layer 1413, the sealing layer 1413 preferably includes a filler with a high refractive index or a scattering member. Materials for the drying agent, the filler with a high refractive index, and the scattering member are similar to those that can be used for the adhesive layer 1305.

The conductive layer 1357 can be formed using the same material and the same step as a conductive layer included in the transistor or the light-emitting element. For example, the conductive layer can be formed to have a single-layer structure or a stacked-layer structure using any of metal materials such as molybdenum, titanium, chromium, tantalum, tungsten, aluminum, copper, neodymium, and scandium, and an alloy material containing any of these elements. The conductive layer may be formed using a conductive metal oxide. As the conductive metal oxide, indium oxide (e.g., $In_2O_3$), tin oxide (e.g., $SnO_2$), zinc oxide (ZnO), indium tin oxide (ITO), indium zinc oxide (e.g., $In_2O_3$—ZnO), or any of these metal oxide materials in which silicon oxide is contained can be used.

Each of the conductive layers 1408, 1412, 1510a, and 1510b can also be formed using any of the above metal materials, alloy materials, and conductive metal oxides.

For the connector 1415, it is possible to use a paste-like or sheet-like material which is obtained by mixture of metal particles and a heat-curable resin and for which anisotropic electric conductivity is provided by thermocompression bonding. As the metal particles, particles in which two or more kinds of metals are layered, for example, nickel particles coated with gold, are preferably used.

The coloring layer 1459 is a coloring layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an inkjet method, an etching method using a photolithography method, or the like.

The light-blocking layer 1457 is provided between the adjacent coloring layers 1459. The light-blocking layer 1457 blocks light emitted from the adjacent light-emitting element, thereby preventing color mixture between adjacent pixels. Here, the coloring layer 1459 is provided such that its end portion overlaps with the light-blocking layer 1457, whereby light leakage can be prevented. The light-blocking layer 1457 can be formed using a material that blocks light emitted from the light-emitting element, for example, a metal material, a resin material including a pigment or a dye, or the like. Note that as illustrated in FIG. 16B, the light-blocking layer 1457 is preferably provided also in a region other than the light extraction portion 1304, such as the driver circuit portion 1306, in which case undesired leakage of guided light or the like can be prevented.

The insulating layer 1461 covering the coloring layer 1459 and the light-blocking layer 1457 is preferably provided because it can prevent an impurity such as a pigment included in the coloring layer 1459 or the light-blocking layer 1457 from diffusing into the light-emitting element or the like. For the insulating layer 1461, a light-transmitting material is used, and an inorganic insulating material or an organic insulating material can be used. The insulating film having a high gas barrier property may be used for the insulating layer 1461.

Example of Manufacturing Method

Next, an example of a method for manufacturing a light-emitting device will be described with reference to FIGS. 19A to 19C and FIGS. 20A to 20C. Here, the manufacturing method is described using the light-emitting device of Specific Example 1 (FIG. 16B) as an example.

Figure 19A:
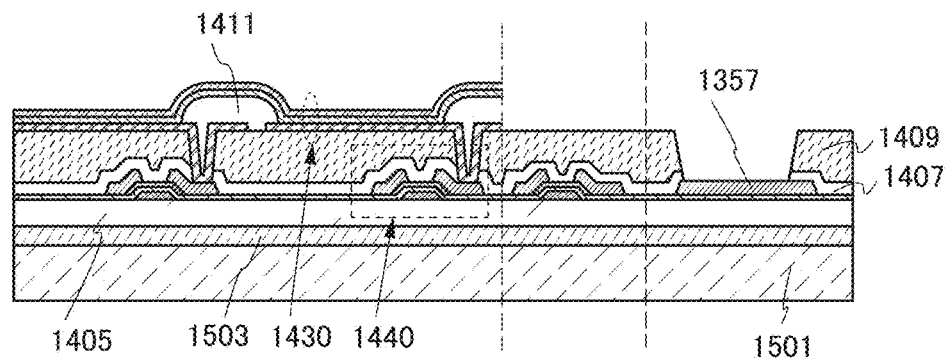
FIGS. 19A to 19C illustrate an example of a method for manufacturing a light-emitting device.

First, a separation layer 1503 is formed over a formation substrate 1501, and the insulating layer 1405 is formed over the separation layer 1503. Next, the plurality of transistors, the conductive layer 1357, the insulating layer 1407, the insulating layer 1409, the plurality of light-emitting elements, and the insulating layer 1411 are formed over the insulating layer 1405. An opening is formed in the insulating layers 1411, 1409, and 1407 to expose the conductive layer 1357 (FIG. 19A).

Figure 19B:
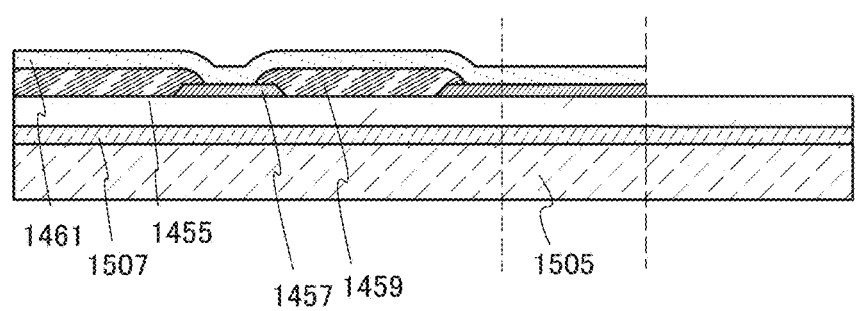

In addition, a separation layer 1507 is formed over a formation substrate 1505, and the insulating layer 1455 is formed over the separation layer 1507. Next, the light-blocking layer 1457, the coloring layer 1459, and the insulating layer 1461 are formed over the insulating layer 1455 (FIG. 19B).

The formation substrate 1501 and the formation substrate 1505 correspond to the first substrate 11 and the second substrate 21 in Embodiment 4, respectively. Thus, refer to the description in Embodiment 4.

The separation layer 1503 and the separation layer 1507 correspond to t the first separation layer 12 and the second separation layer 22 in Embodiment 4, respectively. Thus, refer to the description in Embodiment 4.

Each of the insulating layers can be formed by a sputtering method, a plasma CVD method, a coating method, a printing method, or the like. For example, the insulating layer is formed at temperatures higher than or equal to 250° C. and lower than or equal to 400° C. by a plasma CVD method, whereby the insulating layer can be a dense film having a very high gas barrier property.

Figure 19C:
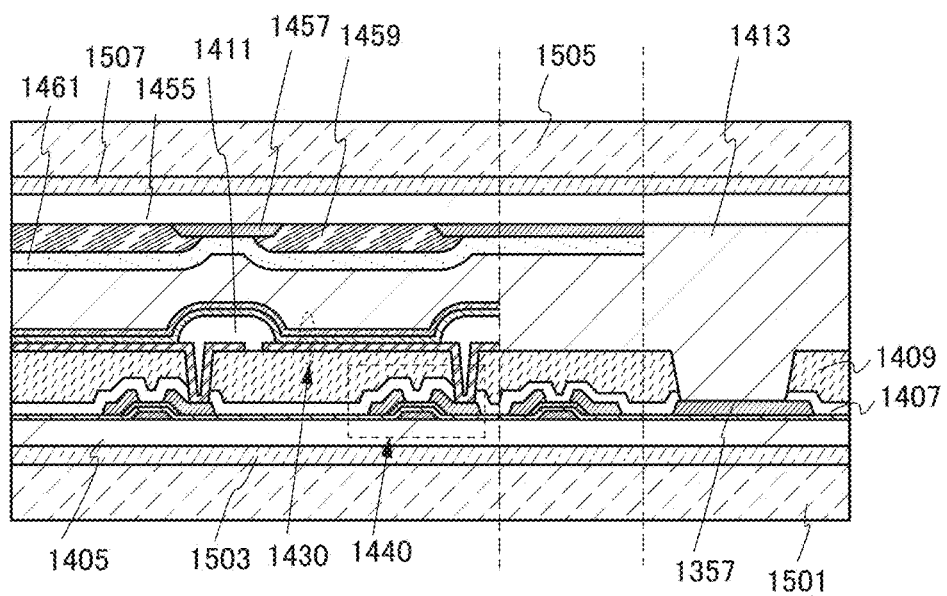

Then, a material for the sealing layer 1413 is applied to a surface of the formation substrate 1505 over which the coloring layer 1459 and the like are formed or a surface of the formation substrate 1501 over which the light-emitting element 1430 and the like are formed, and the surfaces are bonded to each other with the sealing layer 1413 positioned therebetween (FIG. 19C).

Next, the formation substrate 1501 is separated, and the exposed insulating layer 1405 and the substrate 1401 are bonded to each other with the adhesive layer 1403. Further, the formation substrate 1505 is separated, and the exposed insulating layer 1455 and the substrate 1303 are bonded to each other with the adhesive layer 1305. Although the substrate 1303 does not overlap with the conductive layer 1357 in FIG. 20A, the substrate 1303 may overlap with the conductive layer 1357.

Here, the substrate 1401 corresponds to the first support body 41 described in Embodiment 3, and the substrate 1303 corresponds to the second support body 42.

The steps of separating the formation substrate 1501, bonding the substrate 1401, separating the formation substrate 1505, and bonding the substrate 1303 can be performed using the stack manufacturing apparatus described in Embodiment 2 or 3.

Note that in the peeling process using the stack manufacturing apparatus of one embodiment of the present invention, the formation substrate can be subjected to any of a variety of peeling methods. For example, when a layer including a metal oxide film is formed as the separation layer on the side in contact with the peeled layer, the metal oxide film is embrittled by crystallization, whereby the peeled layer can be separated from the formation substrate. Alternatively, when an amorphous silicon film containing hydrogen is formed as the separation layer between the formation substrate having high heat resistance and the peeled layer, the amorphous silicon film is removed by laser irradiation or etching, whereby the peeled layer can be separated from the formation substrate. Alternatively, after a layer including a metal oxide film is formed as the separation layer on the side in contact with the peeled layer, the metal oxide film is embrittled by crystallization, and part of the separation layer is removed by etching using a solution or a fluoride gas such as $NF_3$, $BrF_3$, or $ClF_3$, whereby the separation can be performed at the embrittled metal oxide film. Furthermore, a method may be used in which a film containing nitrogen, oxygen, hydrogen, or the like (for example, an amorphous silicon film containing hydrogen, an alloy film containing hydrogen, an alloy film containing oxygen, or the like) is used as the separation layer, and the separation layer is irradiated with laser to release nitrogen, oxygen, or hydrogen contained in the separation layer as a gas, thereby promoting separation between the peeled layer and the formation substrate. Alternatively, it is possible to use a method in which the formation substrate provided with the peeled layer is removed mechanically or by etching using a solution or a fluoride gas such as $NF_3$, $BrF_3$, or $ClF_3$, or the like. In this case, the separation layer does not need to be provided.

Further, the peeling process can be conducted easily by combination of the above-described peeling methods. In other words, peeling can be performed with physical force (by a machine or the like) after performing laser irradiation, etching on the separation layer with a gas, a solution, or the like, or mechanical removal with a sharp knife, a scalpel, or the like so that the separation layer and the peeled layer can be easily separated from each other. This step corresponds to the step of forming a peeling trigger in this specification. The peeling triggers are preferably formed in each of the process member and the stack which are processed with the stack manufacturing apparatus of one embodiment of the present invention.

Separation of the peeled layer from the formation substrate may be carried out by filling the interface between the separation layer and the peeled layer with a liquid. Furthermore, the separation may be conducted while pouring a liquid. An adverse effect on the functional element included in the peeled layer due to static electricity caused at the time of peeling (e.g., a phenomenon in which a semiconductor element is damaged by static electricity) can be suppressed. Note that liquid can be sprayed in the form of mist or vapor. As the liquid, pure water, an organic solvent, a neutral, alkaline, or acid aqueous solution, an aqueous solution in which a salt is dissolved, or the like can be used.

As another peeling method, in the case where the separation layer is formed using tungsten, it is preferable that the separation be performed while etching the separation layer using a mixed solution of ammonia water and a hydrogen peroxide solution.

Note that the peeled layer is not necessary in the case where peeling at the interface between the formation substrate and the peeled layer is possible. For example, glass is used for the formation substrate, and an organic resin such as polyimide is formed in contact with the glass. Subsequently, laser irradiation or heat treatment is performed to improve the adhesion between the formation substrate and the organic resin. After that, an insulating film, a transistor, and the like are formed over the organic resin. Then, laser irradiation is performed at energy density higher than that of the previous laser irradiation or heat treatment is performed at a temperature higher than that of the previous heat treatment, whereby peeling can be performed at the interface between the formation substrate and the organic resin. Note that liquid may fill the interface between the formation substrate and the organic resin to perform peeling.

Since an insulating film, a transistor, and the like are formed over an organic resin having low heat resistance in the above method, a substrate cannot be processed at high temperatures in the manufacturing process. Note that a transistor formed using an oxide semiconductor does not need to be processed at high temperatures and thus can be favorably formed over the organic resin.

The organic resin may be used for a substrate of the device. Alternatively, the organic resin may be removed and another substrate may be bonded to an exposed surface of the peeled layer using an adhesive.

Alternatively, peeling at the interface between a metal layer and the organic resin may be performed in the following manner: the metal layer is provided between the formation substrate and the organic resin and current is made to flow in the metal layer so that the metal layer is heated. In that case, the organic resin can be used as a substrate of the light-emitting device or the like. Furthermore, the organic resin and another substrate may be bonded to each other with an adhesive.

Figure 20A:
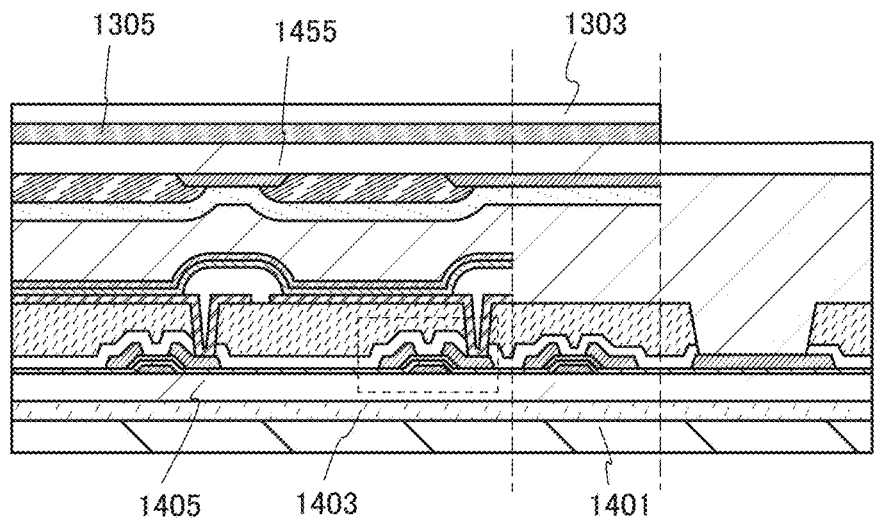
FIGS. 20A to 20C each illustrate an example of a method for manufacturing a light-emitting device.
Figure 20B:
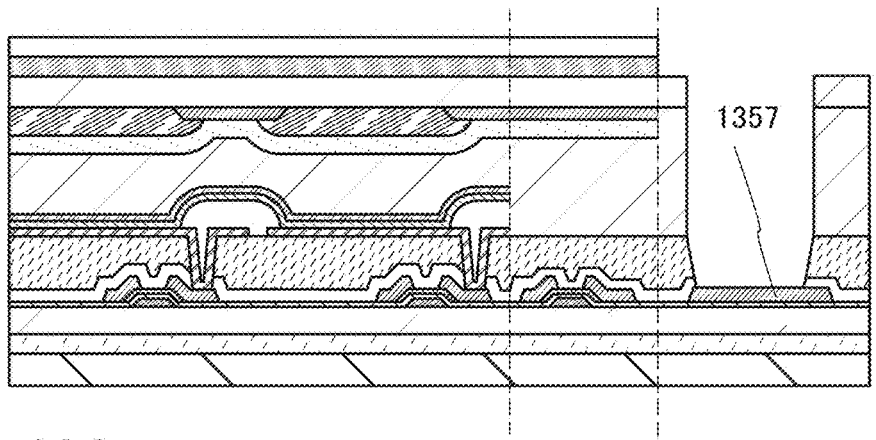
Figure 20C:
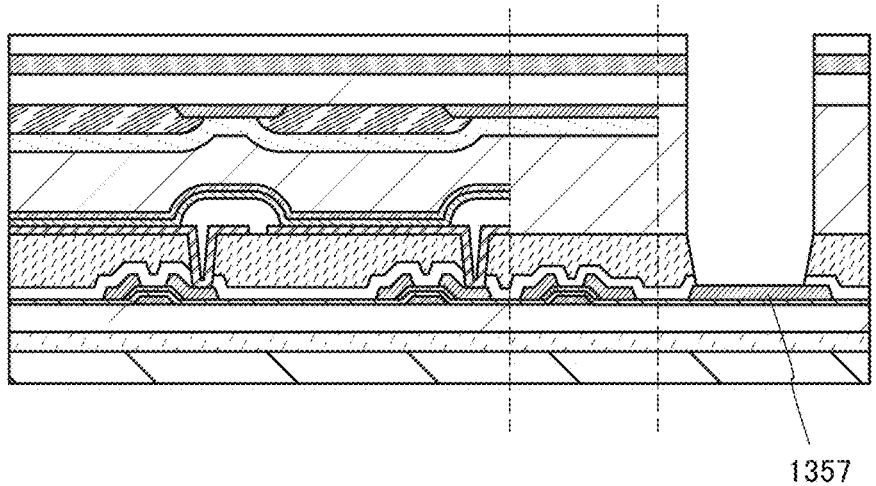

Lastly, an opening is formed in the insulating layer 1455 and the sealing layer 1413 to expose the conductive layer 1357 (FIG. 20B). In the case where the substrate 1303 overlaps with the conductive layer 1357, the opening is formed also in the substrate 1303 and the adhesive layer 1305 (FIG. 20C). A method for forming the opening is not particularly limited and may be, for example, a laser ablation method, an etching method, an ion beam sputtering method, or the like. As another method, a cut may be made in a film over the conductive layer 1357 with a sharp knife or the like and part of the film may be separated by physical force.

In the above-described manner, the light-emitting device can be manufactured.

Note that an example of manufacturing a light-emitting device in accordance with one embodiment of the present invention is described in this embodiment; however, one embodiment of the present invention is not limited to this example. For example, in this specification and the like, a display element, a display device which is a device including a display element, a light-emitting element, and a light-emitting device which is a device including a light-emitting element can employ various modes or can include various elements. Examples of light-emitting elements, display devices, light-emitting elements, and light-emitting devices include an EL element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a display element using a micro electro mechanical system (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, or a carbon nanotube, which are display media whose contrast, luminance, reflectivity, transmittance, or the like is changed by electromagnetic action. Examples of a display device having an EL element include an EL display. Examples of a display device having an electron emitter include a field emission display (FED) and an SED-type flat panel display (SED: surface-conduction electron-emitter display).

Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display). Examples further include a display device including electronic ink, Electronic Liquid Powder, or an electrophoretic element, such as electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

In this specification and the like, an active matrix method in which an active element (a non-linear element) is included in a pixel or a passive matrix method in which an active element is not included in a pixel can be used.

In the active matrix method, as an active element, not only a transistor but also a variety of active elements can be used. For example, a metal insulator metal (MIM), a thin film diode (TFD), or the like can also be used. Since these elements can be formed with a smaller number of manufacturing steps, manufacturing cost can be reduced or a yield can be improved. Furthermore, since the size of these elements is small, the aperture ratio can be improved, so that power consumption can be reduced or higher luminance can be achieved.

Since an active element is not used in the passive matrix method, the number of manufacturing steps is small, so that manufacturing cost can be reduced or a yield can be improved. Furthermore, since an active element is not used, the aperture ratio can be improved, so that power consumption can be reduced or higher luminance can be achieved, for example.

This embodiment can be combined with any of the other embodiments as appropriate.

Embodiment 6

In this embodiment, the structure of a foldable touch panel will be described with reference to FIGS. 21A to 21C, FIGS. 22A and 22B, FIGS. 23A to 23C, and FIGS. 24A to 24C. Note that Embodiment 5 can be referred to for the material of each layer. Although a touch panel formed using an organic EL element is described in this embodiment, one embodiment of the present invention is not limited thereto and can be a touch panel formed using any of the other elements described in Embodiment 5, for example.

Structural Example 1

Figure 21A:
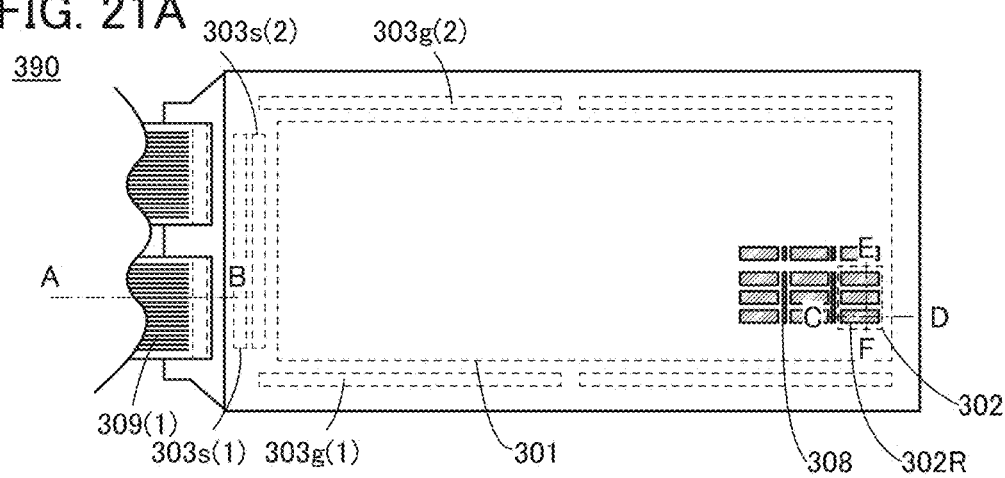
FIGS. 21A to 21C illustrate an example of a touch panel.
Figure 21B:
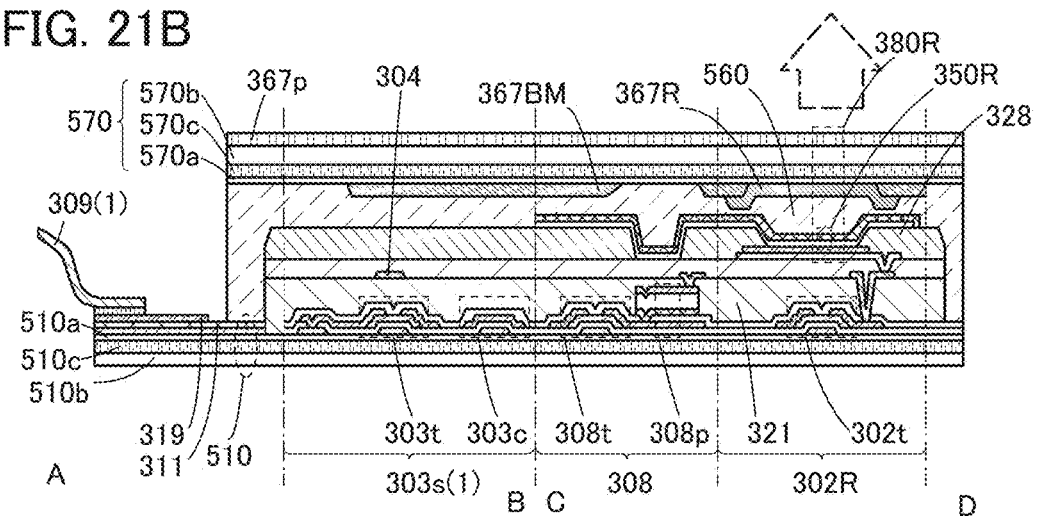
Figure 21C:
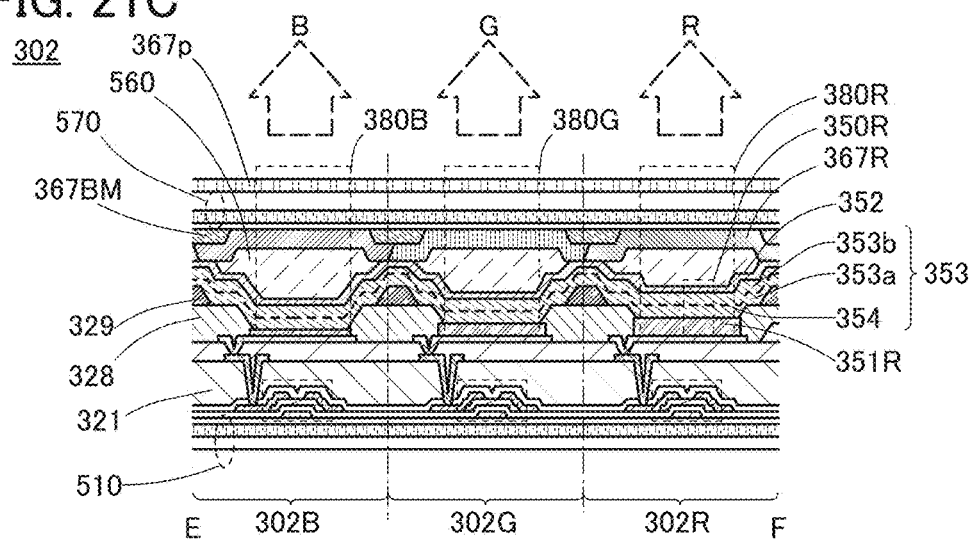

FIG. 21A is a top view of the touch panel. FIG. 21B is a cross-sectional view taken along dashed-dotted line A-B and dashed-dotted line C-D in FIG. 21A. FIG. 21C is a cross-sectional view taken along dashed-dotted line E-F in FIG. 21A.

As illustrated in FIG. 21A, a touch panel 390 includes a display portion 301.

The display portion 301 includes a plurality of pixels 302 and a plurality of imaging pixels 308. The imaging pixels 308 can sense a touch of a finger or the like on the display portion 301. Thus, a touch sensor can be formed using the imaging pixels 308.

Each of the pixels 302 includes a plurality of sub-pixels (e.g., a sub-pixel 302R). In addition, in the sub-pixels, light-emitting elements and pixel circuits that can supply electric power for driving the light-emitting elements are provided.

The pixel circuits are electrically connected to wirings through which selection signals are supplied and wirings through which image signals are supplied.

Furthermore, the touch panel 390 is provided with a scan line driver circuit 303g(1) that can supply selection signals to the pixels 302 and an image signal line driver circuit 303s(1) that can supply image signals to the pixels 302.

The imaging pixels 308 include photoelectric conversion elements and imaging pixel circuits that drive the photoelectric conversion elements.

The imaging pixel circuits are electrically connected to wirings through which control signals are supplied and wirings through which power supply potentials are supplied.

Examples of the control signals include a signal for selecting an imaging pixel circuit from which a recorded imaging signal is read, a signal for initializing an imaging pixel circuit, and a signal for determining the time it takes for an imaging pixel circuit to detect light.

The touch panel 390 is provided with an imaging pixel driver circuit 303g(2) that can supply control signals to the imaging pixels 308 and an imaging signal line driver circuit 303s(2) that reads out imaging signals.

As illustrated in FIG. 21B, the touch panel 390 includes a substrate 510 and a substrate 570 that faces the substrate 510.

Flexible materials can be favorably used for the substrate 510 and the substrate 570.

Materials with which passage of impurities is inhibited can be favorably used for the substrate 510 and the substrate 570. For example, materials with a vapor permeability of lower than or equal to $10^{-5}$ g/m$^2$·day, preferably lower than or equal to $10^{-6}$ g/m$^2$·day can be favorably used.

The substrate 510 can be favorably formed using a material whose coefficient of linear expansion is substantially equal to that of the substrate 570. For example, the coefficient of linear expansion of the materials are preferably lower than or equal to $1 \times 10^{-3}$/K, further preferably lower than or equal to $5 \times 10^{-5}$/K, and still further preferably lower than or equal to $1 \times 10^{-5}$/K.

The substrate 510 is a stacked body including a flexible substrate 510b, an insulating layer 510a that prevents diffusion of impurities to the light-emitting elements, and an adhesive layer 510c that bonds the insulating layer 510a to the flexible substrate 510b.

The substrate 570 is a stacked body including a flexible substrate 570b, an insulating layer 570a that prevents diffusion of impurities to the light-emitting elements, and an adhesive layer 570c that bonds the insulating layer 570a to the flexible substrate 570b.

For example, materials that include polyester, polyolefin, polyamide (e.g., nylon, aramid), polyimide, polycarbonate, or a resin having an acrylic bond, a urethane bond, an epoxy bond, or a siloxane bond can be used for the adhesive layer.

A sealing layer 560 bonds the substrate 570 to the substrate 510. The sealing layer 560 has a refractive index higher than that of air. The pixel circuits and the light-emitting elements (e.g., a light-emitting element 350R) are provided between the substrate 510 and the substrate 570.

Each of the pixels 302 includes the sub-pixel 302R, a sub-pixel 302G, and a sub-pixel 302B (FIG. 21C). The sub-pixel 302R includes a light-emitting module 380R, the sub-pixel 302G includes a light-emitting module 380G, and the sub-pixel 302B includes a light-emitting module 380B.

For example, the sub-pixel 302R includes the light-emitting element 350R and the pixel circuit that can supply electric power to the light-emitting element 350R and includes a transistor 302t (FIG. 21B). Furthermore, the light-emitting module 380R includes the light-emitting element 350R and an optical element (e.g., a coloring layer 367R).

The light-emitting element 350R includes a lower electrode 351R, an upper electrode 352, and an EL layer 353 between the lower electrode 351R and the upper electrode 352 (FIG. 21C).

The EL layer 353 includes a light-emitting unit 353a, a light-emitting unit 353b, and an intermediate layer 354 between the light-emitting units 353a and 353b.

The light-emitting module 380R includes the coloring layer 367R on the substrate 570. The coloring layer transmits light of a particular wavelength and is, for example, a layer that selectively transmits light of red, green, or blue color. Note that a region that transmits light emitted from the light-emitting element as it is may be provided as well.

The light-emitting module 380R, for example, includes a sealing layer 560 that is in contact with the light-emitting element 350R and the coloring layer 367R.

The coloring layer 367R is positioned in a region overlapping with the light-emitting element 350R. Accordingly, part of light emitted from the light-emitting element 350R passes through the sealing layer 560 and the coloring layer 367R and is emitted to the outside of the light-emitting module 380R as indicated by arrows in FIGS. 21B and 21C.

The touch panel 390 includes a light-blocking layer 367BM on the substrate 570. The light-blocking layer 367BM is provided so as to surround the coloring layer (e.g., the coloring layer 367R).

The touch panel 390 includes an anti-reflective layer 367p positioned in a region overlapping with the display portion 301. As the anti-reflective layer 367p, a circular polarizing plate can be used, for example.

The touch panel 390 includes an insulating layer 321. The insulating layer 321 covers the transistor 302t. Note that the insulating layer 321 can be used as a layer for planarizing unevenness caused by the pixel circuits. An insulating film on which a layer that can prevent diffusion of impurities to the transistor 302t and the like is stacked can be used as the insulating layer 321.

The touch panel 390 includes the light-emitting elements (e.g., the light-emitting element 350R) over the insulating layer 321.

The touch panel 390 includes, over the insulating layer 321, a partition 328 that overlaps with an end portion of the lower electrode 351R. In addition, a spacer 329 that controls the distance between the substrate 510 and the substrate 570 is provided on the partition 328.

The image signal line driver circuit 303s(1) includes a transistor 303t and a capacitor 303c. Note that the driver circuit can be formed in the same process and over the same substrate as those of the pixel circuits. As illustrated in FIG. 21B, the transistor 303t may include a second gate 304 over the insulating layer 321. The second gate 304 may be electrically connected to a gate of the transistor 303t. Alternatively, different potentials may be supplied to the second gate 304 and the gate of the transistor 303t. The second gate 304 may be provided in a transistor 308t, the transistor 302t, or the like if necessary.

The imaging pixels 308 each include a photoelectric conversion element 308p and an imaging pixel circuit for sensing light received by the photoelectric conversion element 308p. The imaging pixel circuit includes the transistor 308t.

For example, a PIN photodiode can be used as the photoelectric conversion element 308p.

The touch panel 390 includes a wiring 311 through which a signal can be supplied. The wiring 311 is provided with a terminal 319. Note that an FPC 309(1) through which a signal such as an image signal or a synchronization signal can be supplied is electrically connected to the terminal 319. Note that a printed wiring board (PWB) may be attached to the FPC 309(1).

Transistors formed in the same process can be used as the transistor 302t, the transistor 303t, the transistor 308t, and the like. Embodiment 5 can be referred to for the structures of the transistors.

As a gate, source, and drain of a transistor, and a wiring or an electrode included in a touch panel, a single-layer structure or a stacked structure using any of metals such as aluminum, titanium, chromium, nickel, copper, yttrium, zirconium, molybdenum, silver, tantalum, and tungsten, or an alloy containing any of these metals as its main component can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used. Copper containing manganese is preferably used because controllability of a shape by etching is increased.

Structural Example 2

Figure 22A:
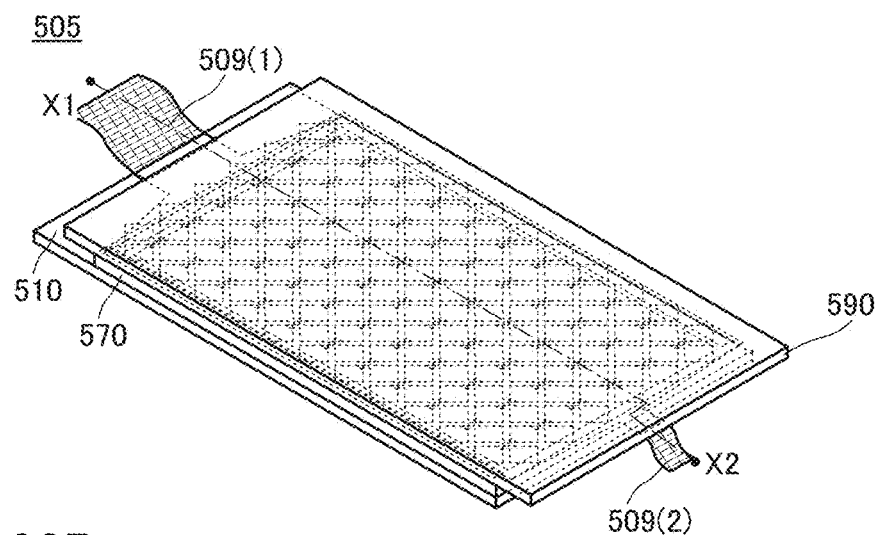
FIGS. 22A and 22B illustrate an example of a touch panel.
Figure 22B:
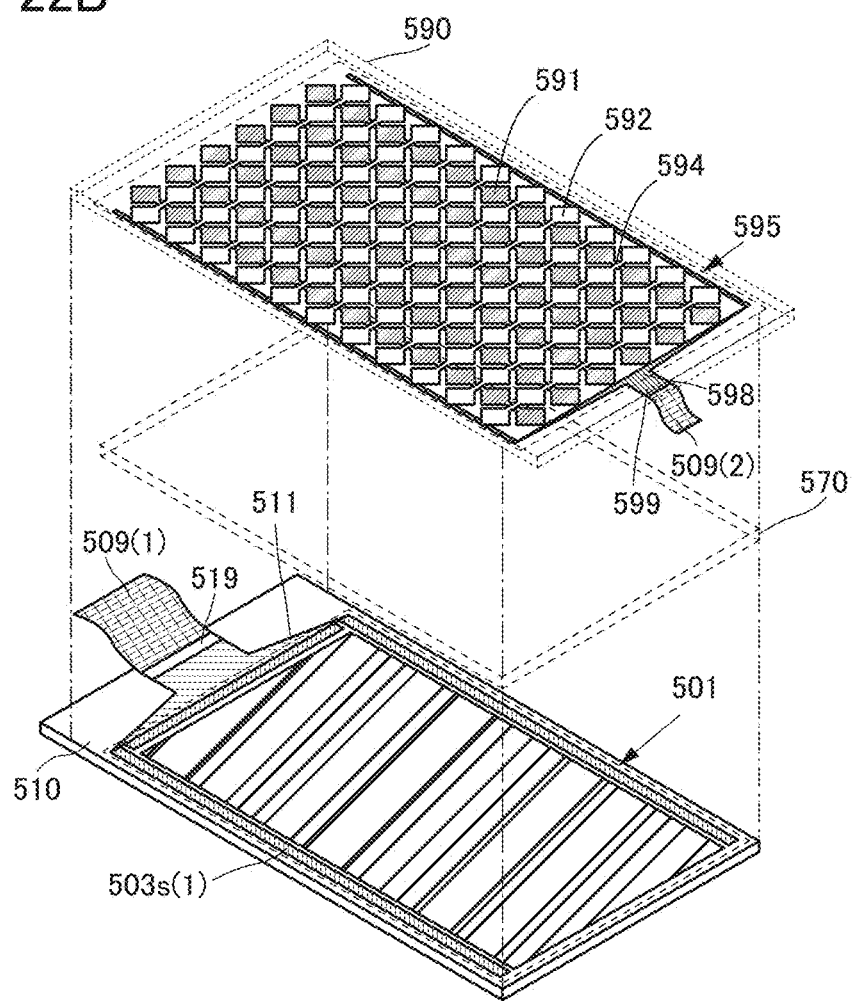
Figure 23A:
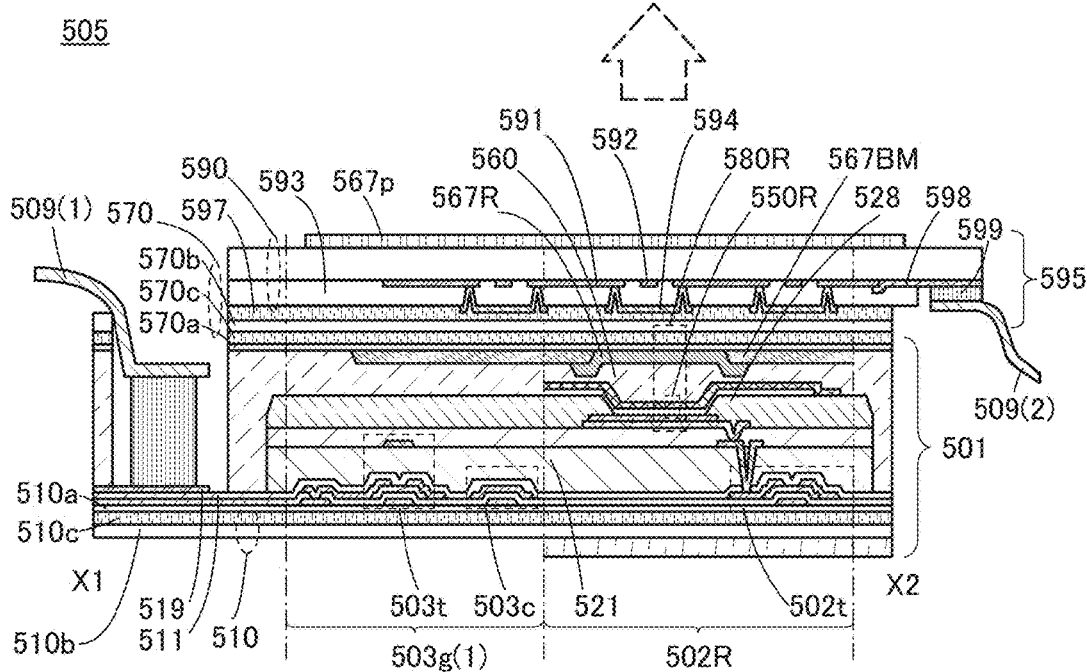
FIGS. 23A to 23C each illustrate an example of a touch panel.
Figure 23B:
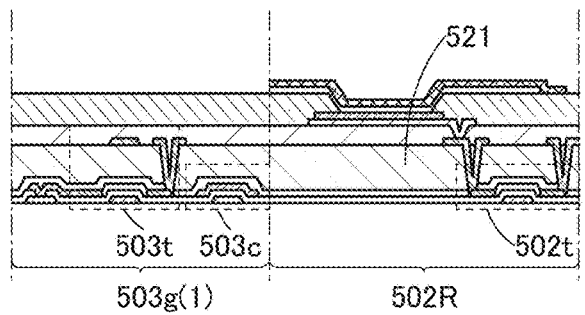
Figure 23C:
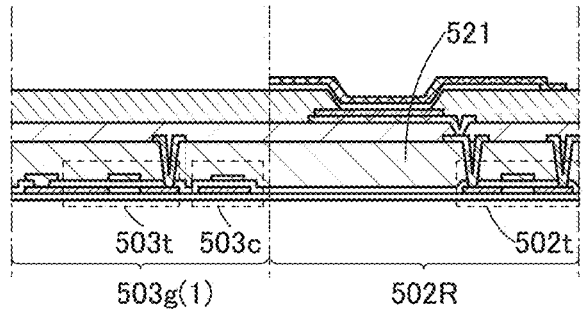

FIGS. 22A and 22B are perspective views of a touch panel 505. For simplicity, only main components are illustrated. FIGS. 23A to 23C are cross-sectional views along dashed-dotted line X1-X2 in FIG. 22A.

The touch panel 505 includes a display portion 501 and a touch sensor 595 (FIG. 22B). Furthermore, the touch panel 505 includes the substrate 510, the substrate 570, and a substrate 590. Note that the substrate 510, the substrate 570, and the substrate 590 each have flexibility.

The display portion 501 includes the substrate 510, a plurality of pixels over the substrate 510, and a plurality of wirings 511 through which signals are supplied to the pixels. The plurality of wirings 511 are led to a peripheral portion of the substrate 510, and part of the plurality of wirings 511 form a terminal 519. The terminal 519 is electrically connected to an FPC 509(1).

The substrate 590 includes the touch sensor 595 and a plurality of wirings 598 electrically connected to the touch sensor 595. The plurality of wirings 598 are led to a peripheral portion of the substrate 590, and part of the plurality of wirings 598 form a terminal. The terminal is electrically connected to an FPC 509(2). Note that in FIG.

22B, electrodes, wirings, and the like of the touch sensor 595 provided on the back side of the substrate 590 (on the side that faces the substrate 510) are indicated by solid lines for clarity.

As the touch sensor 595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive touch sensor is preferable because multiple points can be sensed simultaneously.

An example of using a projected capacitive touch sensor will be described below with reference to FIG. 22B.

Note that a variety of sensors that can sense the closeness or the contact of a sensing target such as a finger can be used.

The projected capacitive touch sensor 595 includes first electrodes 591 and second electrodes 592. The first electrodes 591 are electrically connected to any of the plurality of wirings 598, and the second electrodes 592 are electrically connected to any of the other wirings 598.

The second electrodes 592 each have a shape of a plurality of quadrangles arranged in one direction with one corner of a quadrangle connected to one corner of another quadrangle as illustrated in FIGS. 22A and 22B.

The first electrodes 591 each have a quadrangular shape and are arranged in a direction intersecting with the direction in which the second electrodes 592 extend.

A wiring 594 electrically connects two first electrodes 591 between which one second electrode 592 is positioned. The intersecting area of the second electrode 592 and the wiring 594 is preferably as small as possible. Such a structure allows a reduction in the area of a region where the electrodes are not provided, reducing unevenness in transmittance. As a result, unevenness in luminance of light from the touch sensor 595 can be reduced.

Note that the shapes of the first electrodes 591 and the second electrodes 592 are not limited to the above-mentioned shapes and can be any of a variety of shapes. For example, a plurality of first electrodes each having a stripe shape may be arranged so that the space between two adjacent first electrodes are reduced as much as possible, and a plurality of second electrodes each having a stripe shape may be arranged so as to intersect the first electrodes with an insulating layer sandwiched between the first electrodes and the second electrodes. In that case, two adjacent second electrodes may be spaced apart from each other. Moreover, between the two adjacent second electrodes, a dummy electrode which is electrically insulated from these electrodes is preferably provided, whereby the area of a region having a different transmittance can be reduced.

The touch sensor 595 includes the substrate 590, the first electrodes 591 and the second electrodes 592 provided in a staggered arrangement on the substrate 590, an insulating layer 593 covering the first electrodes 591 and the second electrodes 592, and the wiring 594 that electrically connects the adjacent first electrodes 591 to each other.

An adhesive layer 597 bonds the substrate 590 to the substrate 570 so that the touch sensor 595 overlaps with the display portion 501 as illustrated in FIGS. 22B and 23A.

The first electrodes 591 and the second electrodes 592 are formed using a light-transmitting conductive material. As the light-transmitting conductive material, a conductive oxide such as indium oxide, indium tin oxide, indium zinc oxide, zinc oxide, or zinc oxide to which gallium is added can be used. Note that a film including graphene may be used as well. The film containing graphene can be formed, for example, by reducing a film containing graphene oxide. As a reducing method, a method with application of heat or the like can be employed.

The first electrodes 591 and the second electrodes 592 may be formed by depositing a light-transmitting conductive material on the substrate 590 by a sputtering method and then removing an unnecessary portion by any of various patterning techniques such as photolithography.

Examples of a material for the insulating layer 593 are a resin such as acrylic or epoxy resin, a resin having a siloxane bond, and an inorganic insulating material such as silicon oxide, silicon oxynitride, or aluminum oxide.

Furthermore, openings reaching the first electrodes 591 are formed in the insulating layer 593, and the wiring 594 electrically connects the adjacent first electrodes 591. A light-transmitting conductive material can be favorably used as the wiring 594 because the aperture ratio of the touch panel can be increased. Moreover, a material with higher conductivity than the conductivities of the first electrodes 591 and the second electrodes 592 can be favorably used for the wiring 594 because electric resistance can be reduced.

Each of the second electrodes 592 extends in one direction, and a plurality of second electrodes 592 are provided in the form of stripes.

The wiring 594 intersects with one of the second electrodes 592.

Adjacent first electrodes 591 are provided with one of the second electrodes 592 provided therebetween. The wiring 594 electrically connects the adjacent first electrodes 591.

Note that the plurality of first electrodes 591 are not necessarily arranged in the direction orthogonal to one of the second electrodes 592.

One wiring 598 is electrically connected to any of the first electrodes 591 and the second electrodes 592. Part of the wiring 598 serves as a terminal. For the wiring 598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 593 and the wiring 594 may be provided to protect the touch sensor 595.

Furthermore, a connection layer 599 electrically connects the wiring 598 to the FPC 509(2).

As the connection layer 599, any of various anisotropic conductive films (ACF), anisotropic conductive pastes (ACP), and the like can be used.

The adhesive layer 597 has a light-transmitting property. For example, a thermosetting resin or an ultraviolet curable resin can be used; specifically, a resin such as an acrylic resin, a urethane resin, an epoxy resin, or a resin having a siloxane bond can be used.

The display portion 501 includes a plurality of pixels arranged in a matrix. Each of the pixels includes a display element and a pixel circuit for driving the display element.

In this embodiment, an example of using an organic EL element that emits white light as a display element will be described; however, the display element is not limited to such element.

For example, organic EL elements that emit light of different colors may be included in sub-pixels so that the light of different colors can be emitted from the respective sub-pixels.

The substrate 510, the substrate 570, and the sealing layer 560 can have structures similar to those in Structural Example 1.

A pixel includes a sub-pixel 502S, and the sub-pixel 502R includes a light-emitting module 580R.

The sub-pixel 502R includes a light-emitting element 550R and a pixel circuit including a transistor 502t that can supply electric power to the light-emitting element 550R. Furthermore, the light-emitting module 580R includes the light-emitting element 550R and an optical element (e.g., a coloring layer 567R).

The light-emitting element 550R includes a lower electrode, an upper electrode, and an EL layer between the lower electrode and the upper electrode.

The light-emitting module 580R includes the coloring layer 567R on the light extraction side.

In the case where the sealing layer 560 is provided on the light extraction side, the sealing layer 560 is in contact with the light-emitting element 550R and the coloring layer 567R.

The coloring layer 567R is positioned in a region overlapping with the light-emitting element 550R. Accordingly, part of light emitted from the light-emitting element 550R passes through the coloring layer 567R and is emitted to the outside of the light-emitting module 580R as indicated by an arrow in FIG. 23A.

The display portion 501 includes a light-blocking layer 567BM on the light extraction side. The light-blocking layer 567BM is provided so as to surround the coloring layer (e.g., the coloring layer 567R).

The display portion 501 includes an anti-reflective layer 567p positioned in a region overlapping with pixels. As the anti-reflective layer 567p, a circular polarizing plate can be used, for example.

The display portion 501 includes an insulating film 521. The insulating film 521 covers the transistor 502t. Note that the insulating film 521 can be used as a layer for planarizing unevenness caused by the pixel circuits. A stacked film including a layer that can prevent diffusion of impurities can be used as the insulating film 521. This can prevent the reliability of the transistor 502t or the like from being lowered by diffusion of impurities.

The display portion 501 includes the light-emitting elements (e.g., the light-emitting element 550R) over the insulating film 521.

The display portion 501 includes, over the insulating film 521, a partition 528 that overlaps with an end portion of a lower electrode. In addition, a spacer that controls the distance between the substrate 510 and the substrate 570 is provided on the partition 528.

A scan line driver circuit 503g(1) includes a transistor 503t and a capacitor 503c. Note that the driver circuit can be formed in the same process and over the same substrate as those of the pixel circuits.

The display portion 501 includes the wirings 511 through which signals can be supplied. The wirings 511 are provided with the terminal 519. Note that the FPC 509(1) through which a signal such as an image signal or a synchronization signal can be supplied is electrically connected to the terminal 519.

Note that a printed wiring board (PWB) may be attached to the FPC 509(1).

The display portion 501 includes wirings such as scan lines, signal lines, and power supply lines. Any of various conductive films described the above can be used as the wirings.

Note that any of various kinds of transistors can be used in the display portion 501. A structure in the case of using bottom-gate transistors in the display portion 501 is illustrated in FIGS. 23A and 23B.

For example, a semiconductor layer containing an oxide semiconductor, amorphous silicon, or the like can be used in the transistor 502t and the transistor 503t illustrated in FIG. 23A.

For example, a semiconductor layer containing polycrystalline silicon that is obtained by crystallization process such as laser annealing can be used in the transistor 502t and the transistor 503t illustrated in FIG. 23B.

A structure in the case of using top-gate transistors in the display portion 501 is illustrated in FIG. 23C.

For example, a semiconductor layer including polycrystalline silicon, a single crystal silicon film that is transferred from a single crystal silicon substrate, or the like can be used in the transistor 502t and the transistor 503t illustrated in FIG. 23C.

Structural Example 3

Figure 24A:
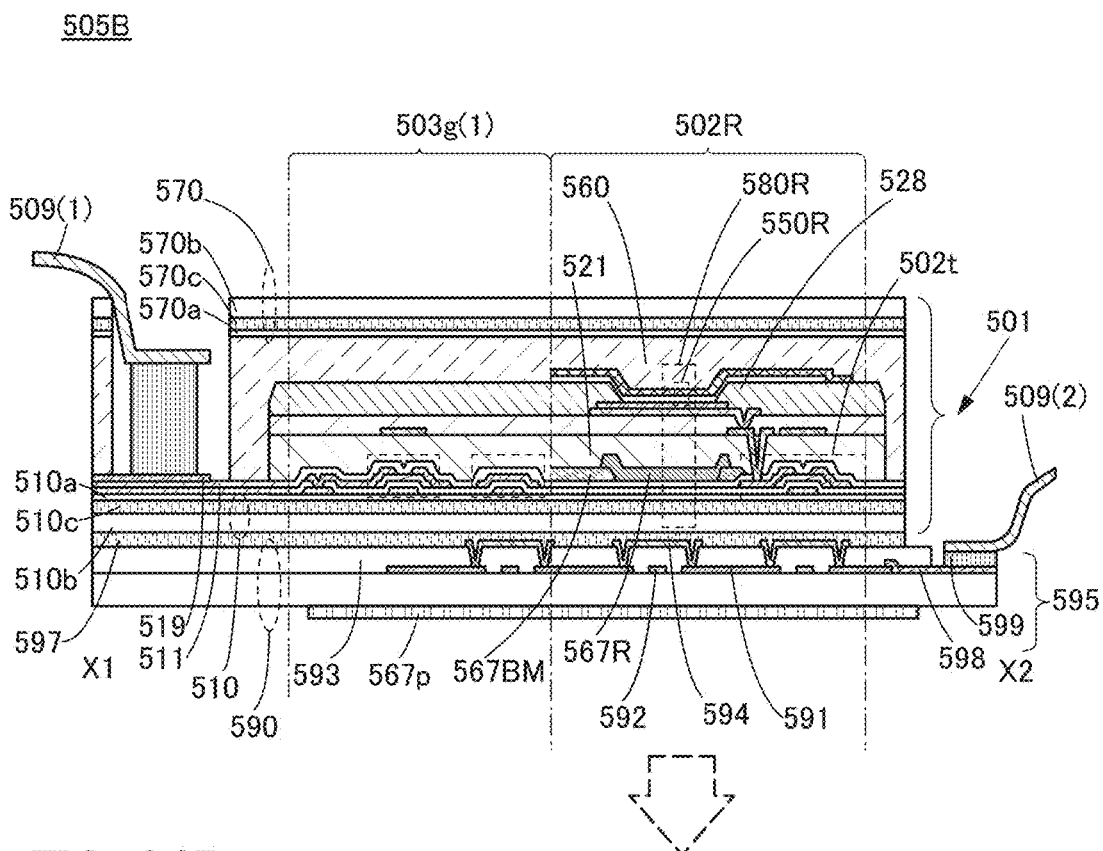
FIGS. 24A to 24C each illustrate an example of a touch panel.
Figure 24B:
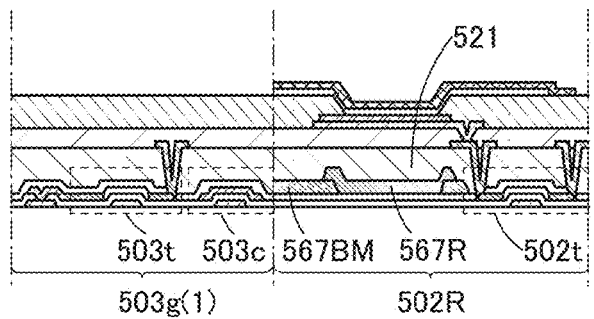
Figure 24C:
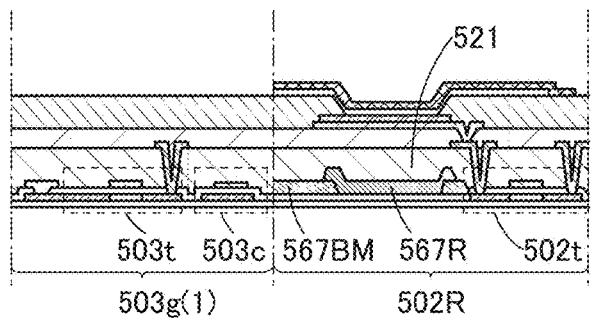

FIGS. 24A to 24C are cross-sectional views of a touch panel 505B. The touch panel 505B described in this embodiment is different from the touch panel 505 described in Structural Example 2 in that the display portion 501 displays received image data to the side where the transistors are provided and that the touch sensor is provided on the substrate 510 side of the display portion. Different structures will be described in detail below, and the above description is referred to for the other similar structures.

The coloring layer 567R is positioned in a region overlapping with the light-emitting element 550R. The light-emitting element 550R illustrated in FIG. 24A emits light to the side where the transistor 502t is provided. Accordingly, part of light emitted from the light-emitting element 550R passes through the coloring layer 567R and is emitted to the outside of the light-emitting module 580R as indicated by an arrow in FIG. 24A.

The display portion 501 includes the light-blocking layer 567BM on the light extraction side. The light-blocking layer 567BM is provided so as to surround the coloring layer (e.g., the coloring layer 567R).

The touch sensor 595 is provided on the substrate 510 side of the display portion 501 (FIG. 24A).

The adhesive layer 597 is provided between the substrate 510 and the substrate 590 and bonds the touch sensor 595 to the display portion 501.

Note that any of various kinds of transistors can be used in the display portion 501. A structure in the case of using bottom-gate transistors in the display portion 501 is illustrated in FIGS. 24A and 24B.

For example, a semiconductor layer containing an oxide semiconductor, amorphous silicon, or the like can be used in the transistor 502t and the transistor 503t illustrated in FIG. 24A.

For example, a semiconductor layer containing polycrystalline silicon or the like can be used in the transistor 502t and the transistor 503t illustrated in FIG. 24B.

A structure in the case of using top-gate transistors in the display portion 501 is illustrated in FIG. 24C.

For example, a semiconductor layer containing polycrystalline silicon, a transferred single crystal silicon film, or the like can be used in the transistor 502t and the transistor 503t illustrated in FIG. 24C.

This embodiment can be combined with any of the other embodiments as appropriate.

Embodiment 7

In this embodiment, electronic appliances and lighting devices that can be fabricated by employing the peeling apparatus of one embodiment of the present invention or the stack manufacturing apparatus of one embodiment of the present invention will be described with reference to FIGS. 25A to 25G and FIGS. 26A to 26I.

A light-emitting device, a display device, a semiconductor device, or the like that can be used for an electronic appliance or a lighting device can be fabricated with a high yield by employing one embodiment of the present invention. Moreover, a flexible electronic appliance or lighting device having high productivity can be fabricated by employing one embodiment of the present invention.

Examples of an electronic appliance include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, and a large game machine such as a pinball machine.

The device fabricated by employing one embodiment of the present invention has flexibility and therefore can be incorporated along a curved inside/outside wall surface of a house or a building or a curved interior/exterior surface of a car.

Figure 25A:
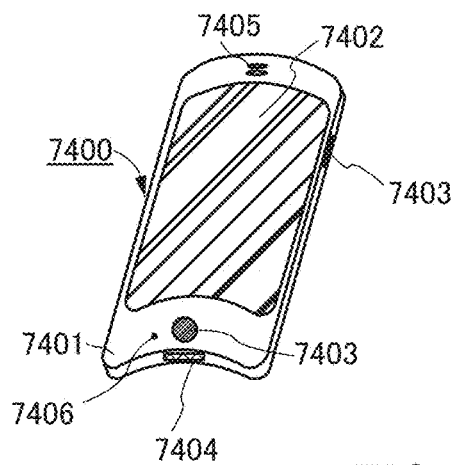
FIGS. 25A to 25G illustrate examples of electronic devices and lighting devices.

FIG. 25A illustrates an example of a mobile phone. The mobile phone 7400 is provided with a display portion 7402 incorporated in a housing 7401, operation buttons 7403, an external connection port 7404, a speaker 7405, a microphone 7406, and the like. Note that the mobile phone 7400 is fabricated using the display device fabricated by employing one embodiment of the present invention for the display portion 7402. One embodiment of the present invention enables a highly reliable mobile phone having a curved display portion to be provided with a high yield.

When the display portion 7402 of the mobile phone 7400 illustrated in FIG. 25A is touched with a finger or the like, data can be input into the mobile phone 7400.

In addition, operations such as making a call and inputting a letter can be performed by touch on the display portion 7402 with a finger or the like.

With the operation buttons 7403, the power can be turned on or off. In addition, types of images displayed on the display portion 7402 can be switched; switching images from a mail creation screen to a main menu screen.

Figure 25B:
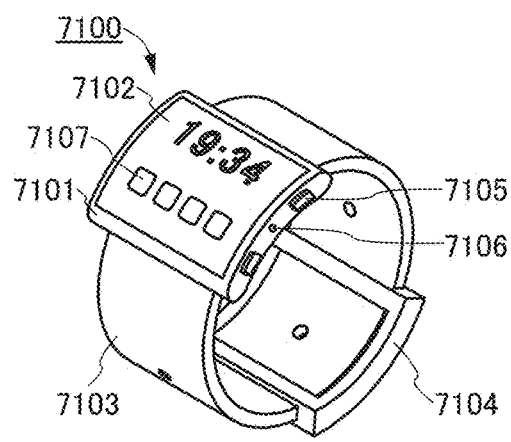

FIG. 25B illustrates an example of a wrist-watch-type portable information terminal. A portable information terminal 7100 includes a housing 7101, a display portion 7102, a band 7103, a buckle 7104, an operation button 7105, an input/output terminal 7106, and the like.

The portable information terminal 7100 is capable of executing a variety of applications such as mobile phone calls, e-mailing, reading and editing texts, music reproduction, Internet communication, and a computer game.

The display surface of the display portion 7102 is bent, and images can be displayed on the bent display surface. Furthermore, the display portion 7102 includes a touch sensor, and operation can be performed by touching the screen with a finger, a stylus, or the like. For example, by touching an icon 7107 displayed on the display portion 7102, an application can be started.

With the operation button 7105, a variety of functions such as ON/OFF of the power, ON/OFF of wireless communication, setting and cancellation of manner mode, and setting and cancellation of power saving mode can be performed. For example, the functions of the operation button 7105 can be set freely by setting the operation system incorporated in the portable information terminal 7100.

The portable information terminal 7100 can employ near field communication that is a communication method based on an existing communication standard. In that case, for example, mutual communication between the portable information terminal 7100 and a headset capable of wireless communication can be performed, and thus hands-free calling is possible.

Moreover, the portable information terminal 7100 includes the input/output terminal 7106, and data can be directly transmitted to and received from another information terminal via a connector. Charging through the input/output terminal 7106 is possible. Note that the charging operation may be performed by wireless power feeding without using the input/output terminal 7106.

The display portion 7102 of the portable information terminal 7100 includes a light-emitting device fabricated by using one embodiment of the present invention. One embodiment of the present invention enables a highly reliable portable information terminal having a curved display portion to be provided with a high yield.

Figure 25C:
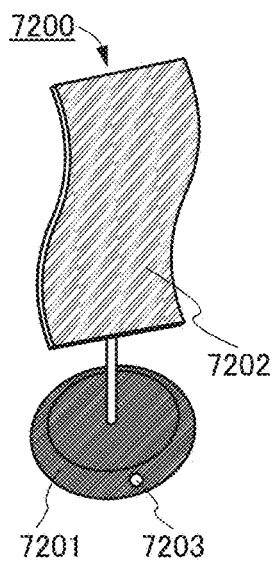
Figure 25D:
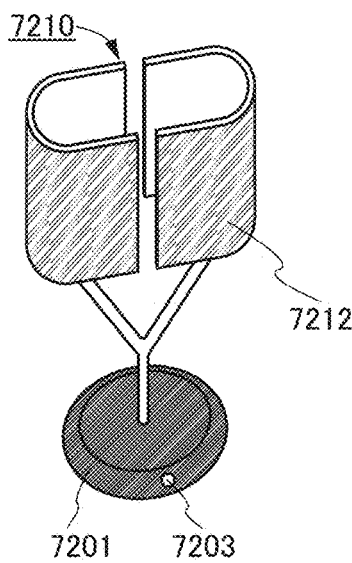
Figure 25E:
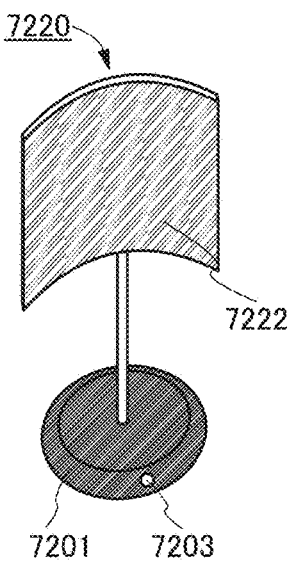

FIGS. 25C to 25E illustrate examples of a lighting device. Lighting devices 7200, 7210, and 7220 each include a stage 7201 provided with an operation switch 7203 and a light-emitting portion supported by the stage 7201.

The lighting device 7200 illustrated in FIG. 25C includes a light-emitting portion 7202 having a wave-shaped light-emitting surface, and thus has good design.

A light-emitting portion 7212 included in the lighting device 7210 illustrated in FIG. 25D has two convex-curved light-emitting portions symmetrically placed. Thus, light radiates from the lighting device 7210 in all directions.

The lighting device 7220 illustrated in FIG. 25E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 are flexible; thus, the light-emitting portion may be fixed on a plastic member, a movable frame, or the like so that an emission surface of the light-emitting portion can be bent freely depending on the intended use.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

Here, each light-emitting portion includes a light-emitting device fabricated by employing one embodiment of the present invention. One embodiment of the present invention enables a highly reliable lighting device having a curved light-emitting portion to be provided with a high yield.

Figure 25F:
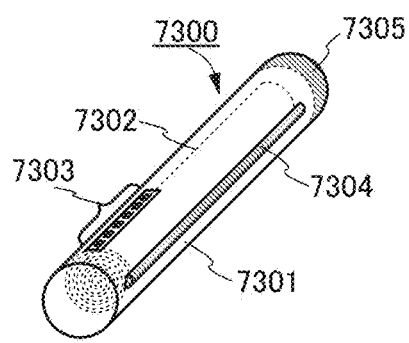

FIG. 25F illustrates an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301.

The display device 7300 can receive a video signal with the control portion 7305 and can display the received video on the display portion 7302. In addition, a battery is included in the control portion 7305. Moreover, a terminal portion for connecting a connector may be included in the control portion 7305 so that a video signal or power can be directly supplied from the outside with a wiring.

By pressing the operation buttons 7303, on/off of the power, switching of displayed videos, and the like can be performed.

Figure 25G:
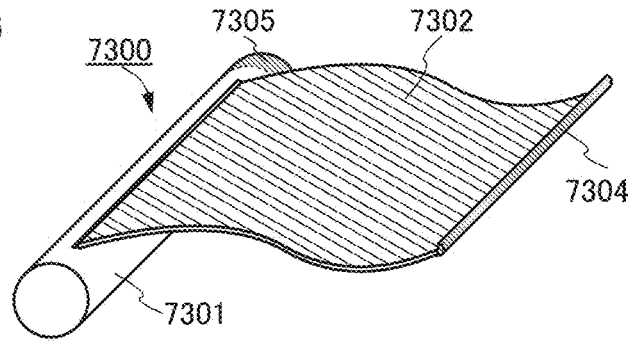

FIG. 25G illustrates a display device 7300 in a state where the display portion 7302 is pulled out with the display portion pull 7304. Videos can be displayed on the display portion 7302 in this state. Furthermore, the operation buttons 7303 on the surface of the housing 7301 allow one-handed operation. The operation buttons 7303 are provided not in the center of the housing 7301 but on one side of the housing 7301 as illustrated in FIG. 25F, which makes one-handed operation easy.

Note that a reinforcement frame may be provided for a side portion of the display portion 7302 so that the display portion 7302 has a flat display surface when pulled out.

Note that in addition to this structure, a speaker may be provided for the housing so that sound is output with an audio signal received together with a video signal.

The display portion 7302 includes a display device fabricated by employing one embodiment of the present invention. One embodiment of the present invention enables a lightweight and highly reliable display device to be provided with a high yield.

Figure 26A:
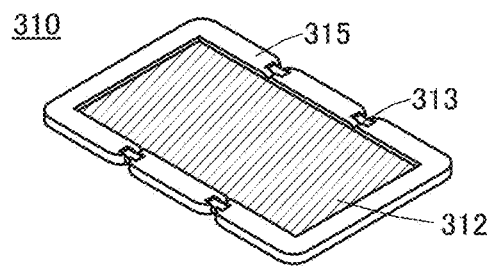
FIGS. 26A to 26I each illustrate an example of an electronic device.
Figure 26B:
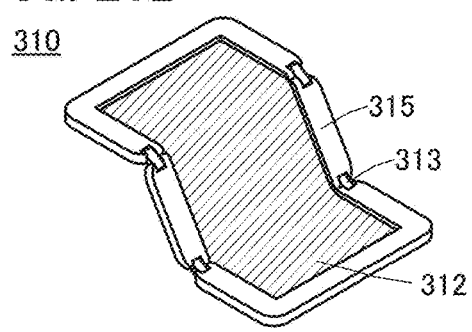
Figure 26C:
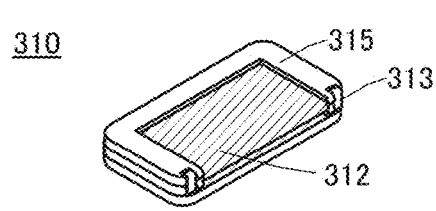

FIGS. 26A to 26C illustrate a foldable portable information terminal 310. FIG. 26A illustrates the portable information terminal 310 that is opened. FIG. 26B illustrates the portable information terminal 310 that is being opened or being folded. FIG. 26C illustrates the portable information terminal 310 that is folded. The portable information terminal 310 is highly portable when folded. The portable information terminal 310 is highly browsable when opened because of its seamless large display region.

A display panel 312 is supported by three housings 315 joined together by hinges 313. By folding the portable information terminal 310 at a connection portion between two housings 315 with the hinges 313, the portable information terminal 310 can be reversibly changed in shape from an opened state to a folded state. A display device fabricated by employing one embodiment of the present invention can be used for the display panel 312. For example, a display device that can be bent with a radius of curvature of greater than or equal to 1 mm and less than or equal to 150 mm can be used.

Figure 26D:
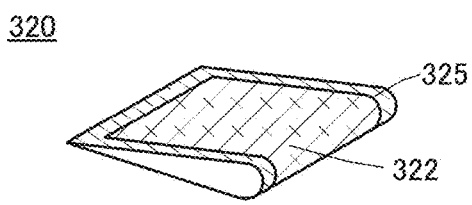
Figure 26E:
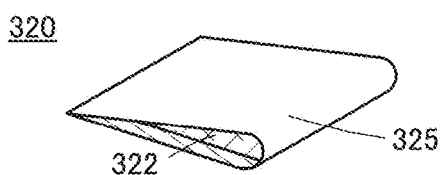

FIGS. 26D and 26E each illustrate a foldable portable information terminal 320. FIG. 26D illustrates the portable information terminal 320 that is folded so that a display portion 322 is on the outside. FIG. 26E illustrates the portable information terminal 320 that is folded so that the display portion 322 is on the inside. When the portable information terminal 320 is not used, the portable information terminal 320 is folded so that a non-display portion 325 faces the outside, whereby the display portion 322 can be prevented from being contaminated or damaged. A display device formed by employing one embodiment of the present invention can be used for the display portion 322.

Figure 26F:
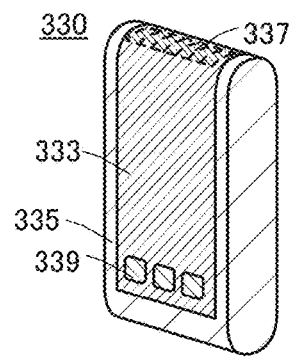
Figure 26G:
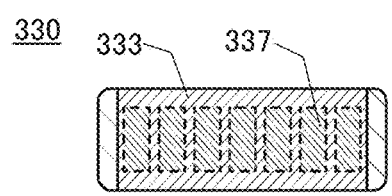
Figure 26H:
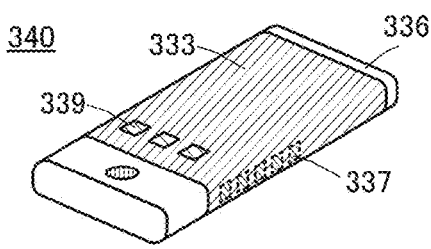

FIG. 26F is a perspective view illustrating an external shape of the portable information terminal 330. FIG. 26G is a top view of the portable information terminal 330. FIG. 26H is a perspective view illustrating an external shape of a portable information terminal 340.

The portable information terminals 330 and 340 each function as, for example, one or more of a telephone set, a notebook, and an information browsing system. Specifically, the portable information terminals 330 and 340 each can be used as a smartphone.

The portable information terminals 330 and 340 can display characters and image information on its plurality of surfaces. For example, three operation buttons 339 can be displayed on one surface (FIGS. 26F and 26H). In addition, information 337 indicated by dashed rectangles can be displayed on another surface (FIGS. 26G and 26H). Examples of the information 337 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation buttons 339, an icon, or the like may be displayed in place of the information 337. Although FIGS. 26F and 26G illustrate an example in which the information 337 is displayed at the top, one embodiment of the present invention is not limited thereto. The information may be displayed on the side, for example, as illustrated in FIG. 26H.

For example, a user of the portable information terminal 330 can see the display (here, the information 337) with the portable information terminal 330 put in a breast pocket of his/her clothes.

Specifically, a caller's phone number, name, or the like of an incoming call is displayed in a position that can be seen from above the portable information terminal 330. Thus, the user can see the display without taking out the portable information terminal 330 from the pocket and decide whether to answer the call.

A display device fabricated by employing one embodiment of the present invention can be used for a display portion 333 mounted in each of a housing 335 of the portable information terminal 330 and a housing 336 of the portable information terminal 340. One embodiment of the present invention makes it possible to provide a highly reliable display device having a curved display portion with a high yield.

Figure 26I:
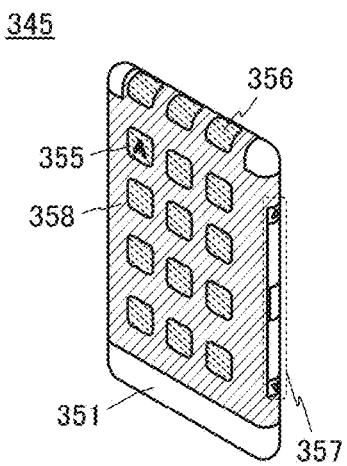

As in a portable information terminal 345 illustrated in FIG. 26I, data may be displayed on three or more surfaces. Here, data 355, data 356, and data 357 are displayed on different surfaces.

For a display portion 358 included in a housing 351 of the portable information terminal 345, a display device formed by employing one embodiment of the present invention can be used. One embodiment of the present invention makes it possible to provide a highly reliable display device having a curved display portion with a high yield.

This embodiment can be combined with any of the other embodiments as appropriate.

This application is based on Japanese Patent Application serial no. 2013-249751 filed with Japan Patent Office on Dec. 3, 2013 and Japanese Patent Application serial no. 2014-159799 filed with Japan Patent Office on Aug. 5, 2014, the entire contents of which are hereby incorporated by reference.

What is claimed is:
1. A stack manufacturing apparatus comprising:
a first supply unit configured to supply a process member comprising a first member and a second member;
a separation unit configured to separate the first member from the second member; and
a bonding unit configured to bond the first member and a support body with a bonding layer,
wherein the separation unit comprises:
a stage configured to hold the process member; and
a roller over the stage, and wherein the roller rotates so that the first member is separated from the second member and rolled up by the roller, and wherein one of the stage and the roller does not move when the other of the stage and the roller moves.

2. The stack manufacturing apparatus according to claim 1, further comprising a second supply unit configured to supply the support body.

3. The stack manufacturing apparatus according to claim 1, further comprising an unloading unit configured to unload a stack comprising the first member, the bonding layer, and the support body.

4. The stack manufacturing apparatus according to claim 1, further comprising a transfer mechanism configured to transfer the first member.

5. The stack manufacturing apparatus according to claim 1, wherein a radius of curvature of the roller is greater than or equal to 100 mm and less than or equal to 500 mm.

6. The stack manufacturing apparatus according to claim 1,
wherein the separation unit further comprises:
a guide having a groove, wherein the guide extends in a movement direction of the roller; and
a liquid feeding unit configured to feed liquid to an opening portion of the first member, and
wherein the groove supports a rotation axis of the roller.

7. The stack manufacturing apparatus according to claim 6, wherein a distance between a curved surface of the roller and one surface of the stage is controlled by a position where the groove is provided in the guide.

8. The stack manufacturing apparatus according to claim 6, wherein the liquid is pure water.

9. A stack manufacturing apparatus comprising:
a first supply unit configured to supply a process member comprising a first member and a second member;
a separation unit configured to separate the first member from the second member; and
a bonding unit configured to bond the first member and a support body with a bonding layer,
wherein the separation unit comprises:
a stage configured to hold the process member; and
a roller over the stage, and
wherein the roller rotates so that the first member is separated from the second member and rolled up by the roller,
wherein one of the stage and the roller does not move when the other of the stage and the roller moves,
wherein the first member comprises at least a peeled layer, and
wherein the second member comprises at least a separation layer.

10. The stack manufacturing apparatus according to claim 9, further comprising a second supply unit configured to supply the support body.

11. The stack manufacturing apparatus according to claim 9, further comprising an unloading unit configured to unload a stack comprising the first member, the bonding layer, and the support body.

12. The stack manufacturing apparatus according to claim 9, further comprising a transfer mechanism configured to transfer the first member.

13. The stack manufacturing apparatus according to claim 9, wherein a radius of curvature of the roller is greater than or equal to 100 mm and less than or equal to 500 mm.

14. The stack manufacturing apparatus according to claim 9,
wherein the separation unit further comprises:
a guide having a groove, wherein the guide extends in a movement direction of the roller; and
a liquid feeding unit configured to feed liquid to an opening portion of the first member, and
wherein the groove supports a rotation axis of the roller.

15. The stack manufacturing apparatus according to claim 14, wherein a distance between a curved surface of the roller and one surface of the stage is controlled by a position where the groove is provided in the guide.

16. The stack manufacturing apparatus according to claim 14, wherein the liquid is pure water.

* * * * *